United States Patent
Toda

(10) Patent No.: US 8,269,207 B2
(45) Date of Patent: Sep. 18, 2012

(54) MEMORY DEVICE HAVING VARIABLE RESISTANCE MEMORY CELLS DISPOSED AT CROSSPOINT OF WIRINGS

(75) Inventor: Haruki Toda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/099,735

(22) Filed: May 3, 2011

(65) Prior Publication Data

US 2011/0205790 A1    Aug. 25, 2011

Related U.S. Application Data

(63) Continuation of application No. 10/507,475, filed as application No. PCT/JP03/00155 on Jan. 10, 2003, now Pat. No. 7,989,789.

(30) Foreign Application Priority Data

Apr. 4, 2002  (JP) ................................. 2002-102640

(51) Int. Cl.
    *H01L 29/02*    (2006.01)
(52) U.S. Cl. .. 257/2; 257/3; 257/4; 257/5; 257/E29.002; 438/102; 438/103; 365/163
(58) Field of Classification Search ............... 257/1–5, 257/E29.002; 438/102–103; 365/163
    See application file for complete search history.

(56) References Cited

U.S. PATENT DOCUMENTS

| 4,795,657 A | 1/1989 | Formigoni et al. |
| 5,657,292 A * | 8/1997 | McClure ................. 365/233.16 |
| 6,141,241 A * | 10/2000 | Ovshinsky et al. ........... 365/163 |
| 6,339,544 B1 | 1/2002 | Chiang et al. |
| 6,376,284 B1 | 4/2002 | Gonzalez et al. |

FOREIGN PATENT DOCUMENTS

| EP | 0 065 916 | 12/1982 |
| EP | 0 495 494 | 7/1992 |
| JP | 60-260148 | 12/1985 |
| JP | 4-45583 | 2/1992 |
| JP | 5-21740 | 1/1993 |
| JP | 6-509909 | 11/1994 |
| JP | 11-510317 | 9/1999 |
| JP | 2002-93147 | 3/2002 |
| WO | WO 93/04506 A1 | 3/1993 |
| WO | WO 97/05665 A1 | 2/1997 |
| WO | WO 00/08650 | 2/2000 |
| WO | WO 00/30118 | 5/2000 |

OTHER PUBLICATIONS

Office Action issued Sep. 7, 2010, in Japan Patent Application No. 2003-582773.

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

A phase-change memory device has a plurality of first wiring lines WL extending in parallel to each other, a plurality of second wiring lines BL which are disposed to cross the first wiring lines WL while being separated or isolated therefrom, and memory cells MC which are disposed at respective cross points of the first wiring lines WL and the second wiring lines BL and each of which has one end connected to a first wiring line WL and the other end connected to a second wiring line BL. The memory cell MC has a variable resistive element VR which stores as information a resistance value determined due to phase change between crystalline and amorphous states thereof, and a Schottky diode SD which is connected in series to the variable resistive element VR.

20 Claims, 48 Drawing Sheets

FIG. 32

|  | 0 | 1 |
|---|---|---|
| OUT0 | L | H |
| OUT1 | L | H |

FIG. 33

|  | 00 | 01 | 10 | 11 |
|---|---|---|---|---|
| OUT2 | — | L | — | H |
| OUT1 | L | H | H | H |
| OUT0 | — | — | L | H |

|  | 000 | 001 | 010 | 011 | 100 | 101 | 110 | 111 |
|---|---|---|---|---|---|---|---|---|
| OUT3 | — | — | L | L | — | H | H | H |
| OUT2 | L | L | — | H | H | H | — | H |
| OUT1 | L | H | H | — | L | H | H | H |
| OUT0 | — | — | L | H | — | H | L | H |

FIG. 38

|       | 000 | 001 | 010 | 011 | 100 | 101 | 110 | 111 |
|-------|-----|-----|-----|-----|-----|-----|-----|-----|
| OUT3  | L   | L   | L   | L   | H   | H   | H   | H   |
| OUT10 | L   | H   | H   | —   | L   | H   | H   | —   |
| OUT11 | —   | —   | —   | H   | —   | —   | —   | H   |
| OUT0  | —   | H   | L   | —   | —   | H   | L   | —   |

FIG. 39

|       | 00 | 01 | 10 | 11 |
|-------|----|----|----|----|
| OUT10 | L  | H  | H  | H  |
| OUT11 | —  | L  | L  | H  |
| OUT0  | —  | L  | H  | —  |

FIG. 41

| | 0000 | 0001 | 0010 | 0011 | 0100 | 0101 | 0110 | 0111 |
|---|---|---|---|---|---|---|---|---|
| OUT4 | – | – | – | – | L | L | L | L |
| OUT3 | L | L | L | L | – | H | H | H |
| OUT2 | – | L | H | H | H | H | – | H |
| OUT1 | L | H | – | H | L | H | H | H |
| OUT0 | – | – | L | H | – | H | L | H |

| | 1000 | 1001 | 1010 | 1011 | 1100 | 1101 | 1110 | 1111 |
|---|---|---|---|---|---|---|---|---|
| OUT4 | – | – | H | H | H | H | H | H |
| OUT3 | H | H | H | H | – | H | H | H |
| OUT2 | L | L | H | H | H | H | H | H |
| OUT1 | L | H | H | H | L | H | H | H |
| OUT0 | – | – | L | H | – | H | L | H |

FIG. 43

| | 0000 | 0001 | 0010 | 0011 | 0100 | 0101 | 0110 | 0111 |
|---|---|---|---|---|---|---|---|---|
| OUT4 | — | — | — | — | L | L | L | L |
| OUT30 | L | L | L | L | H | H | H | H |
| OUT31 | — | — | — | — | — | — | — | — |
| OUT10 | L | H | H | — | L | H | H | — |
| OUT11 | — | L | — | H | — | L | — | H |
| OUT0 | — | H | L | — | — | H | L | — |

| | 1000 | 1001 | 1010 | 1011 | 1100 | 1101 | 1110 | 1111 |
|---|---|---|---|---|---|---|---|---|
| OUT4 | H | H | H | H | — | — | — | — |
| OUT30 | H | H | H | H | — | — | — | — |
| OUT31 | L | L | L | L | H | H | H | H |
| OUT10 | L | H | H | — | L | H | H | — |
| OUT11 | — | L | — | H | — | L | — | H |
| OUT0 | — | H | L | — | — | H | L | — |

NOT-BOOST

PP-BOOST

NP-BOOST

MEMORY DEVICE HAVING VARIABLE RESISTANCE MEMORY CELLS DISPOSED AT CROSSPOINT OF WIRINGS

CROSS-REFERENCE TO RELATED APPLICATIONS

The present application is a continuation of U.S. application Ser. No. 10/507,475, filed on Apr. 24, 2006, which is a §371 of PCT/JP03/00155 filed on Jan. 10, 2003, and claims priority to JP 2002-102640 filed on Apr. 4, 2002, the entire contents of each of which are hereby incorporated herein by reference.

TECHNICAL FIELD

This invention relates to an electrically rewritable phase-change memory device (ovonic memory device) which stores a resistance value determined due to a phase change between crystalline and amorphous states of a memory material as information in a non-volatile manner.

BACKGROUND ART

Prior known electrically rewritable semiconductor memory devices are generally categorized into volatile memories and nonvolatile memories. Whereas volatile memories include DRAMs and SRAMs, nonvolatile memories include EEPROM flash memories such as those of the NAND or NOR type or the like. The DRAMs and SRAMs are featured by high-speed random accessibility; the flash memories feature large capacity and long-term data retainability. The ones with nonvolatility which are capable of offering high-speed random accessibility also include ferro-electric RAMS using ferroelectric films. In these prior art semiconductor memories, they must have, without fail, transistors for use as the constituent parts or components thereof.

In a cell array configuration which is deemed ideal for use with RAMS, the use of rows and columns of select signal lines is inevitable as far as the cell array is organized into the form of a row/column matrix. If no wiring lines other than these row/column select lines are formed, then the cell array becomes simpler in configuration; however, in the prior art semiconductor memories, the cell array has been configured with increased complexities as a result of addition of power supply lines and data lines other than the above-noted signal lines. Additionally, memory cells are such that when miniaturization further progresses, it is difficult to maintain the characteristics thereof.

From these viewpoints, cells which utilize the nature of composition matter per se as a data state are expected to become more important in advanced memory technologies of the next generation in near future. As a promising one adaptable for use in such technologies, there has been proposed a phase-change or ovonic memory which utilizes a phase transition between crystalline and amorphous states of a chalcogenide-based glass material. The memory of this type utilizes the fact that a resistance ratio of the amorphous state to the crystalline state of the chalcogenide is as large as 100:1 or more to store therein such different resistance value states as information.

The chalcogenide glass has already been used in rewritable optical disks or else. Here, a difference of the refractivity of chalcogenide due to a phase change is used. This phase change is reversible, and any change can be controlled by adequately designing the way of heating, wherein the heating technique is controllable by the amount of a current flowing in this material. A trial for memory cells utilizing the feature of this material has been reported (for example, see Jpn. J. Appl. Phys. Vol. 39 (2000) PP. 6157-6161 Part 1, NO. 11, November 2000 "Submicron Nonvolatile Memory Cell Based on Reversible Phase Transition in Chalcogenide Glasses" Kazuya Nakayama et al).

DISCLOSURE OF INVENTION

An object of this invention is to provide a rewritable phase-change memory device which has a preferred cell array configuration and stores resistance value information due to a phase-change in a nonvolatile manner.

A phase-change memory device in accordance with one embodying mode of this invention has a substrate, a plurality of first parallel wiring lines formed above the substrate, a plurality of second parallel wiring lines formed above the substrate to cross the first wiring lines while being electrically insulated therefrom, and a plurality of memory cells disposed at respective crossing points of the first wiring lines and said second wiring lines, each the memory cell having one end connected to the first wiring line and the other end connected to the second wiring line, wherein the memory cell includes a variable resistive element for storing as information a resistance value determined due to phase-change between crystalline and amorphous states thereof, and a Schottky diode connected in series to the variable resistive element.

A phase-change memory device in accordance with another embodying mode of this invention has a semiconductor substrate, a plurality of semiconductor layers formed in the semiconductor substrate so that these are arrayed in a matrix form while being partitioned by an element isolation dielectric film, diodes each formed at its corresponding semiconductor layer with a metal electrode as a terminal electrode, the metal electrode being formed at part of a surface of each the semiconductor layer, a plurality of first wiring lines provided to commonly connect the diodes as arrayed in one direction of the matrix, an interlayer dielectric film covering the first wiring lines, metal plugs buried in space portions of the first wiring lines of the interlayer dielectric film and being in ohmic contact with each the semiconductor layer, a chalcogenide layer being formed above the interlayer dielectric film and having its bottom surface in contact with the metal plugs, and a plurality of second wiring lines provided to cross the first wiring lines while being in contact with an upper surface of the chalcogenide layer.

A phase-change memory device in accordance with another embodying mode of this invention has an insulative substrate, a plurality of first wiring lines formed in parallel with each other above the insulative substrate, memory cells being formed over each the first wiring line so that one end is connected to each the first wiring line, each the memory cell having a stacked structure of a variable resistive element and a diode, the variable resistive element storing as information a resistance value determined due to phase-change between crystalline and amorphous states thereof, and a plurality of second wiring lines formed over the memory cells to commonly connect together the other end portions of the memory cells arrayed in a direction crossing the first wiring lines.

A phase-change memory device in accordance with another embodying mode of this invention has an insulative substrate and a plurality of memory cell arrays stacked over the insulative substrate, wherein each the memory cell array includes a plurality of first wiring lines extending in parallel with each other, a plurality of memory cells being formed above each the first wiring line in such a manner that one end is connected to each the first wiring line and each comprising a stacked structure of a variable resistive element and a diode, the variable resistive element storing as information a resistance value determined due to phase-change between crystalline and amorphous states thereof, and a plurality of second wiring lines formed above the memory cells to commonly connect the other ends of the memory cells arrayed in a direction crossing the first wiring lines.

BRIEF DESCRIPTION OF DRAWINGS

FIG. 32 is a truth value table for explanation of an operation of the sense amplifier circuit of FIG. 30.

FIG. 33 is a truth value table for explanation of an operation of the sense amp circuit of FIG. 31.

FIG. 38 is a truth value table for explanation of an operation of the sense amp circuit of FIG. 37.

FIG. 39 is a truth value table for explanation of an operation in the case of applying part of the sense amp circuit of FIG. 37 to four-value storage.

FIG. 41 is a truth value table for explanation of an operation in the case of applying the sense amp circuit scheme of FIG. 35 to sixteen-value storage using four-layered stacked cell arrays.

FIG. 43 is a truth value table for explanation of a 16-value storage operation using the sense amp circuit of FIG. 42.

EMBODIMENTS

An explanation will be given of embodiments of this invention below.

Figure 1:
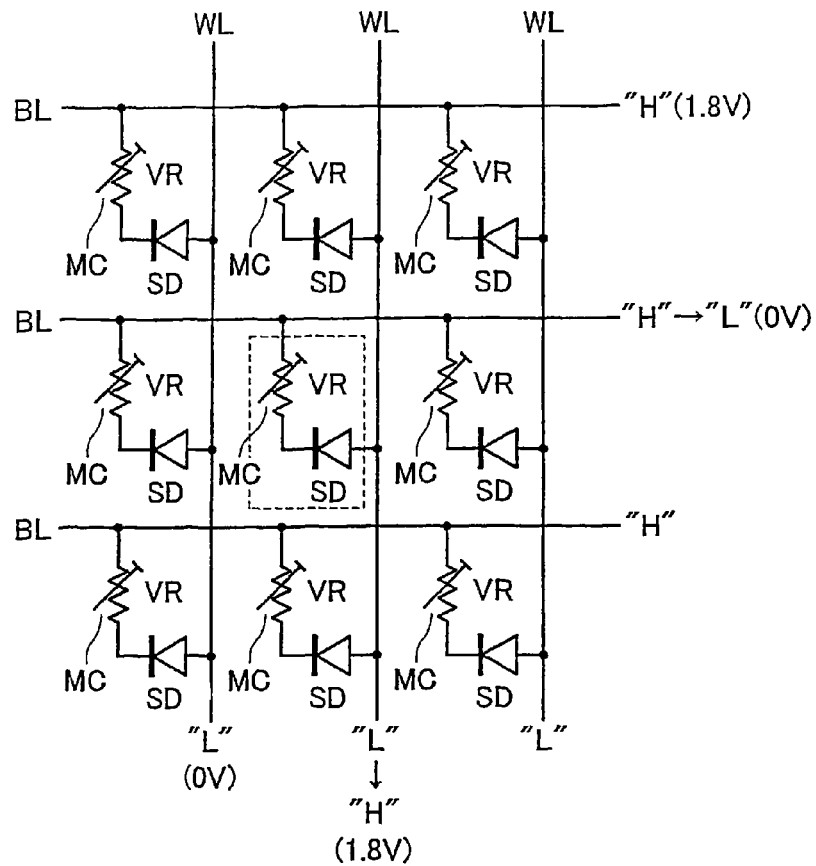
FIG. 1 is a diagram showing an equivalent circuit of a cell array in accordance with an embodiment of this invention.

FIG. 1 shows a cell array of a phase-change memory in accordance with an embodiment, with respect to a 3×3 cell matrix. A plurality of first wiring lines (referred to as word lines hereinafter) WL are provided in parallel, and a plurality of second wiring lines (referred to hereinafter as bit lines) BL are provided to cross over the first lines. Memory cells MC are laid out at the respective crossing points of these lines. The memory cell MC is a series-connection circuit of a variable resistive element VR and a diode SD. The variable resistive element VR is formed of chalcogenide and is operable to store therein a resistance value determined due to a phase transition between its crystalline and amorphous states as information in a nonvolatile manner.

Although the diode SD is a Schottky diode in the case of this embodiment, a pn-junction diode is alternatively usable. One end of the memory cell MC is connected to a bit line BL, and the other end is connected to a word line WL. Although in the drawing the diode SD is such that the word line WL side is an anode, it is also possible to reverse the polarity of diode SD because what is required here is to obtain the cell selectivity based on a voltage potential relationship of the word line WL versus the bit line BL. Further, it is also possible to change the position of the diode SD and the variable resistive element VR.

As previously stated, data is to be stored as the significance of a resistance value of the resistive element VR of each memory cell MC. For instance, in a non-select state, let all the word lines WL be set at "L" level while setting all the bit lines BL at "H" level. One example is that "H" level is equal to 1.8V and "L" is 0V. In this nonselect state, the diodes SD of all memory cells MC are in a reverse-bias state and thus are in an off-state; thus, no currents flow in the resistive elements VR. Considering the case of selecting a centrally located memory cell MC of the cell array of FIG. 1, which is surrounded by broken lines, let a selected word line WL at "H" while setting a selected bit line BL at "L". Whereby, at the selected cell, its diode SD becomes forward-biased allowing a current to flow therein.

The amount of a current flowing in the selected cell at this time is determined by the phase of the chalcogenide constituting the resistive element VR; thus, it is possible to read two-value or binary data by detecting whether the current amount is large or small. Also note that it is possible to permit creation of a phase transition in the chalcogenide of the resistive element VR by making higher the "H" level potential of the selected word line to thereby likewise increase the current amount and then utilizing the heat-up of a cell portion due to this current, by way of example. Thus, it is possible to select a specific cell in the cell array and then rewrite information of such cell.

In this way, in the cell array of this embodiment, access is performed only by potential level setup of a single word line WL and a single bit line BL. Although in the case of a transistor provided for cell selection a signal line for selecting the gate of the transistor is required within the cell array, no such signal line is necessary in this embodiment. In addition, in view of the fact that diodes are inherently simpler in structure than transistors, the cell array becomes more simplified in configuration owing to a decrease in requisite number of signal lines in combination with the simple diode structure advantage, thus enabling achievement of higher integration of the cells.

Regarding the diode SD used for cell selection, the use of a Schottky diode in particular results in that many effects are obtained. First, unlike pn-junction diodes, the Schottky diode is a majority carrier device so that accumulation of minority carriers hardly occurs in any way, thereby enabling high-speed accessing. Second, both the cell array configuration and the manufacturing or fabrication process thereof become simplified because there is no need to form any pn junctions. Third, whereas pn junctions are faced with problems as to unwanted changes in characteristics due to temperatures, Schottky junctions are stable against temperatures.

Although in the above operation explanation one specific case for controlling the potential levels of word lines WL and bit lines BL to thereby perform resistance value detection (data read) of the chalcogenide making up the resistive element VR and also the phase-change control (data rewrite) was indicated, read and rewrite may also be performed by controlling the levels of currents flowing in the word lines WL and bit lines BL. These voltage control scheme and current control scheme are different from each other in energy being given to the chalcogenide during reading of the resistance value. This can be said because the chalcogenide is high in resistance value in its amorphous state and low in resistance in the crystalline state thereof. More specifically, when letting the resistance of chalcogenide be represented by R, the power to be generated in the chalcogenide becomes equal to $v^2/R$ if the voltage potential control is employed, and is given as $iR^2$ if the current control is used. Due to this, the both schemes are different in influence upon a phase change of a temperature change of the chalcogenide being presently subjected to resistance detection. Accordingly, either one scheme may be chosen by taking account of the cell structure and/or the stability as given to the chalcogenide's phase state.

Figure 2:
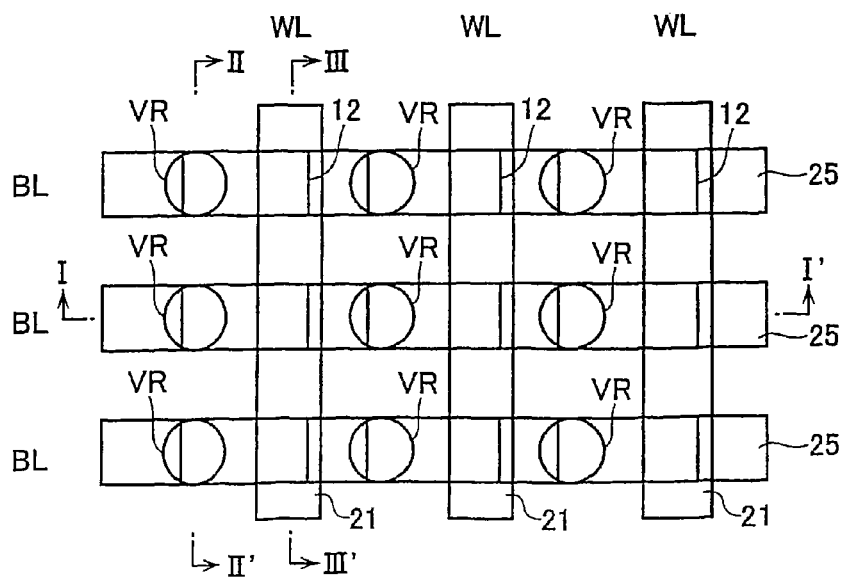
FIG. 2 is a plan view diagram of same cell array.
Figure 3A:
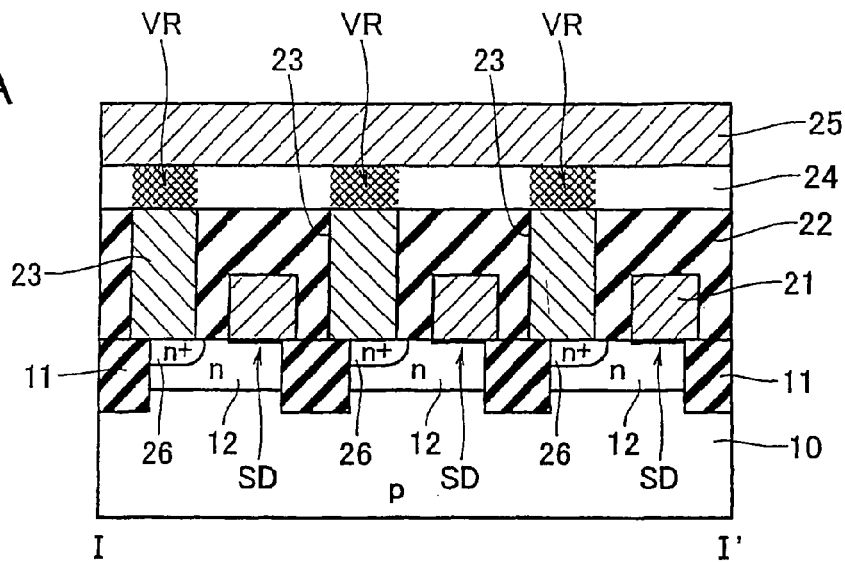
FIG. 3A is a cross-sectional diagram as taken along line I-I' of FIG. 2.
Figure 3B:
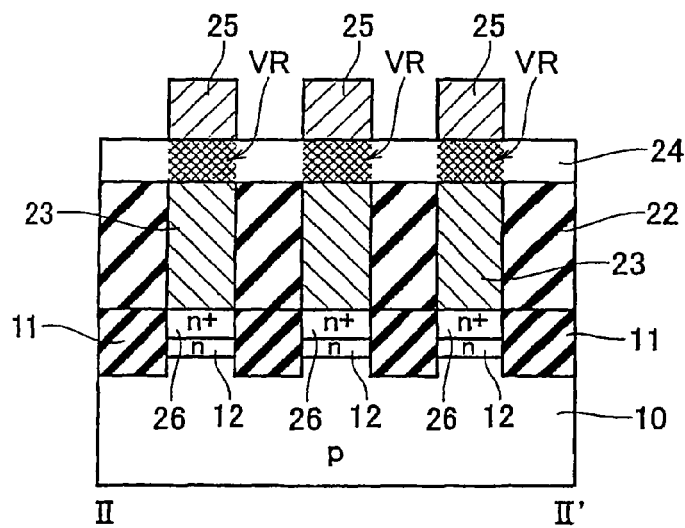
FIG. 3B is a sectional diagram taken along line II-II' of FIG. 2.
Figure 3C:
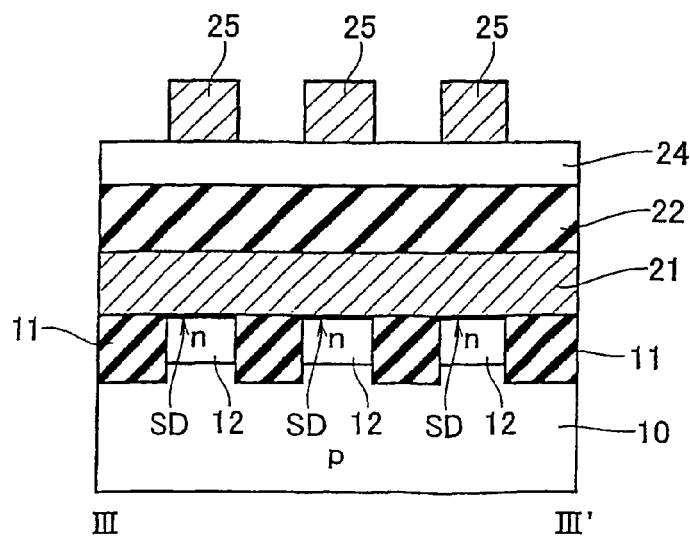
FIG. 3C is a sectional diagram along line of FIG. 2.

An explanation will next be given of several examples each of which actually arranges the cell array of FIG. 1 as a semiconductor integrated circuit. FIG. 2 illustrates a plan view of a cell array of one example of them; FIGS. 3A, 3B and 3C show its cross-sections as taken along lines I-I', II-II' and of FIG. 2, respectively.

In the case of this embodiment, a substrate 10 is a p-type silicon substrate having its surface portion in which an n-type silicon layer 12 is formed, which is partitioned by an element isolation dielectric film 11 in units of respective memory cell areas. With respect to a plurality of n-type silicon layers 12 which are aligned in one direction, word lines (WL) 21 that are formed of a metal film are continuously formed so that these are offset to one side of the surface thereof. Each Schottky diode SD is formed with the word line 21 as an anode electrode (Schottky electrode), and with the n-type silicon layer 12 as a cathode layer. Note however that the metal film making up the word lines WL and Schottky junctions may be separate ones; for example, it is also possible to form patterned metal films for constructing the Schottky junctions only in the respective cell areas and then perform word-line formation in such a manner as to commonly connect them together.

The plane on which the word lines 21 are formed is planarly covered with an interlayer dielectric film 22. And, at space portions between the word lines 21 of this interlayer dielectric film 22, contact holes are defined which reach the n-type silicon layers 12: at these portions, metal plugs 23 for use as the cathode electrodes of diodes SD are buried. From the contact holes with the metal plugs 23 buried therein, an impurity is pre-diffused into the n-type silicon layers 12 whereby n'-type layers 26 are formed, which are for obtaining good ohmic contact.

Further on the interlayer dielectric film 22 with metal plugs 23 planarly buried therein, a chalcogenide layer 24 is formed; on this layer, bit lines (BL) 25 formed of a metal film are formed. Portions (meshed regions in FIGS. 3A and 3B) at which the buried metal plugs 23 of the chalcogenide layer 24 oppose the bit lines 25 become phase-change regions (i.e. variable resistive elements) VR which actually function as the cell regions.

Figure 4:
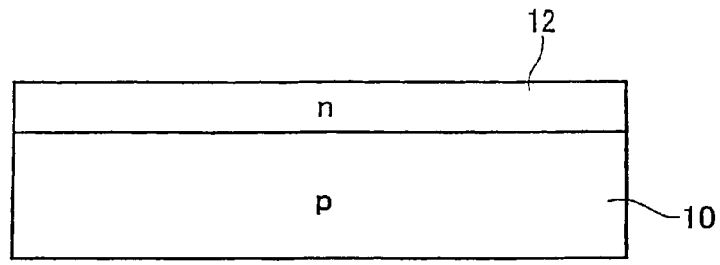
FIG. 4 is a sectional diagram of a substrate for explanation of a manufacturing process of the cell array.
Figure 5:
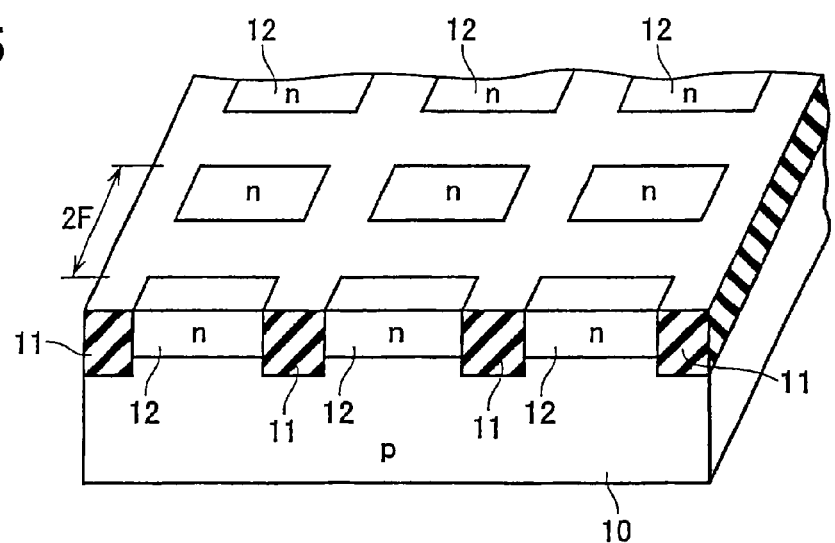
FIG. 5 is a diagram showing an element isolation process step of the same.

A fabrication process of such the cell array will be explained with reference to FIGS. 4 to 9, while giving attention to the cross-section (I-I' cross-section) of FIG. 3A. FIG. 4 shows a wafer with an n-type layer 12 formed at a surface portion of the p-type silicon substrate 10. With respect to this wafer, the element isolation dielectric film 11 is formed and buried as shown in FIG. 5, thus obtaining the state that island-like n-type silicon layers 12 are laid out in a matrix form. Practically, for example, form in an element isolation area an element isolation trench which reaches the p-type silicon substrate 10; then, form the element isolation dielectric film 11 by a method of burying a silicon oxide film in this element isolation trench.

Figure 6:
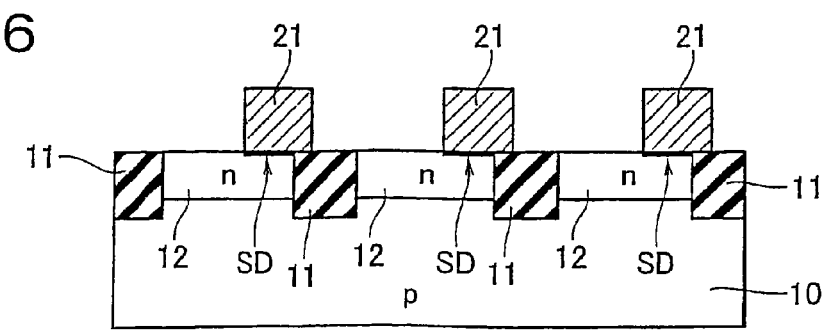
FIG. 6 is a sectional diagram showing a formation process of diodes and word lines of the same.

Thereafter, as shown in FIG. 6, deposit a metal film such as aluminum or else; then, perform patterning to thereby form the word lines 21. The word lines 21 are formed into a pattern so that each is offset in position to one side of its associative n-type silicon layer 12, resulting in the Schottky diode SD being formed between it and the word line 12.

Figure 7:
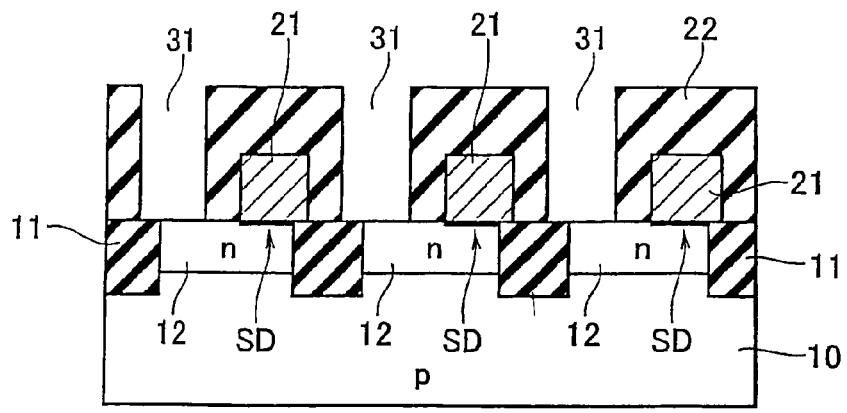
FIG. 7 is a sectional diagram showing a process for formation of an interlayer dielectric film and for contact formation of the same.
Figure 8:
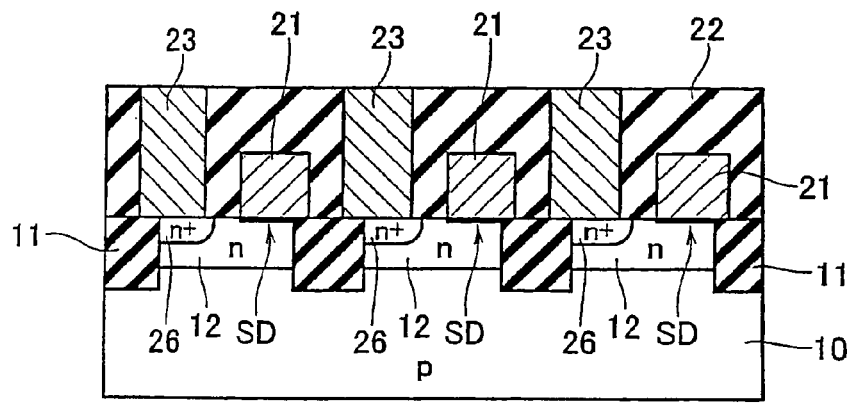
FIG. 8 is a sectional diagram showing a metal plug burying process of the same.

Next, as shown in FIG. 7, form a flat or planar interlayer dielectric film 22 to cover the word lines 21; then, form in this interlayer dielectric film 22 contact holes 31 for exposing the cathode-side terminate end portion of each n-type silicon layer 12. And, as shown in FIG. 8, after having formed n'-type layers 26 by performing ion implantation through the contact holes 31, bury metal plugs 23 for use as cathode electrodes in the contact holes 31.

Figure 9:
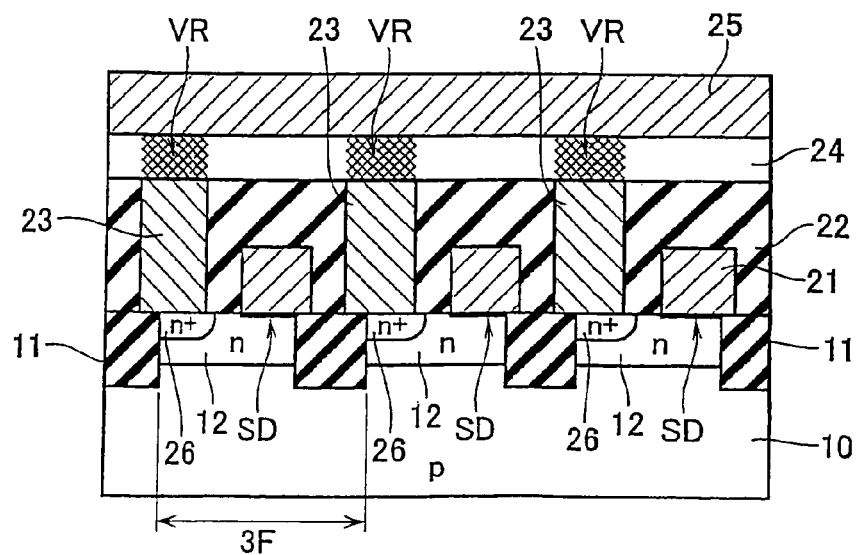
FIG. 9 is a sectional diagram showing a process for forming a chalcogenide layer and bit lines of the same.

Next, as shown in FIG. 9, form the chalcogenide layer 24 on the interlayer dielectric film 22 in which the metal plugs 23 are buried; further, form thereon bit lines 25 by a metal film. As previously stated, the portions in the chalcogenide layer 24 whereat the bit lines 25 oppose the metal plugs 23 become the resistive elements VR for use as the real cell regions.

In the case of this embodiment, it is possible to form the word lines 21 and the metal plugs 23 with a pitch of 3F, where F is the minimum device-feature size, in the longitudinal direction of the bit lines 25 while forming the bit lines 25 and metal plugs 23 with a pitch of 2F in the longitudinal direction of the word lines 21. Thus, a unit cell area becomes equal to $6F^2$.

Figure 10:
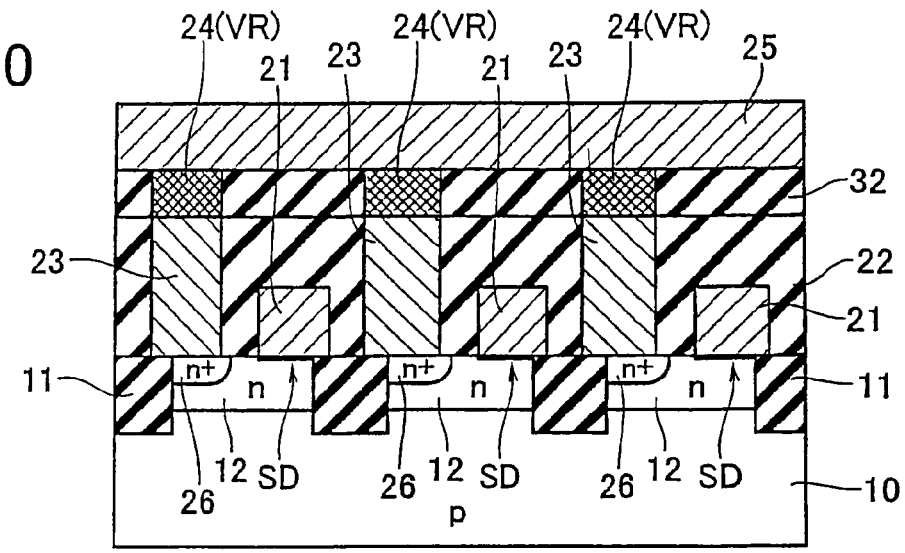
FIG. 10 is a sectional diagram showing another cell array structure in a way corresponding to FIG. 3A.

Although in the above example the chalcogenide layer 24 is formed on an entire upper surface of the interlayer dielectric film 22, patterning may be done while letting this be left in the cell regions only. A cross-sectional structure of a cell array in such case is shown in FIG. 10 in a way corresponding to FIG. 3A. The chalcogenide layer 24 shown herein is removed while leaving the portions which become the variable resistive elements VR that are phase-change layers required for the cells, with an interlayer dielectric film 32 buried around the periphery of such portions. With such an arrangement, the resulting resistive elements VR become in the state with the lack of any spreading resistance whereby a resistance ratio of the crystalline state and the amorphous state and a thermal conductivity ratio become greater.

Figure 11:
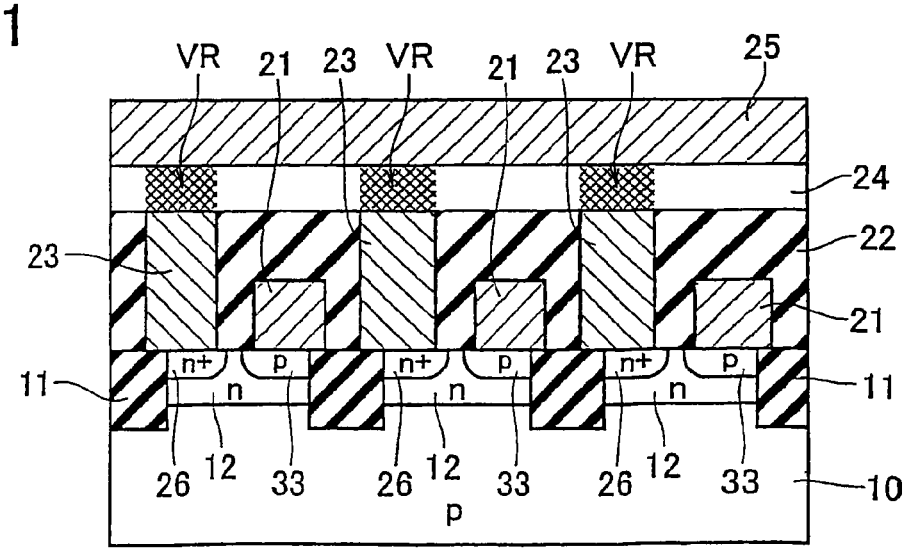
FIG. 11 is a sectional diagram showing still another cell array structure in a way corresponding to FIG. 3A.

An exemplary cell array cross-section structure using pn-junction diodes in place of the Schottky diodes is shown in FIG. 11 in a way corresponding to FIG. 3A. Form a p-type layer 33 in the n-type silicon layer 12 of the region in which a word line 21 is formed; then, let the word line 21 be come into contact with this p-type layer 33. Whereby, the cell array using the pn-junction diodes is obtained.

Figure 12:
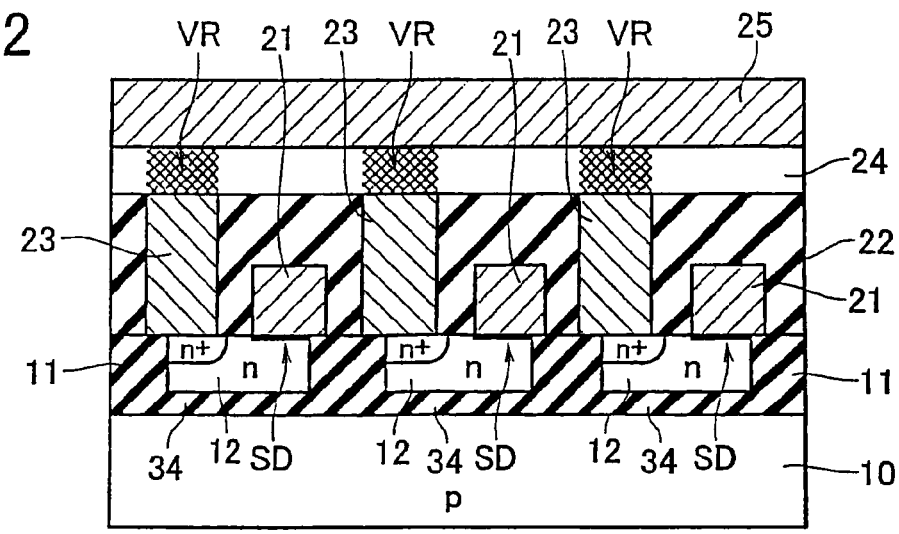
FIG. 12 is a sectional diagram showing yet another cell array structure in a way corresponding to FIG. 3A.

The examples stated up to here are such that the n-type silicon layer 12 of each element region is isolated by a pn junction from the others. In contrast to this approach, it is also possible to set each n-type silicon layer 12 in an insulatively separated "floating" state. FIG. 12 shows a cell array cross-section structure of such example in a way corresponding to FIG. 3A. The n-type silicon layer 12 is buried with a silicon oxide film 34 at its bottom portion and thus is isolated from the p-type silicon substrate 10. Practically, this type of structure is obtained by use of the so-called SOI wafer having a silicon layer which overlies a silicon substrate and which is isolated therefrom by a silicon oxide film. With the use of this structure, excellent characteristics are obtainable which are free from any leakage between respective cells.

Figure 13:
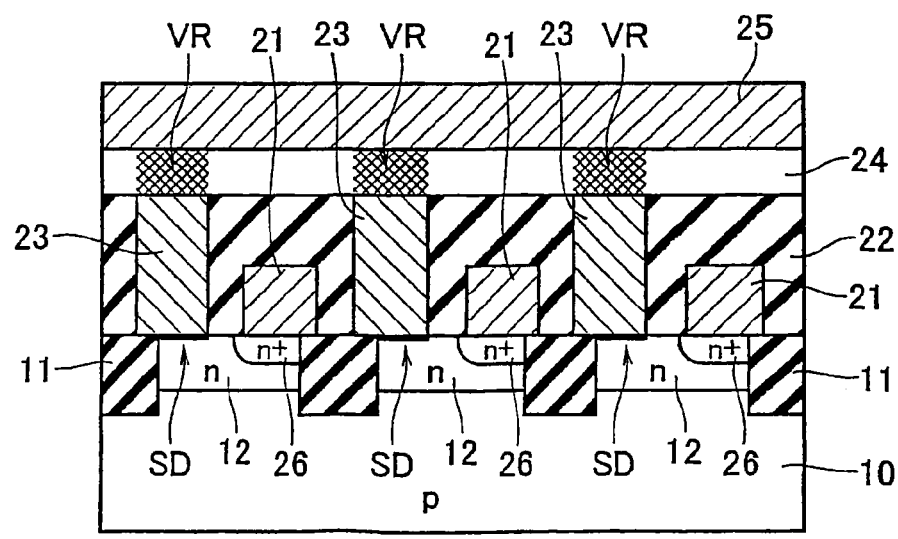
FIG. 13 is a sectional diagram showing a further another cell array structure in a way corresponding to FIG. 3A.

The diode SD may alternatively be reversed in polarity as has been described previously: FIG. 13 shows a cell array cross-section structure of such an example in a way corresponding to FIG. 3A. In this example, a diode SD that makes up the Schottky junction between a metal plug 23 and an n-type silicon layer 12 is formed. A word line 21 and the n-type silicon layer 12 are such that an $n^+$-type layer 26 is formed at this portion to let them be in ohmic contact. The same goes with the case of a pn-junction diode.

Note here that although in the embodiments to be discussed later an explanation will be given exclusively relative to the case of employing Schottky diodes with the word-line side as the anode, various modifications such as those which have been explained in FIGS. 10 to 13 are possible in the later-described embodiments also.

Figure 14:
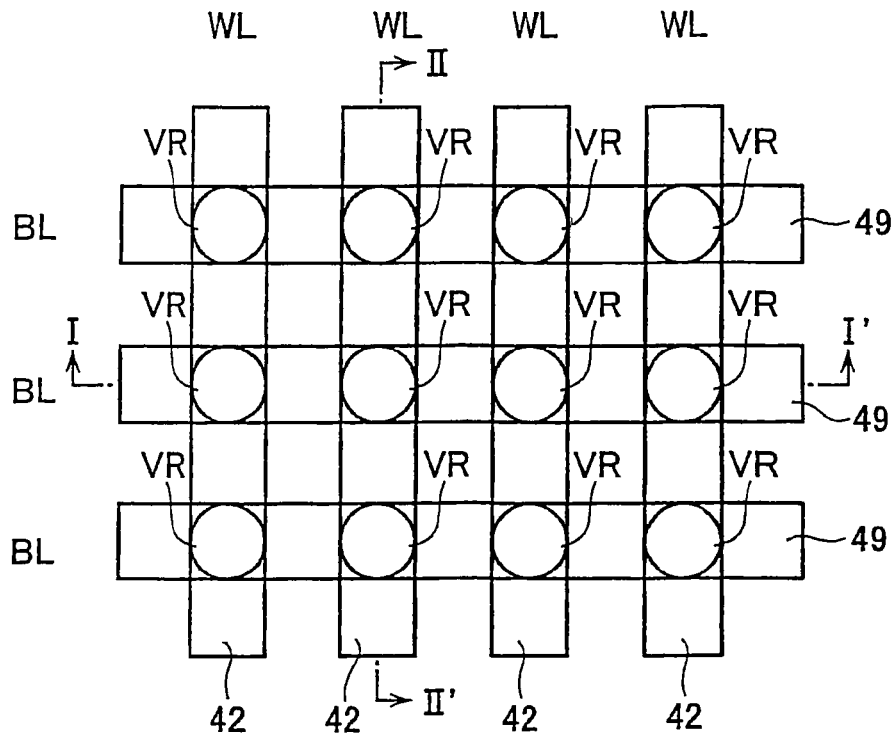
FIG. 14 is a plan view of another cell array.
Figure 15A:
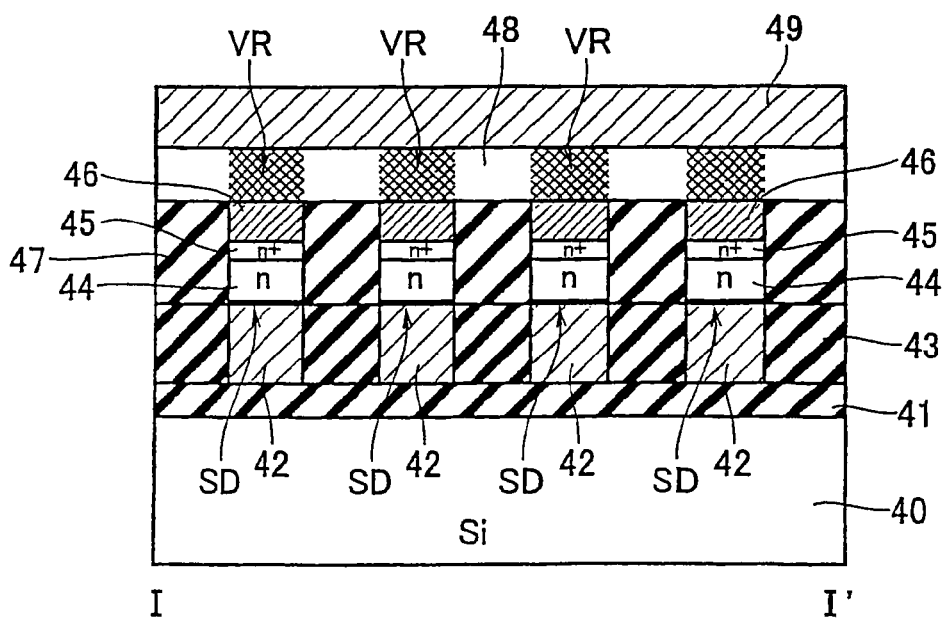
FIG. 15A is a sectional diagram along line I-I' of FIG. 14.
Figure 15B:
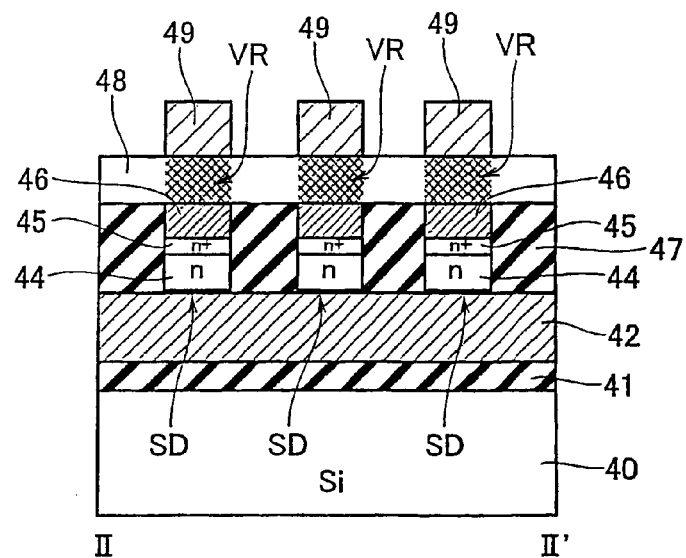
FIG. 15B is a sectional diagram along line II-II' of FIG. 14.

FIG. 14 depicts a plan view of another cell array configuration which realizes the cell array of FIG. 1; FIGS. 15A and 15B are its cross-sectional views as taken along lines I-I' and respectively. In this embodiment, an electrically insulative or dielectric substrate is used to arrange thereon the intended cell array. In the example of this figure of drawing, a silicon substrate 40 having its surface covered with a silicon oxide film 41 is used as the dielectric substrate. Above this substrate, word lines (WL) 42 formed of a metal film are formed, wherein portions interposed between the word lines 42 are made flat or planarized after an interlayer dielectric film 43 is buried therein.

On the word lines 42, n-type polycrystalline silicon layers 44 which are isolated in units of respective cell regions are formed so that diodes SD are made each of which forms a Schottky junction between a word line 42 and layer 44. An n$^+$-type layer 45 is formed at a surface of each n-type silicon layer 44, and an ohmic electrode (cathode electrode) 46 is formed and connected thereto. An interlayer dielectric film 47 is buried and planarized around the periphery of Schottky diodes. A chalcogenide layer 48 is formed to overlie it; further, on this layer, bit lines (BL) 49 of a patterned metal film are formed.

In the case of this embodiment also, the regions in the chalcogenide layer 48 with the bit line 49 opposing the ohmic electrodes 46 become variable resistive elements VR which are the real cell regions (phase change areas), thus constituting the cell array of FIG. 1.

Figure 16:
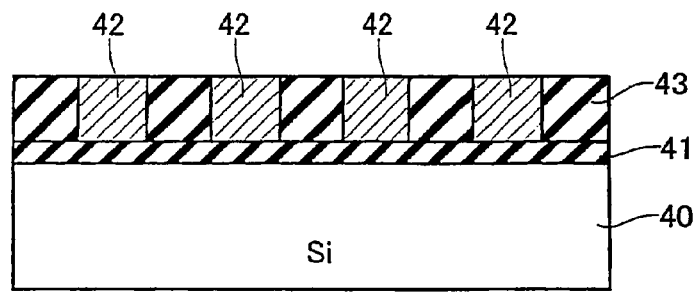
FIG. 16 is a sectional diagram showing a word-line formation step in the fabrication process of the cell array.

FIGS. 16-19 show some major steps of a manufacturing process while giving attention to the cross-section of FIG. 15A. As shown in FIG. 16, form word lines 42 on the substrate through deposition and patterning of a metal film. Thereafter, bury an interlayer dielectric film 43 at every portion between adjacent ones of the word lines 42. This process may be reversed in order. More specifically, a damascene method may be used, which includes the steps of first depositing the interlayer dielectric film 43, forming therein wiring line grooves, and burying the word lines 42 in these wiring grooves.

Figure 17:
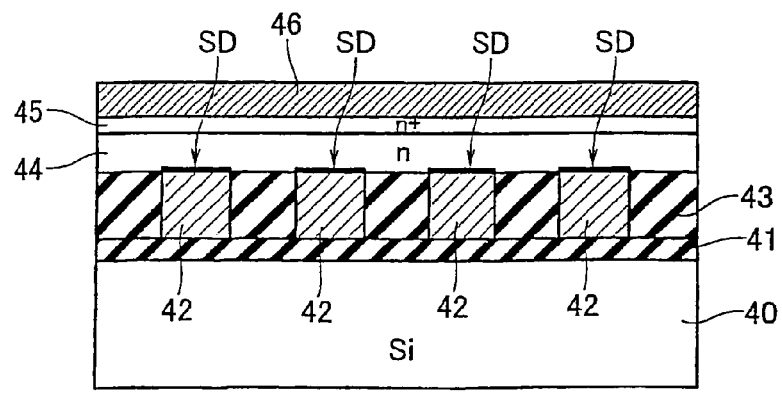
FIG. 17 is a sectional diagram showing a diode formation process step of the same.
Figure 18:
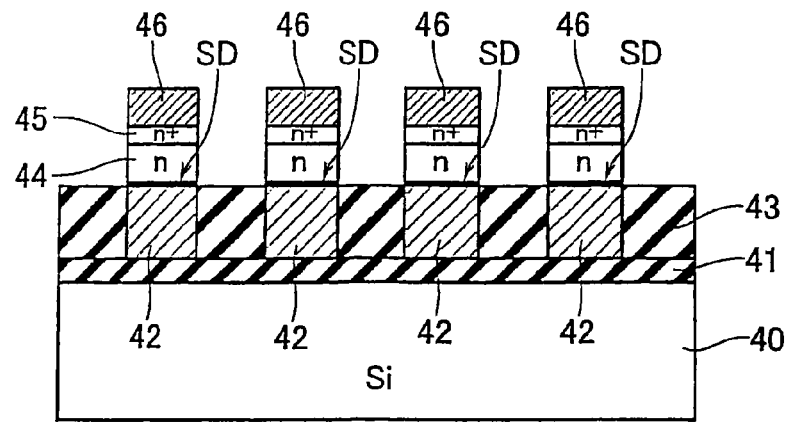
FIG. 18 is a sectional diagram showing a diode isolation step of the same.

Next, as shown in FIG. 17, form an n-type polycrystalline silicon layer 44, and, after having formed an n$^+$-type layer 25 in its surface portion, further form an ohmic electrode film 46. Whereby, diodes SD, each of which has a Schottky junction between the n-type layer 44 and word line 42, are formed. Subsequently as shown in FIG. 18, etch by lithography and RIE the part that covers from the electrode film 46 up to the n-type silicon layer 44 in such a way that it is left with an island like pattern in each cell area. Whereby, the resultant structure becomes in such a state that Schottky diodes SD are disposed at intervals on the word lines 42.

Figure 19:
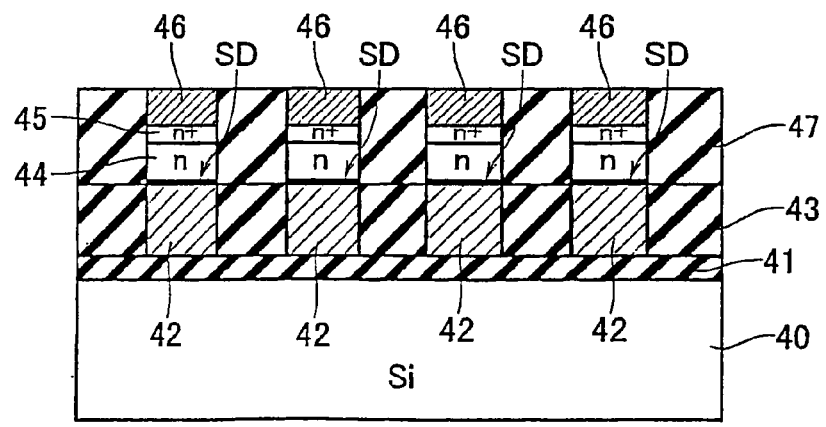
FIG. 19 is a sectional diagram showing a planarization step using an interlayer dielectric film of the same.

Thereafter, as shown in FIG. 19, an element isolation dielectric film 47 is planarly buried around the Schottky diodes SD. Subsequently, as shown in FIGS. 15A-B, deposit a chalcogenide layer 48; further, form bit lines 49 thereon.

According to this embodiment, since the diodes are formed above the word lines, it is possible to lessen a unit cell area of the cell array when compared to the previous embodiments. More specifically, the unit cell area becomes 4F$^2$ as a result of formation of the word lines WL with the line/space=1F/1F and also formation of the bit lines with the same line/space=1F/1F.

Additionally in the case of this embodiment, the cell array is formed on or above the dielectric substrate by film deposition and patterning; thus, it is also possible to reverse the up/down or vertical relationship of the diodes SD and the resistive elements VR. Further, it is also readily achievable to stack cell arrays into the form of a multilayered structure by repeated execution of the film deposition and patterning.

Figure 20:
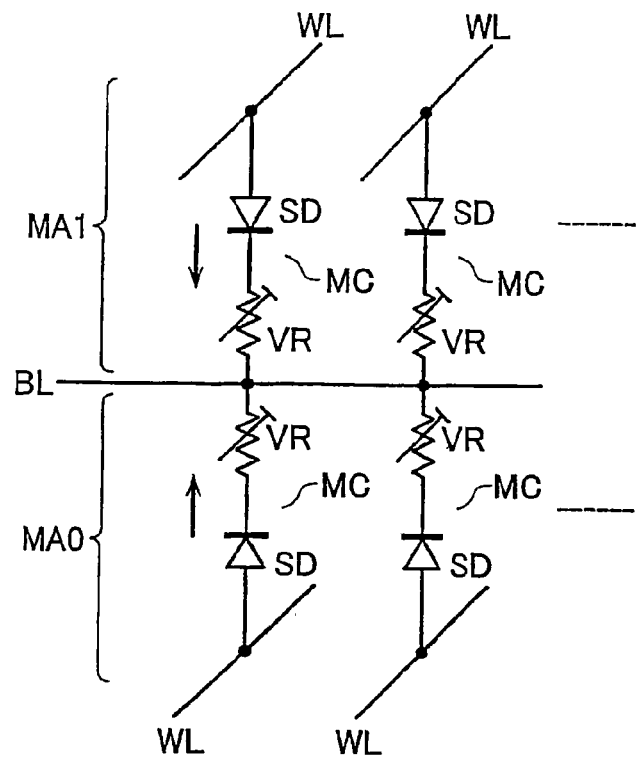
FIG. 20 is an equivalent circuit diagram showing a stacked structure example of a cell array with shaped bit lines.
Figure 21:
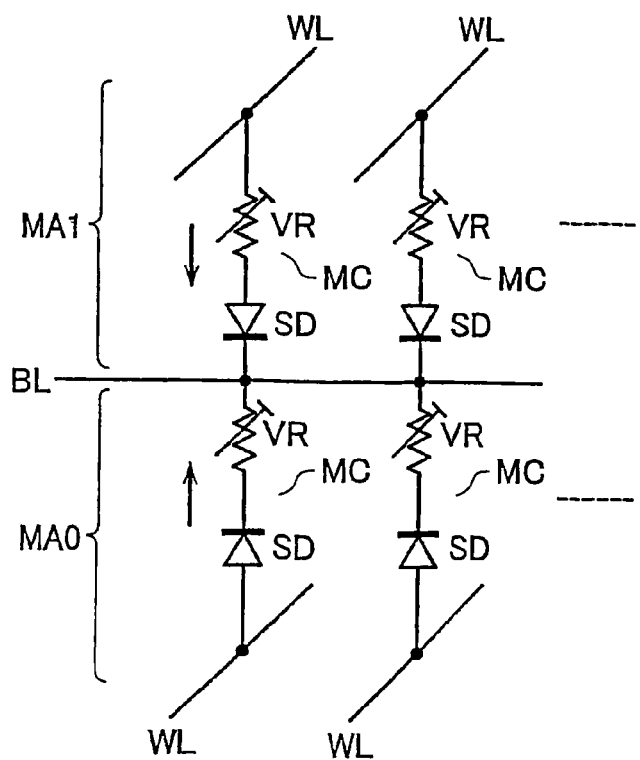
FIG. 21 is an equivalent circuit diagram showing another stacked structure example of a cell array with shaped bit lines.
Figure 22:
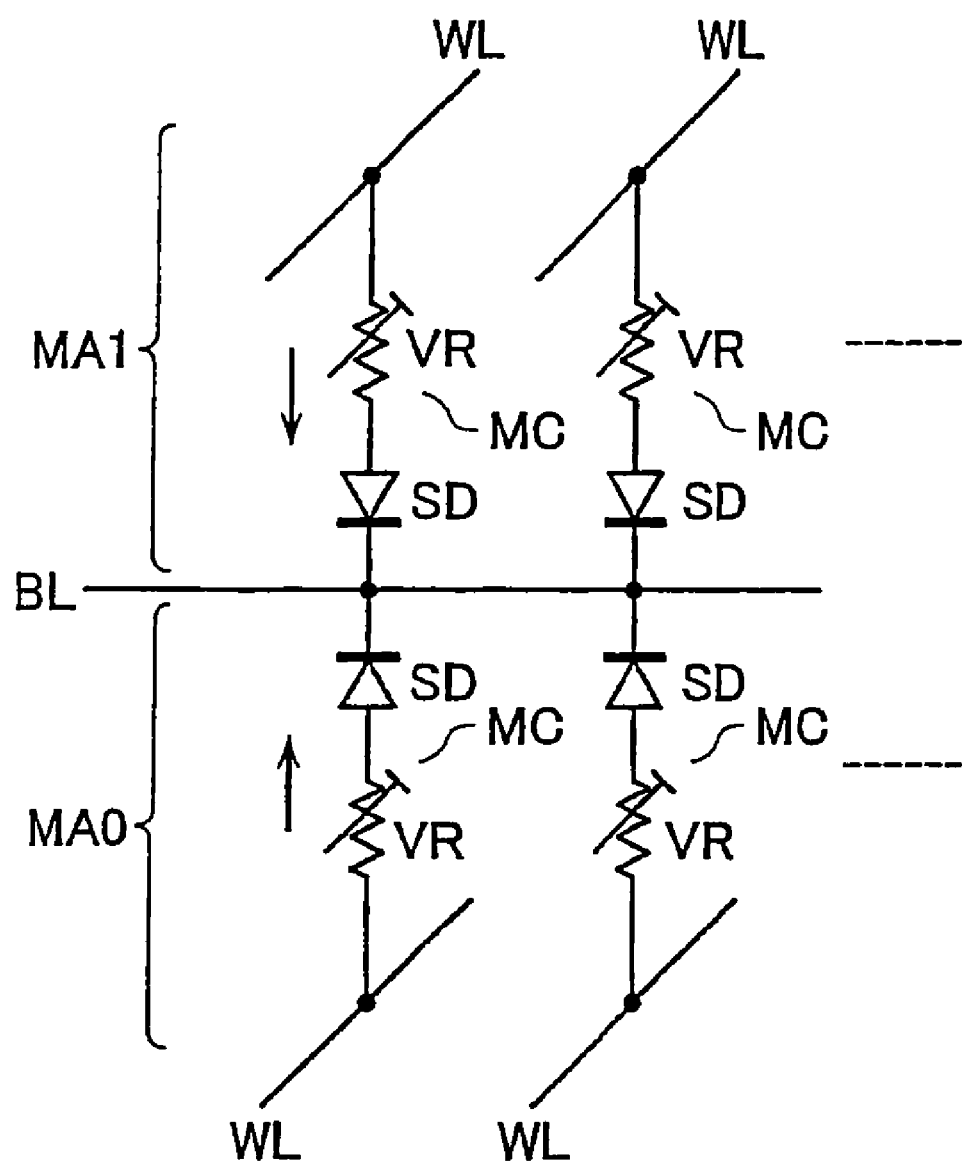
FIG. 22 is an equivalent circuit diagram showing still another stacked structure example of a cell array with shaped bit lines.

A detailed explanation will be given of an embodiment for achievement of the multilayered cell arrays below. FIGS. 20-22 illustrate, in an equivalent circuit that takes aim at one bit lone BL, examples which have two cell arrays MA0, MA1 stacked with shared bit lines BL, with respect to three forms which are made different in layout relationship of respective elements.

In FIG. 20, a memory cell MC configuration which connects the anodes of diodes SD to word lines WL with variable resistive elements VR disposed on the bit-line BL side is arranged to include upper and lower cell arrays MA0, MA1 while letting them share the bit line BL shown herein. In this figure, arrows are used to indicate the directions of cell currents when cells of the upper and lower cell arrays are selected.

In FIG. 21, an example shown herein is different from that of FIG. 20 in the upper cell array MA1. More specifically, the lower cell array MA0 employs a memory cell MC configuration which connects the anodes of diodes SD to word lines WL with variable resistive elements VR disposed on the bitline BL side. In contrast, the upper cell array MA1 uses a memory cell MC arrangement which connects the cathodes of diodes SD to the bit line BL with variable resistive elements VR laid out on the word-line WL side. This example is similar to that of FIG. 20 in that the upper and lower cell arrays MA0, MA1 share the bit line BL.

An example of FIG. 22 is such that the layout of diodes SD and resistive elements VR is inverse to that of FIG. 20. Specifically, a memory cell MC configuration is used which connects the cathodes of diodes SD to the bit line BL while letting resistive elements VR be disposed on the word-line WL side, thus configuring the upper and lower cell arrays MA0, MA1 with the bit line BL shared thereby. Both the examples of FIG. 21 and FIG. 22 are the same in cell current flow directions.

In either one of the examples of FIGS. 20-22, let bit lines BL be set at "H" level (for example, 1.8V) while setting word lines WL at "L" level (e.g. 0V) in a nonselect state. And, with respect to one of the upper and lower cell arrays MA0, MA1, if setting a selected word line at "H" level and a selected bit line BL at "L" level, then the diodes do not become forward-biased in the other cell array; thus, it becomes also possible to provide access to the upper and lower cell arrays MA0, MA1 in a way independent of each other.

Figure 23:
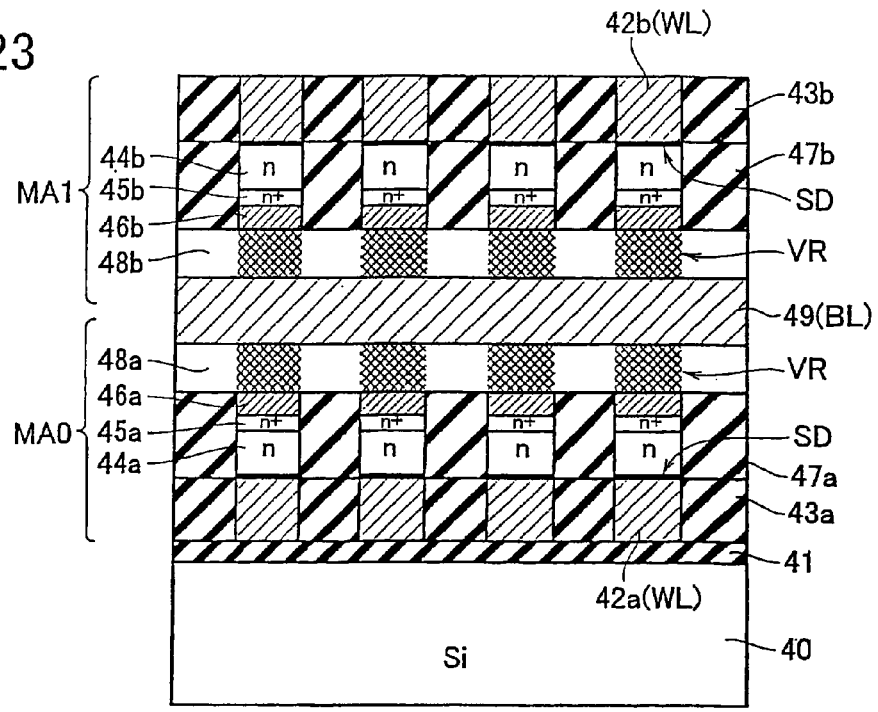
FIG. 23 is a sectional diagram showing a stacked cell array structure corresponding to FIG. 20.
Figure 24:
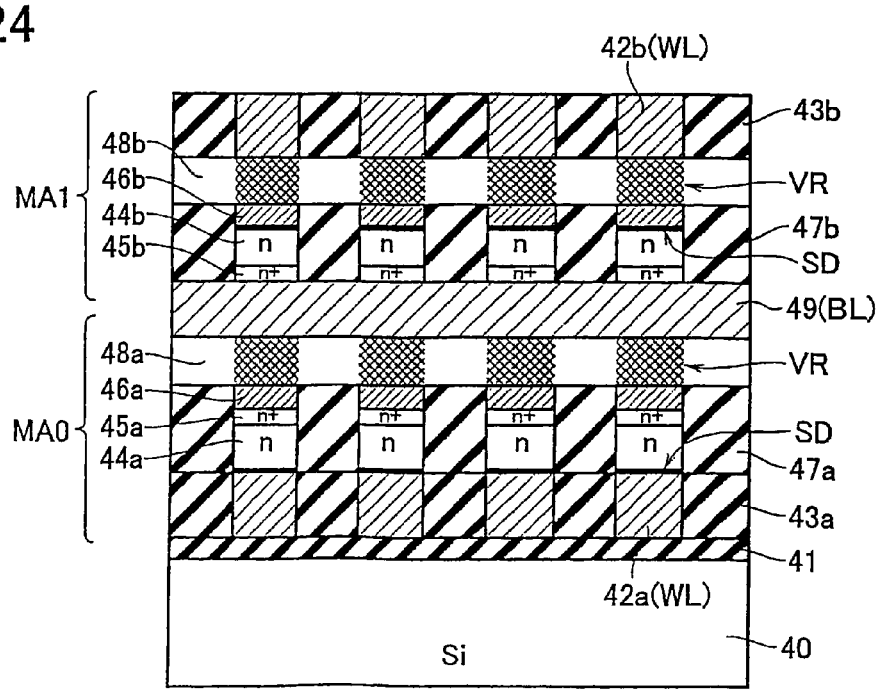
FIG. 24 is a sectional diagram showing a stacked cell array structure corresponding to FIG. 21.
Figure 25:
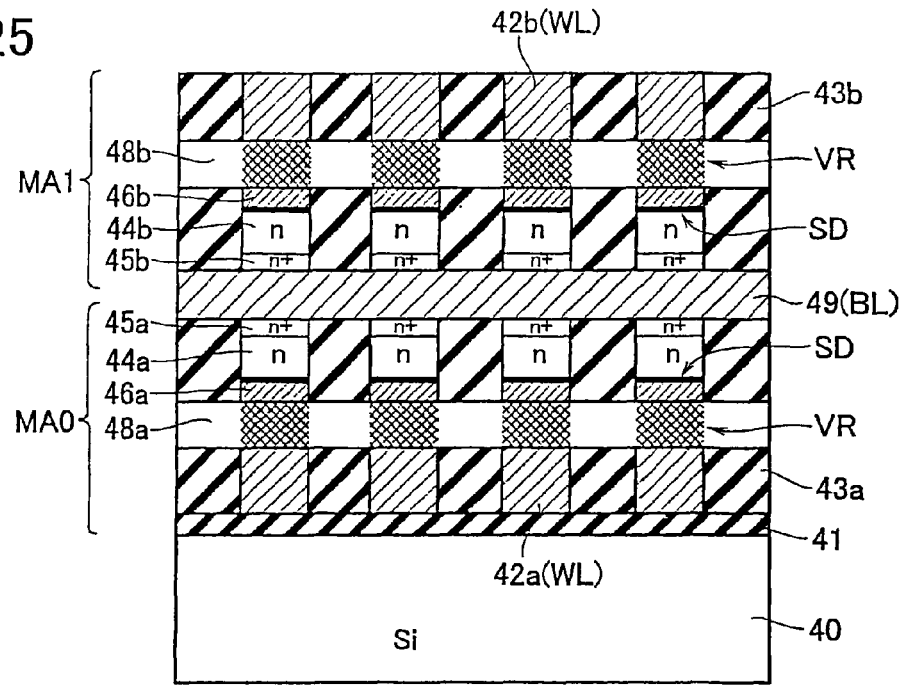
FIG. 25 is a sectional diagram showing a stacked cell array structure corresponding to FIG. 22.

FIGS. 23-25 show the stacked structures of the cell arrays MA0, MA1 of FIGS. 20-22, respectively. In these figures, the same reference numerals are used at parts or components corresponding to those of FIG. 15A, which numerals are distinguished between the lower and upper cell arrays by addition of suffixes "a", "b" thereto. In FIG. 23, the structure of a lower cell array MA0 is the same as that of FIG. 15A. An upper cell array MA1 is stacked over this lower cell array MA0 in such a way as to share bit lines 49 at its uppermost part. The upper cell array MA1 is opposite in film stack/lamination order to the lower cell array MA0, and a chalcogenide layer 48b is formed on the bit lines 49. Sequentially stacked thereon are an ohmic electrode film 46b, an n-type silicon layer 44b with an n$^+$-type layer 45b formed at its bottom, and word lines 42b.

In FIG. 24 also, a lower cell array MA0 is the same as that of FIG. 15A. The film stack order of an upper cell array MA1 to be stacked or multilayered above it is different from that of FIG. 23. More specifically, an n-type silicon layer 44b with an n+-type layer 45b formed at its bottom and a metal film 46b are formed and stacked above a bit line 49, thus making up a diode SD. Unlike the ohmic electrode 46b of FIG. 23, the metal film 46b of FIG. 24 forms a Schottky junction between it and the n-type silicon layer 44b. And, on the diode SD thus formed, a chalcogenide layer 48b is formed; further, word lines 42b are formed thereon.

In FIG. 25, a lower cell array MA0 shown is opposite to that of FIG. 15A in layer-stack order of diodes SD and resistive elements VR. First formed on a plane in which word lines 42a are buried is a chalcogenide layer 48a which constitutes the resistive elements VR. Formed thereon are a metal film 46a and an n-type silicon layer 44a to thereby form a Schottky junction between it and the metal film 46a. An n+-type layer 45a is formed at an upper surface of the n-type silicon layer 44a, and a bit line 49 is formed to be in contact with this layer. Formed above the bit line 49 is an upper cell array MA1 which is similar in layer-stacked structure to that of FIG. 23.

Figure 26:
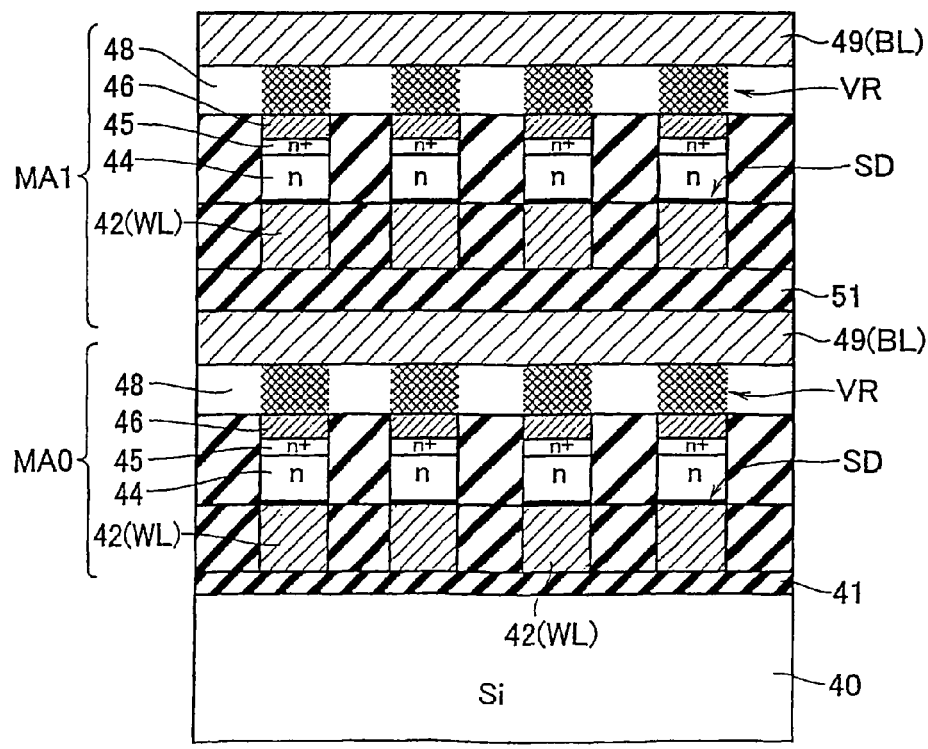
FIG. 26 is a sectional diagram showing a stacked structure of a cell array without shaped wiring lines.

Although the ones shown by the equivalent circuits of FIGS. 20 to 22 and their corresponding cross-sectional structures of FIGS. 23-25 are arranged so that the cell arrays are stacked with shared bit lines, it is also possible to simply stack the upper and lower cell arrays without sharing any bit lines. FIG. 26 shows an example of such stacked cell arrays. This is the one that the cell array structure shown in FIG. 15A is repeatedly stacked with an interlayer dielectric film 51 sandwiched between adjacent cell arrays. The lower cell array MA0 and the upper cell array MA1 are in the state that these are electrically separated from each other. In this way, if the electrically completely isolated cell arrays are stacked, then it is possible to freely select the diode polarity and voltage potential relationship between the upper and lower cell arrays.

Figure 27:
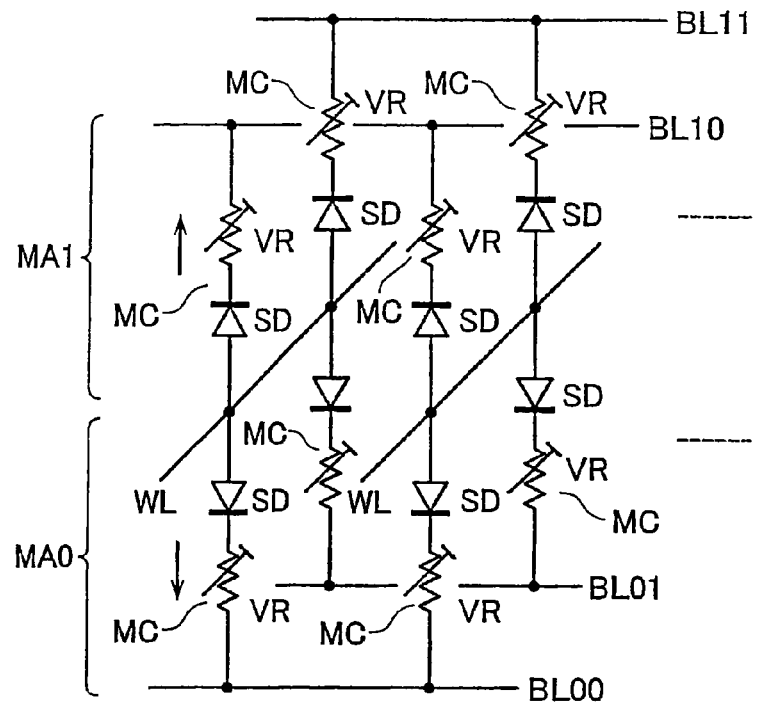
FIG. 27 is an equivalent circuit diagram showing a stacked structure example of a cell array with shared word lines.

Further, it is also possible to design the upper and lower cell arrays so that these are stacked with shared word lines. FIG. 27 shows an equivalent circuit of such an example in which word lines WL of the lower cell array MA0 and upper cell array MA1 are commonly used or shared. As the vertically neighboring cell arrays which are stacked while sharing the word lines or bit lines are such that the bit lines or word lines are independent, it is possible to access them simultaneously. Owing to this, the cell array assembly which shares the word lines or the bit lines expands in applicability and becomes effective for use in multiple-value memories or the like. This point will be described later. In the figure, every cell current of the upper and lower cell arrays upon selection of a shared word line WL is indicated by arrow.

Figure 28:
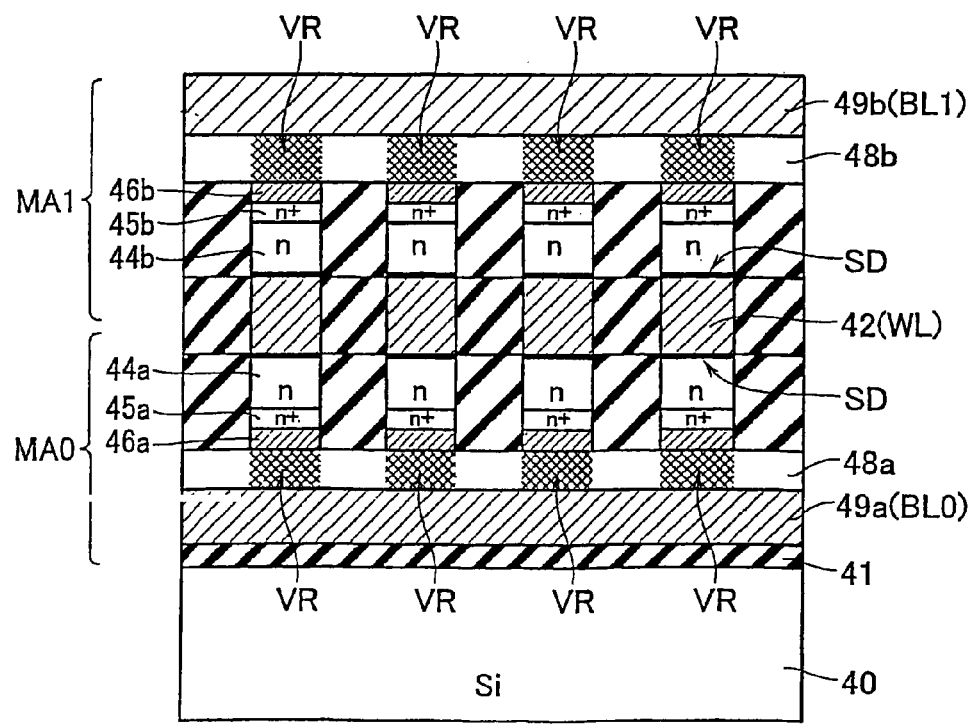
FIG. 28 is a sectional diagram showing a stacked cell array structure corresponding to FIG. 27.

FIG. 28 is a sectional diagram showing a stacked structure of the cell arrays MA0, MA1. In this figure also, at portions which correspond to those of FIG. 15A, the same numerals are used which are distinguished by addition of "a", "b" between the lower and upper cell arrays. First, on a silicon substrate 40 covered with a silicon oxide film 41, a plurality of bit lines (BL0) 49a are formed and disposed. Gap spaces between the bit lines 49a are buried with an interlayer dielectric film. Formed thereon is a chalcogenide layer 48a.

Diodes SD are formed above the chalcogenide layer 48a in such a manner that these are placed at intervals to overlie respective bit lines 49a. More specifically, through patterning of a film which consists of a lamination of an ohmic electrode 46a, n'-type silicon layer 45a and n-type silicon layer 44a, the main body of a Schottky diode SD is made up of n-type silicon film 44a. The periphery of the diode main body is buried with an interlayer dielectric film and thus planarized.

And, word lines (WL) 42 are formed which become the anode electrodes of diodes SD and commonly connect the diodes SD together in a direction crossing the bit lines. In brief, Schottky junction is formed between a word line 42 and its associative n-type silicon layer 44a. Note here that in order to form a more preferable Schottky diode SD, a metal film which is in Schottky contact with the n-type silicon layer 44a may be separately formed in addition to the word line 42.

Spaces between the word lines 42 are buried with an interlayer dielectric film and then made flat. And, on this film, a Schottky diode SD is formed by patterning of a film with a lamination of an n-type silicon layer 44b, n+-type silicon layer 45b and ohmic electrode 46b. A Schottky junction is formed between a word line 42 and its associated n-type silicon layer 44b. The periphery of diode SD is buried with an interlayer dielectric film and planarized; further, a chalcogenide layer 48b is formed thereon. Bit lines (BL1) 49b are formed by patterning on the chalcogenide layer 48b.

With the above-noted procedure, it is possible to stack the cell arrays MA0, MA1 over each other while letting them share the word lines WL. Although in FIGS. 27 and 28 one specific example is shown in which the layer-stack order of the diodes SD and resistive elements VR are reversed between the lower and upper cell arrays MA0, MA1, these may alternatively be the same in stack order as each other. Additionally, the stack order of the resistive elements VR and diodes SD may also be reversed within each cell array MA0, MA1. More specifically, in such an access scheme that a selected word line WL is set at "H" level, and a selected bit line BL at "L" level, the stack order of diodes SD and resistive elements VR may be freely designed, as far as the diodes SD are disposed to have the polarity with the word-line WL side becoming the anode in both the upper and the lower cell arrays.

When combining together the previously explained scheme for stacking the cell arrays with the shared bit lines and the scheme for stacking the cell arrays with the shared word lines, it is possible to mount and pile up the cell arrays into the form of a multilayer of more than three layers while sharing the word lines and bit lines between the vertically neighboring cell arrays, which in turn makes it possible to obtain an extra large capacity of memory with a three-dimensional (3D) structure.

Note that any one of the stacked cell array structures shown in FIGS. 23-26 and 28 is capable of forming both the bit lines and the word lines with the line/space of 1F/1F. Thus it is possible to achieve higher integration densities of the cell arrays. The same goes with the case of stacking cell arrays of more than three layers as will be described later.

Figure 29:
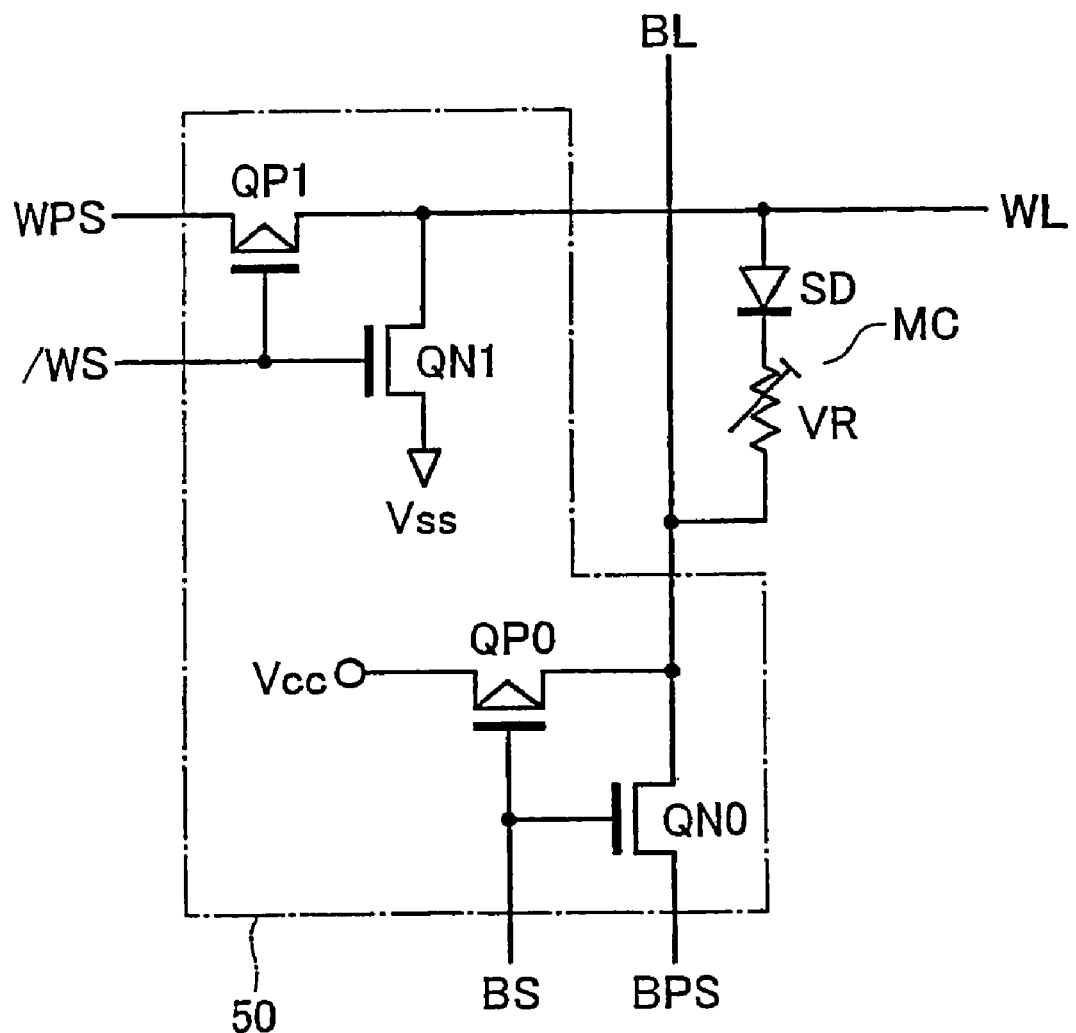
FIG. 29 is a diagram showing a configuration of a bit line and word line selecting circuit of the cell array.

FIG. 29 shows an exemplary configuration of a selection circuit 50 which is for transferring positive logic pulses and negative logic pulses toward the word lines WL and the bit lines BL of a cell array respectively during data reading or writing. The selection circuit 50 has a PMOS transistor QP1 which is driven by a select signal /WS during reading for connecting a word line WL to a high voltage power supply line WPS, and an NMOS transistor QN0 that is driven by a select signal BS for connecting a bit line BL to a low voltage power supply line BPS. The selector circuit 50 also has a reset-use NMOS transistor QN1 and a reset-use PMOS transistor QP0 which are for holding word lines WL at a low level and bit lines BL at a high level when they are not selected.

The select signals /WS, BS are such outputs of address decoders as to be /WS="H", BS="L" in the nonselect state. Accordingly, in the nonselect state, the select transistors QP1, QN0 are in an off-state and the reset transistors QN1, QP0 are in an on-state so that the word lines WL are held at "L" level of Vss and the bit lines BL are at "H" level of Vcc. When becoming in a select state, the reset transistors QN1, QP0 turn off and the select transistors QP1, QN0 turn on. During data reading, the word line WL and bit line BL are connected to the high voltage power supply line WPS and low voltage power supply line BPS, respectively, as shown in the figure of drawing. Suppose that the high voltage power supply line WPS and low voltage power supply line BPS are given "H" level (e.g. Vcc=1.8V) and "L" level (e.g. Vss=0V), respectively. Whereby, a read current flows in the memory cell MC in accordance with the on-state periods of the select transistors QP1, QN0.

Figure 30:
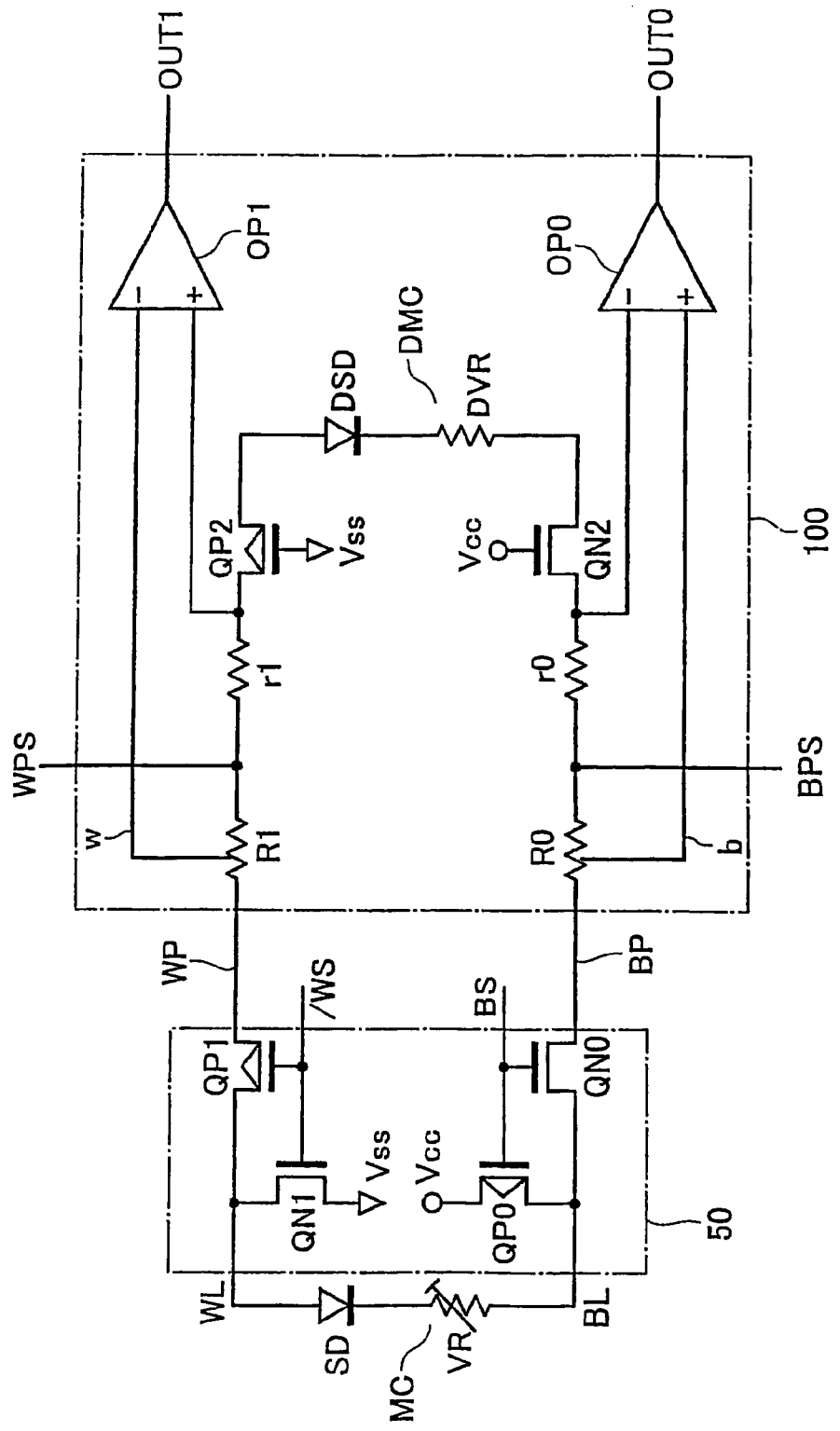
FIG. 30 is a diagram showing a basic configuration of a sense amplifier circuit used in the embodiment.

FIG. 30 shows a basic configuration of a sense amplifier (SA) circuit 100 adaptable for use with the cell array in accordance with this invention. This shows it as an exemplary configuration preferable for development to a sense amplifier scheme in the case of realizing multiple-value storage as will be described later. The sense amp circuit 100 shown in FIG. 30 is a current detection type sense amp, which is configured to include resistors R0, R1 which are the elements for converting a current flowing in a selected cell into a voltage, a dummy cell DMC, resistors r0, r1 for converting a current flowing in this dummy cell DMC to a voltage, and operational amplifiers OP0, OP1.

When a certain word line WL in the cell array is selected by the select PMOS transistor QP1 which is driven by the select signal /WS that is an output of a row address decoder, the selected word line WL is connected to the high voltage power supply line WPS through a signal line WP and the resistor R1. A bit line BL is selected by the select NMOS transistor QN0 being driven by a select signal BS that is an output of a column address decoder, and is then connected to the low voltage power supply line BPS through a signal line BP and the resistor R0.

The dummy cell DMC which is equivalent to a memory cell MC is made up of a dummy diode DSD and a dummy resistive element DVR and is expected to have an intermediate resistance value midway between the resistance values of binary data of the memory cell MC. One end of the dummy cell DMC is connected to the high voltage power supply line WPS through the PMOS transistor QP2 and via the resistor r1. The PMOS transistor QP2 is a dummy element of the select PMOS transistor QP1 and is driven to a normally-on state in any events. The other end of the dummy cell DMC is connected to the low voltage power supply line BPS through the NMOS transistor QN2 and via the resistor r0. The NMOS transistor QN2 is a dummy element of the select NMOS transistor QN0 and is driven to a normally-on state in any events.

The sense-amp main body is composed of two operational amplifiers OP0, OP1. The opamp OP0 has a non-inverting input terminal to which a voltage of an output "b" of an appropriate intermediate tap of the resistor R0 is input and also has an inverting input terminal to which a voltage of a connection node of the resistor r0 and NMOS transistor QN2 is input. The opamp OP1 has an inverting input terminal to which a voltage of an output "w" of an intermediate tap of the resistor R1 is input and a non-inverting input terminal to which a voltage of a connection node of the resistor r1 and PMOS transistor QP2 is input.

An operation of the sense amplifier circuit 100 thus arranged will be explained below. As previously stated, in the nonselect state, the word lines WL are held at "L" level, and the bit lines BL stay at "H" level. At the time of selection, the word line select signal /WS becomes at "L", and the bitline select signal BS becomes "H". And, assuming that the high voltage power supply line WPS is given "H" level=Vcc and the low voltage power supply line BPS is given "L" level=Vss, a cell current flows in a selected memory cell MC.

Practically, suppose that the relationship of the resistors R0, R1, r0, r1 is established so that a resistance value of the resistor R0 of from the intermediate tap of the voltage output b toward the opamp OP0 up to the terminal BPS is the same as the resistor r0 and, similarly, a resistance value of the resistor R1 of from the intermediate tap of the voltage output "w" toward the opamp OP1 up to the terminal WPS is the same as the resistor r1, by way of example. If the selected cell is in a high resistance state (hereinafter, let this be regarded as data "0") and if the cell current is less than the current flowing on the dummy cell DMC side, then both outputs of the opamps OP0, OP1 become "L". To the contrary, if the selected cell is in a low resistance state (let this be data "1" hereinafter) and when a current flows which is greater than the current flowing on the dummy cell DMC side, the both outputs of the opamps OP0, OP1 become "H". To be brief, based on the logic shown in FIG. 32, it is possible to perform determination or judgment of data "0", "1".

It should be noted that the configuration of the sense amp circuit 100 of FIG. 30 is the one that takes into consideration the multi-value storage to be later described: in the case of considering the above-stated two-value or binary storage only, only either one of the opamps OP0, OP1 may be used. Alternatively, it is also possible to reverse the connection relationship of the inverting input terminal and non-inverting input terminal of any one of the opamps OP0, OP1. The result of this is that the outputs of two opamps OP0, OP1 are such that one becomes "H" and the other becomes "L" in accordance with the binary data. Accordingly, if an opamp which inputs these two opamp outputs is further prepared, it is possible to obtain a sense output with the data "0", "1" corresponding to "H", "L".

An explanation will next be given of the case where multi-value storage is performed by the stacked two-layer cell arrays MA0, MA1 with the shared word lines WL as has been explained in FIGS. 27 and 28. The multivalue storage utilizes a combination of four possible data states of two memory cells which are accessed simultaneously between two cell arrays MA0, MA1. A sense amplifier circuit 100 for use with four-value storage, which is a developed or extended version of the circuit scheme of FIG. 30, is shown in FIG. 31.

Figure 31:
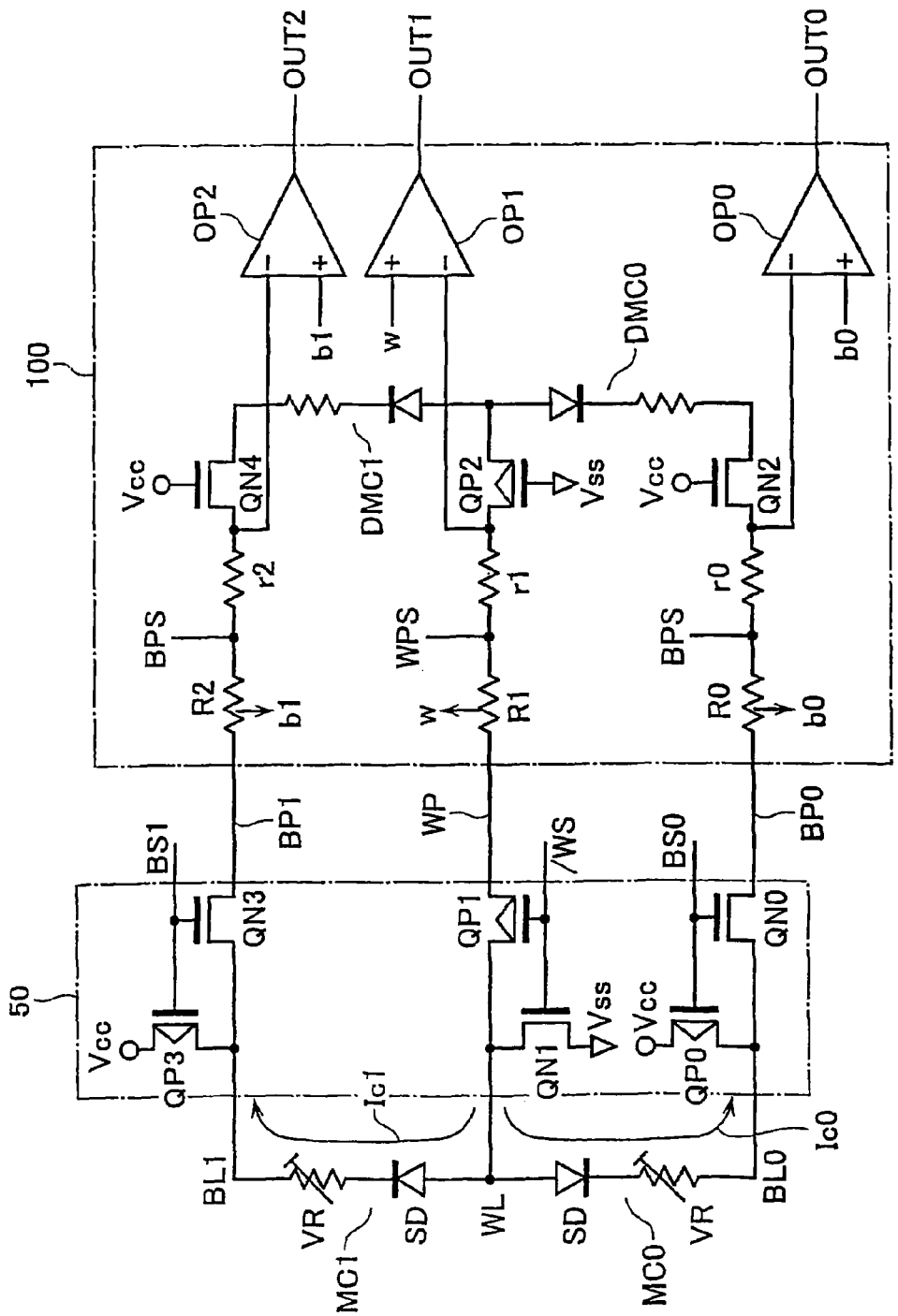
FIG. 31 is a diagram showing a configuration of a sense amplifier circuit in the case of performing four-value storage by means of two-layer stacked cell arrays.

The sense amplifier circuit 100 of FIG. 31 is the same as that of FIG. 30 in arrangement of the part including the current-to-voltage conversion resistors R0, R1, r0, r1 and opamps OP0, OP1 with respect to a memory cell MC0 and a dummy cell DMC0 that are selected by a bit line BL0 of the lower cell array and the shared word line WL. Regarding a memory cell MC1 to be selected by the shared word line WL and a bit line BL of the upper cell array also, a similar arrangement is used while letting the wordline WL side circuitry be shared by the lower cell array.

A bit line BL1 on the upper cell array side is connected to the low voltage power supply line BPS through a select NMOS transistor QN3 and also via a signal line BP1 and a resistor R2. In addition, a dummy cell DMC1 is connected via resistors r2, r1 between the low voltage power supply line BPS and the high voltage power supply line WPS, and an operational amplifier OP2 is prepared. The operational amplifier OP2 has an inverting input terminal to which a connection node of the resistor r2 and a dummy NMOS transistor QN4 is connected and a non-inverting input terminal to which a voltage output "b1" of an intermediate tap of the resistor R2 is input.

With such the configuration of sense amp circuit 100, it is possible to determine or judge four-value data by combination of the data states "0", "1" of the memory cell MC1 of the upper cell array and the data states "0", "1" of the memory cell MC0 of the lower cell array, which cells are selected simultaneously. In FIG. 31, there is shown the behavior of cell currents Ic0, Ic1 which flow in the memory cells MC0, MC1 when the shared word line WL is selected while the bit lines BL0 and BL1 are selected. An upside column of the truth value table shown in FIG. 33 indicates a combination of the data states "0", "1" of the memory cell MC1 and the data states "0", "1" of the memory cell MC0.

For data "00" (namely, the memory cells MC1, MC0 are both at "0" (high resistance state)), an output OUT1 of the operational amplifier OP1 is at "L". While outputs OUT0, OUT2 of operational amplifiers OP0, OP2 are both at "L", these are not required for use during data determination and, for this reason, indicated by "–". This will be applied similarly in the explanation below. At the time of data "01" (i.e. the upper cell MC1 stays at "0" and the lower cell MC0 is at "1" (low resistance state)), a large current flows on the lower cell MC0 side so that the outputs OUT0, OUT1 of opamps OP0, OP1 become "H" while the output OUT2 of opamp OP2 stays at "L". At the time of data "10" (i.e. the upper cell MC1 is "1" and the lower cell MC0 is "0"), a significant current flows on the upper cell MC1 side whereby the outputs OUT1, OUT2 of opamps OP1, OP2 become "H" and the output OUT0 of opamp OP0 is at "L". Thus, the data "01" and "10" are determinable by "L", "H" of OUT2, OUT1 and "H", "L" of OUT1, OUT0.

In the case of data "11" (the upper and lower cells MC1, MC0 are both "1"), large currents flow in the both, causing all the outputs OUT0-OUT2 of the opamps OP0-OP2 to become "H". As apparent from the foregoing, 4-value storage is achievable by using two cells of the upper and lower cell arrays based on the truth value table shown in FIG. 33 due to the combination of the outputs OUT0-OUT2 of three opamps.

Figures 34, 36:
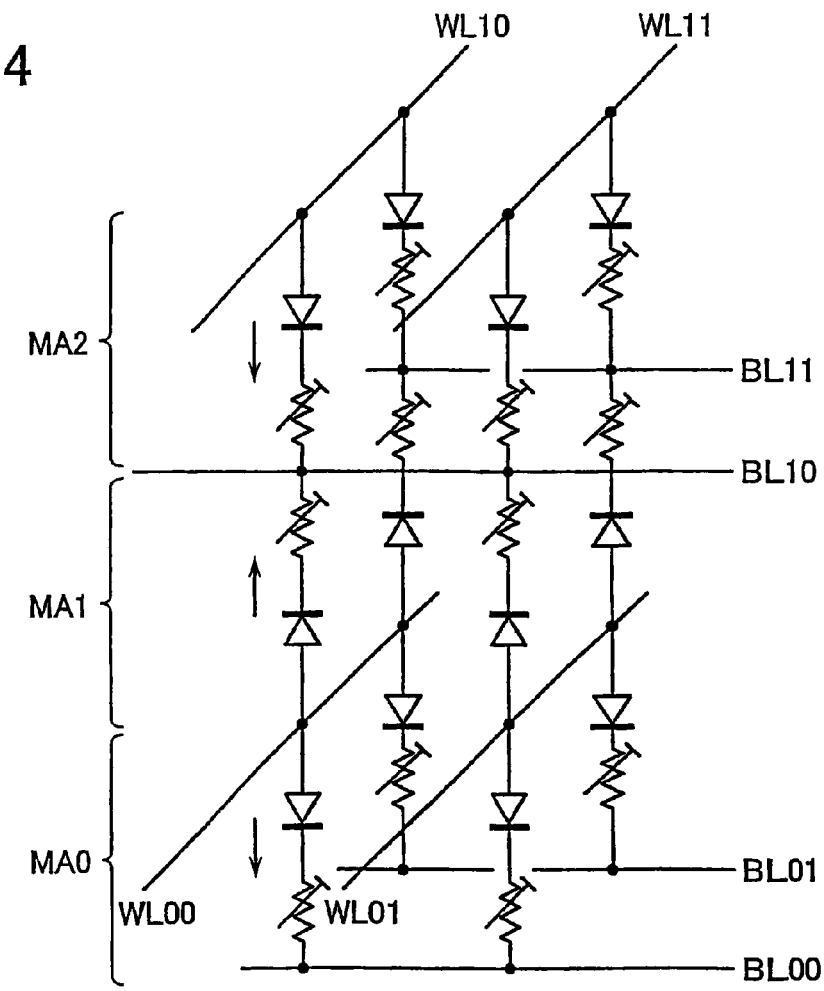
FIG. 34 is an equivalent circuit diagram of three-layer stacked cell arrays.
FIG. 36 is a truth value table for explanation of an operation of the sense amp circuit of FIG. 35.

An explanation will next be given of an example which makes up an eight-value memory by use of three-layer stacked cell arrays. FIG. 34 depicts an equivalent circuit of the three-layer cell arrays, wherein a cell array MA0 is made up of memory cells which are interposed between bit lines BL0 (BL00, BL01, . . . ) of the lowermost layer and word lines WL0 (WL00, WL01, . . . ). A cell array MA1 is arranged at its upper part while sharing such word lines WL0; further, a cell array MA2 is stacked or piled while sharing bit lines BL1 (BL10, BL11, . . . ) of this cell array MA1.

Figure 35:
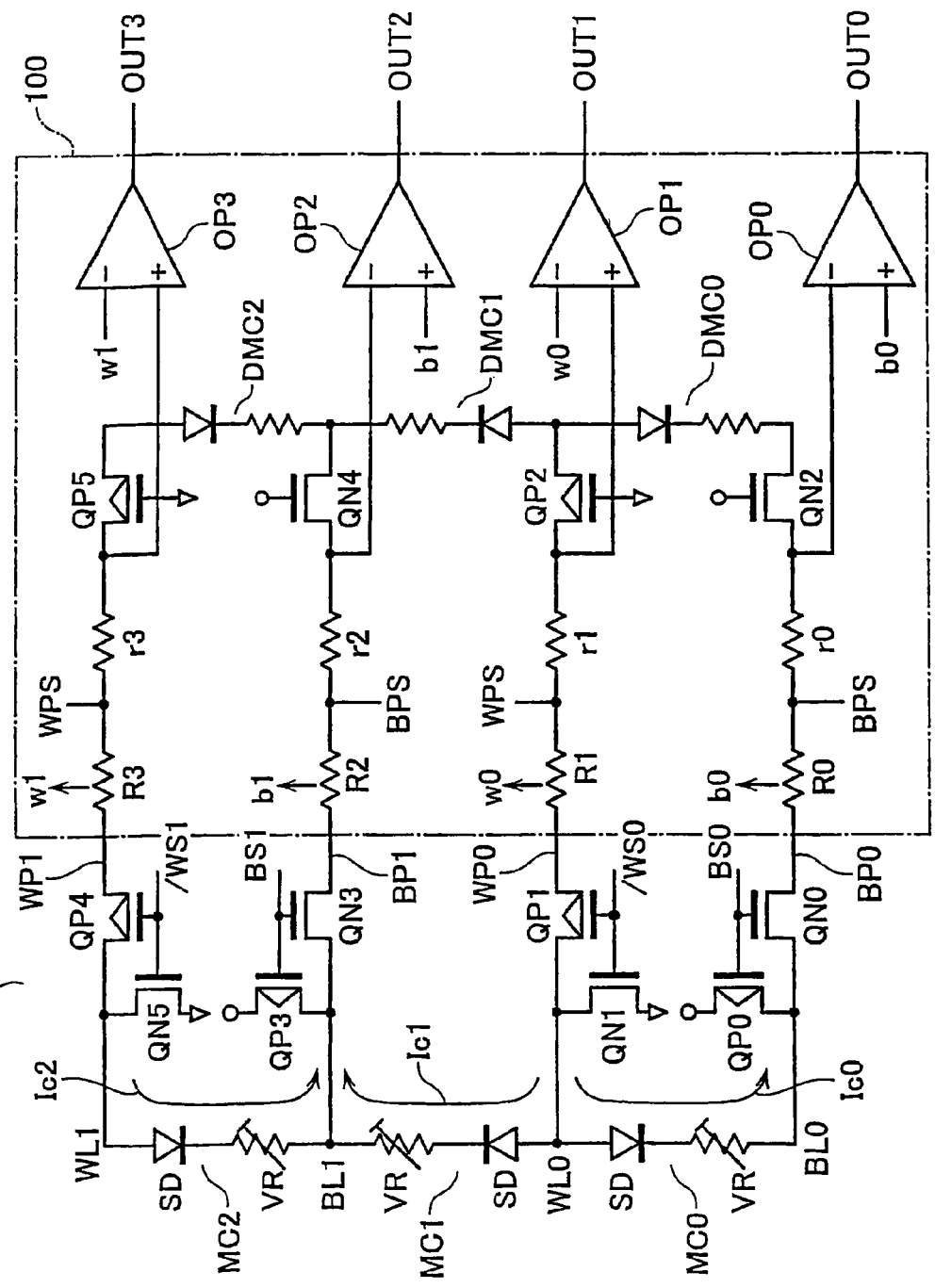
FIG. 35 is a diagram showing a configuration of a sense amp circuit in the case of performing eight-value storage by means of three-layer stacked cell arrays.

In FIG. 34, the directions of cell currents upon selection of cells from the three-layered cell arrays MA0-MA2 on the one-by-one basis are indicated. Using such the 3-layer cell arrays, 8-value storage becomes possible by combination of the data states of three memory cells that are simultaneously selected from the cell arrays. FIG. 35 shows a sense amplifier circuit 100 employable in the case of performing such 8-value storage, which is an extended version of the sense amp scheme of FIG. 31. In this case, there are provided an operational amplifier OP0 which is used for current detection of a bit line BL0 of the first cell array MA0, an opamp OP1 used for current detection of a shared word line WL0, an opamp OP2 used for current detection of a shared bit line BL1, and an opamp OP3 used for current detection of the uppermost word line WL1.

In FIG. 35, there is also shown the behavior of cell currents Ic0, Ic1 and Ic2 which flow in cells MC0, MC1 and MC2, respectively, that are simultaneously selected in the 3-layer cell arrays. FIG. 36 shows a truth value table upon detection of multi-value cell states in the case of using such a sense amplifier circuit configuration. An upside row of FIG. 36 is a combination of the data states of the cell MC2 of the upper cell array MA2, the cell MC1 of the intermediate cell array MA1, and the cell MC0 of the lower cell array MA0. It is apparent from viewing FIG. 36 that in the case of data states "101" and "111", outputs of all the opamps become "H", resulting in occurrence of degeneration or "degeneracy" and thus in the lack of distinguishability. The reason of this is as follows: at this time, a large cell current flows from the word line WL1 through the cell MC2 into the bit line BL1, and similarly, a large current flows from the word line WL0 via the cell MC0 to the bit line BL0, thereby causing the outputs of all opamps OP0-OP3 to become "H" without regard to the data state of intermediate cell MC1.

Therefore, in order to effectively utilize all the 8-value data, a sense-amp circuit scheme capable of distinguishing between the data "101", "111" is required. One approach to achieving this is to utilize the fact that when the upper cell MC2 and the lower cell MC0 are both "1", a difference between the case of the intermediate cell MC1 of "0" and the case of "1" lies in that the values of currents flowing in the word line WL0 in these cases are different from each other. More specifically, if the cell MC0 is "1" and the cell MC1 is "0", a large current flows from the word line WL0 into only the cell MC0. Contrary to this, if the cells MC0, MC1 are both at "1", a large current flows from the word line WL0 into both of the cells MC0, MC1; thus, looking at the current of the word line WL0, a difference with a doubled current value takes place.

Figure 37:
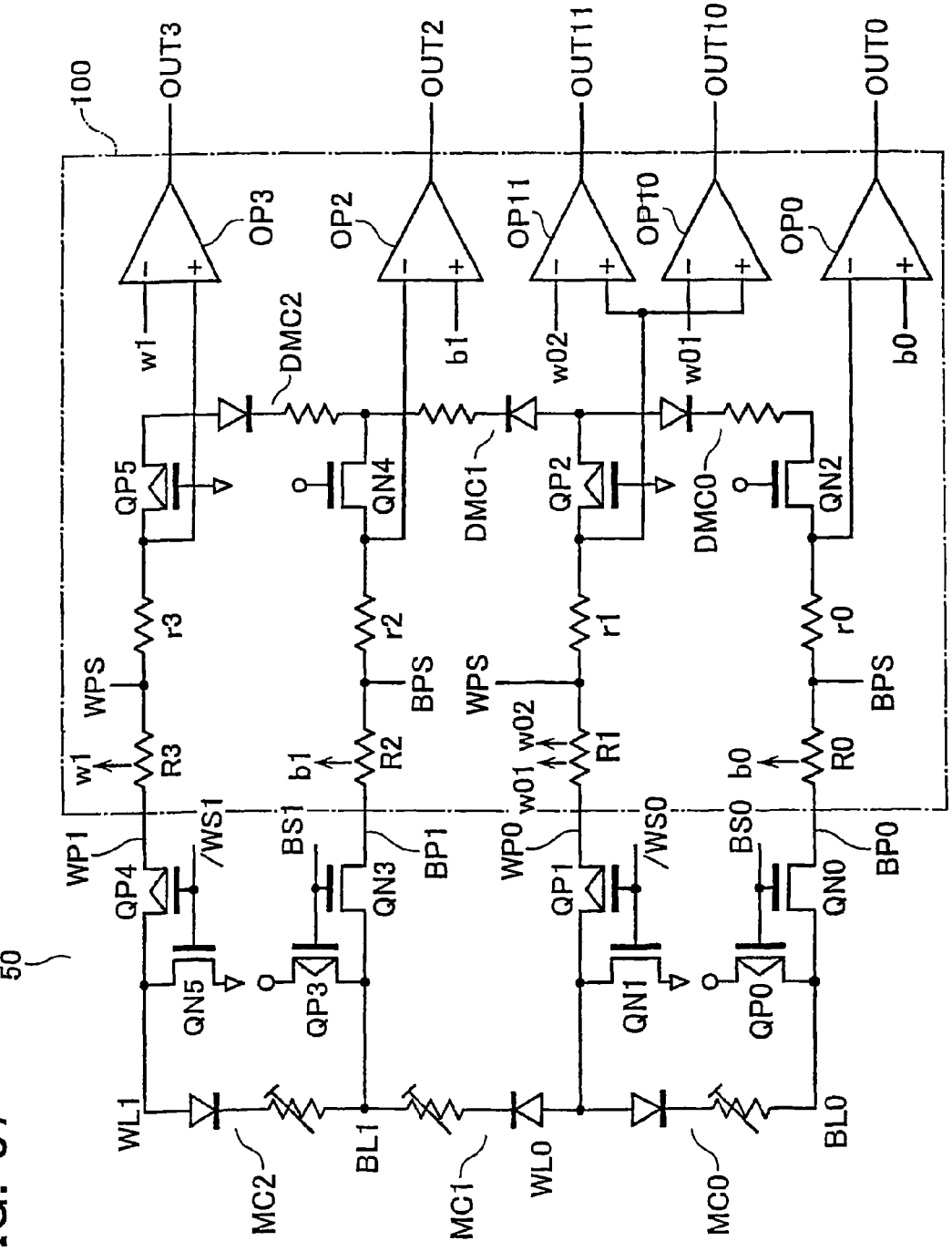
FIG. 37 is a diagram showing a configuration of a sense amp circuit which is an improved version of the sense amp circuit of FIG. 35.

Keeping this point in mind, a sense amp circuit 100 which is an improved version of the circuit of FIG. 35 is shown in FIG. 37. This is the one that includes, at the part of the operational amplifier OP1 which performs current detection of the word line WL0 shown in FIG. 35, a parallel combination of operational amplifiers OP10, OP11 which become two current detection units in order to make it possible to accurately find any appreciable difference in current value between the case of both the memory cells MC0, MC1 storing data "1" therein and the case of only one of them storing data "1". Let outputs w01, w02 of two intermediate taps be taken out to the resistor R1 on the high voltage power supply line WPS side with respect to word line WL0, which are then passed to the inverting input terminals of the opamps OP10, OP11, respectively. Here, w02 is a tap position output which is less than w01 in resistive voltage drop, which is designed so that when the current value becomes almost two times greater, a voltage potential is output which is approximately the same as the value of w01 at a onefold current value.

In other words, the tap positions of the intermediate tap outputs w01, w02 of the resistor R1 should be adjusted as follows: comparing to a current flowing in the dummy cell, when the current which flows from the high voltage power supply line WPS toward a single low-resistance cell ("1" data cell), output OUT10 is at "H" and OUT11 becomes "L", while causing the both of OUT10, OUT11 to become "H" when the current flows toward two low-resistance cells.

With the use of such sense amp circuit, it is possible to detect and determine 8-value data while accurately distinguishing each over the others without having to use the opamp OP2 which corresponds to the bit line BL1. A truth value table thereof is shown in FIG. 38. The 8-value data states (state values of MC2, MC1, MC0) owing to three cells is shown in the uppermost row. By appropriate combination of "H", "L" of the output OUT0 of opamp OP0 relative to the bit line BL0, "H", "L" of the outputs OUT10, OUT11 of two opamps OP10, OP11 corresponding to the word lines WL0 and "H", "L" of the output OUT3 of opamp OP3 corresponding to the word line WL1, it is possible to distinguishably determine eight values in such a state that any degeneracy is absent.

It should be noted that the sense amp circuit scheme for performing the current value determination at word lines shown in FIG. 37 is also applicable to the 4-value storage stated previously. More specifically, in place of the three opamps OP0, OP1, OP2 of FIG. 31, use three opamps OP0, OP10, OP11 shown in FIG. 37. At this time, a 4-value truth table corresponding to FIG. 33 is as shown in FIG. 39.

Figure 40:
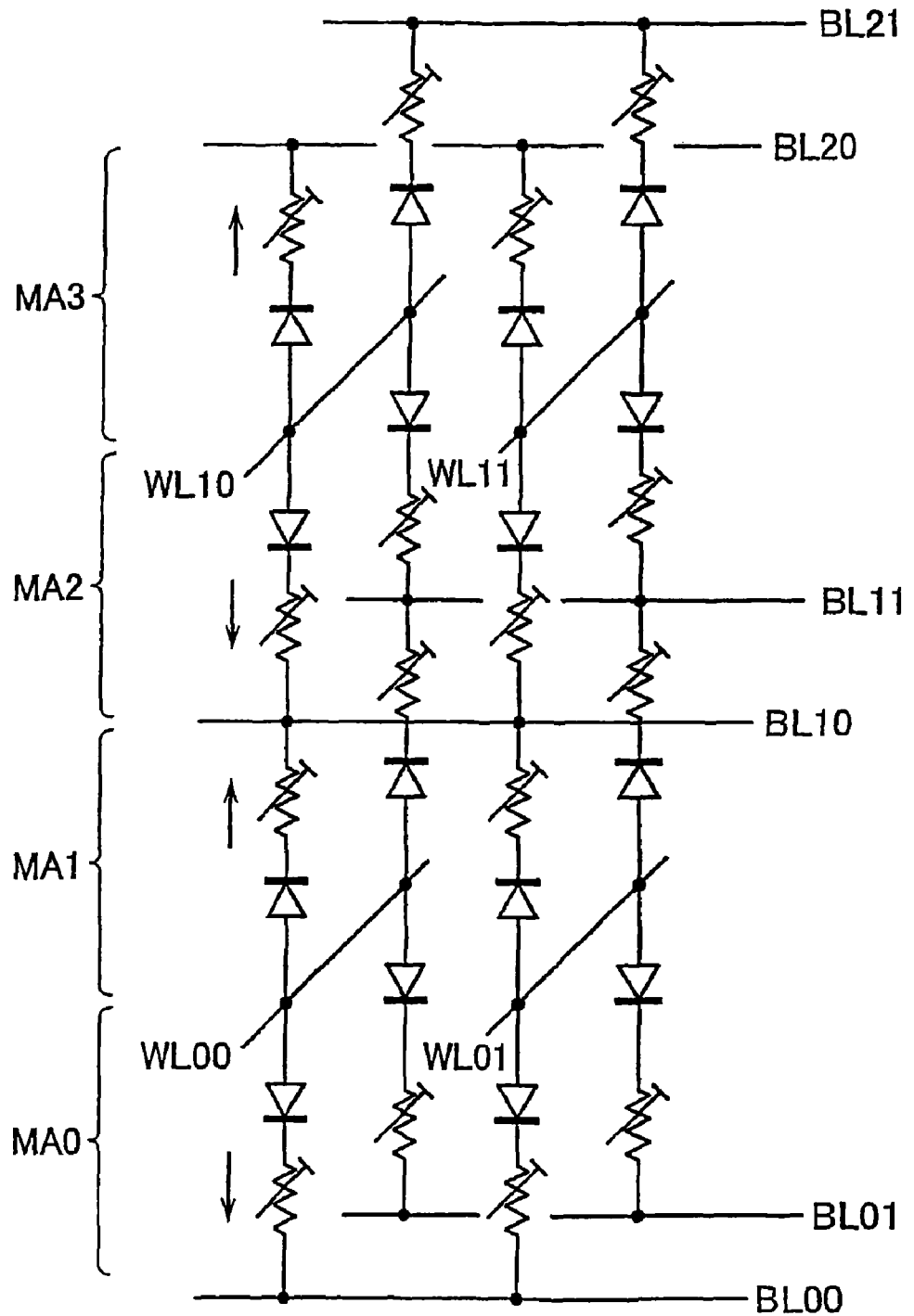
FIG. 40 is an equivalent circuit diagram of a four-layer stacked cell arrays.

Next, an explanation will be given of a 16-value storable memory configuration by use of four-layer stacked cell arrays. FIG. 40 is an equivalent circuit of it. Although the structure of such stacked cell arrays is not specifically shown, the illustration here assumes the use of stacked cell arrays obtainable by repeated use of the stacked structure of word-line-shared two-layer cell arrays MA0, MA1 shown in FIG. 28. Accordingly, a first cell array MA0 and its overlying second cell array MA1 are designed to share word lines WL0 (WL00, WL01, . . . ). The second cell array MA1 and its overlying third cell array MA2 share bit lines BL1 (BL10, BL11, . . . ). Further, the third cell array MA2 and its overlying fourth cell array MA3 share word lines WL1 (WL10, WL11, . . . ). In the figure, arrows are used to indicate the directions of cell currents flowing when both the upper and lower shared word lines WL0, WL1 are selected at a time.

Based on the 4-bit data to be selected respectively from the 4-layer cell arrays thus arranged, 16-value storage is performed. Suppose that the sense amp circuit scheme shown for example in FIG. 31 or FIG. 35 is simply applied with no changes as a sense amp circuit therefor. Although its illustration is omitted, operational amplifiers to be provided at this time are five ones which follow: OP0 with respect to the bit lines BL0 of the lowermost layer; OP1 for the next first shared word lines WL0; OP2 for the next shaped bit lines BL1; OP3 for the next second shared word lines WL1; and, OP4 for the bit lines BL2 of the uppermost layer.

A truth value table of 16 values with the outputs of five operational amplifiers OP0-OP4 as OUT0-OUT4 in the case of the sense amp circuit scheme is as shown in FIG. 41. An upside row is 16-value cell states (a combination of the state values of a selected cell of cell array MA3, a selected cell of cell array MA2, a selected cell of cell array MA1, and a selected cell of cell array MA0).

According to this truth value table, three sets of multivalue-state degeneration or degeneracy are found. More specifically, data "0101" and "0111" are such that the output OUT4 is at "L" with all the remaining outputs staying at "H", resulting in a failure to distinguish one from the other. Data "1010" and "1110" are such that the output OUT0 is "L" with all the remaining outputs staying at "H", resulting in the lack of distinguishability therebetween. Additionally, data "1011", "1101", "1111" are such that every output becomes "H".

Figure 42:
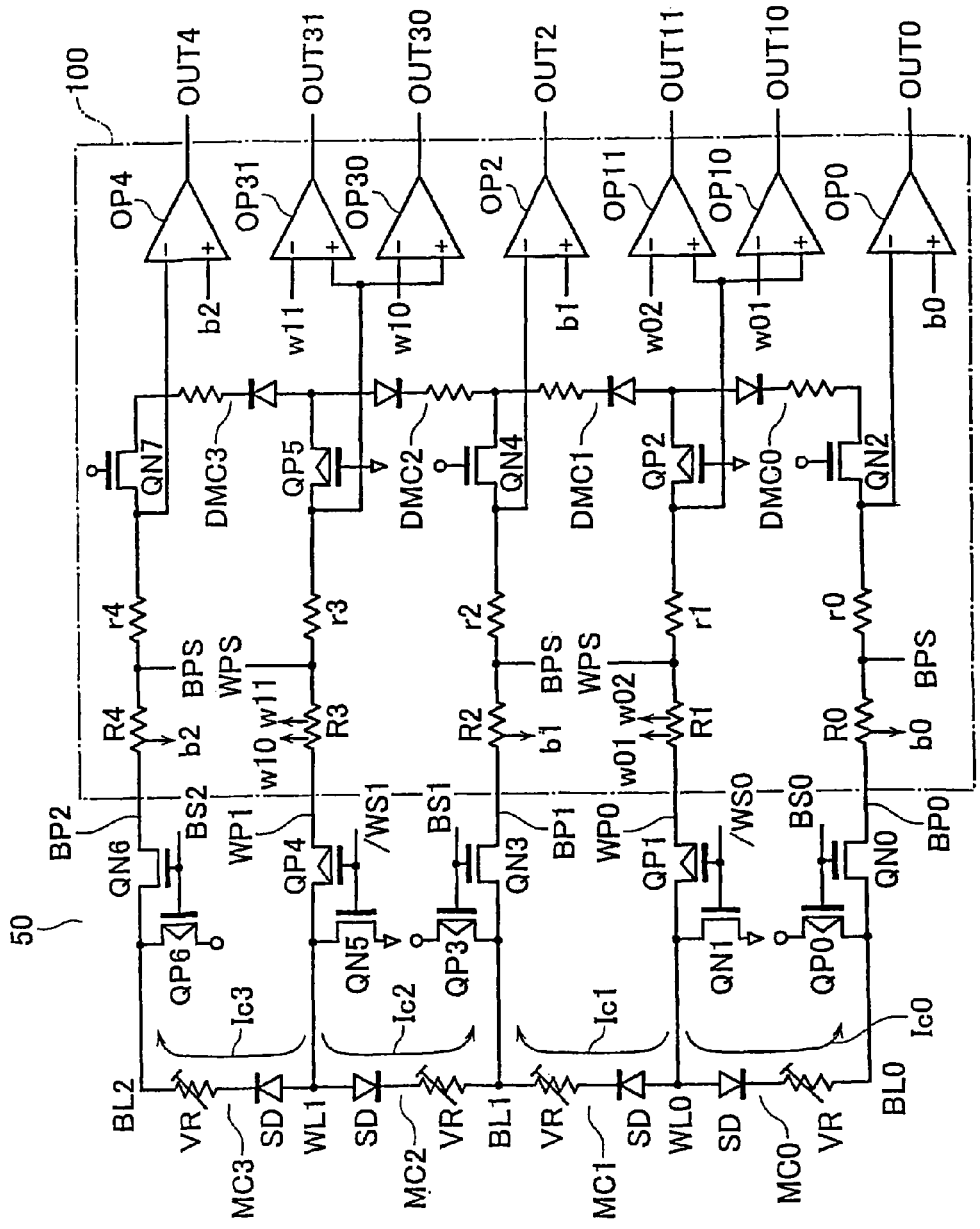
FIG. 42 is a diagram showing a configuration of a sense amp circuit preferable for 16-value storage by means of four-layer stacked cell arrays.

An approach to effectively putting all of the 16-value multivalue data to practical use is to employ the sense amp circuit scheme of FIG. 37—that is, the scheme that is capable of distinguishing, with respect to the current flowing in a word line, between a case of the current flowing in a single cell and another case of the current flowing in two cells. Practically, when showing an extended version of the sense amp circuit scheme of FIG. 37 in a way corresponding to the 16-value storage of the 4-layer cell arrays, the result is as shown in FIG. 42. In a similar way to that two operational amplifiers OP10, OP11 are provided relative to the first shared word lines WL0 counted from the lowermost part, two operational amplifiers OP30, OP31 are also provided with respect to the second shared word lines WL1. These opamps OP30, OP31 operate to input two intermediate tap outputs w10, w11 of a resistor R3 at their inverting input terminals, thereby making it possible to distinguish between the case of a one-cell current flowing in word line WL1 and the case of two-cell currents flowing therein.

A truth value table in the case of performing 16-value storage using such the sense amp circuit is shown in FIG. 43. Here, 16 values are representable by combination of six outputs which consist of an output OUT4 of op-amp OP4, outputs OUT30, OUT31, OUT10, OUT11 of opamps OP30, OP31, OP10, OP11 two of which are provided relative to the individual one of two shared word lines WL1, WL0, and an output OUT0 of opamp OP0 relative to a bit line BL0 of the lowermost layer. An output of opamp OP2 is of no use, which opamp is provided in a way corresponding to the shared bit line BL1 of the second cell array MA1 and third cell array MA2.

As apparent from the truth value table of FIG. 43, it is possible to attain successful detection and determination of all the 16-value data items without suffering from any degeneracy. In accordance with this truth table, make logic circuitry with assignment to 16-value outputs, thereby enabling judgment and output of 16-value information owing to four cells of the 4-layer cell arrays.

Figure 44:
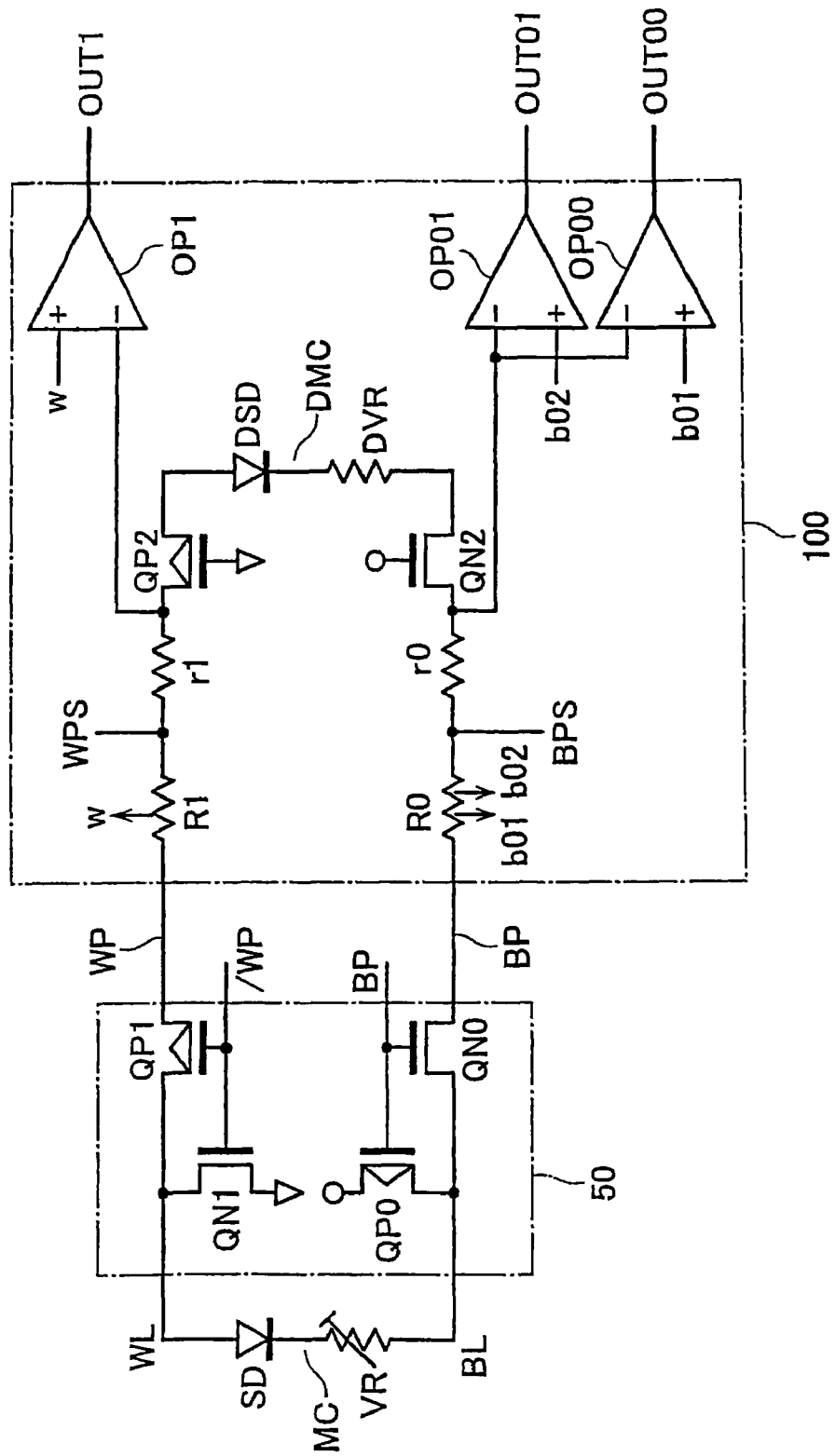
FIG. 44 is a diagram showing another sense amp circuit scheme for avoidance of degeneration or degeneracy.

In the description above, the sense amp circuit configurations for multivalue data determination in the state without the risk of degeneracy have been explained. Up to here, the description is devoted to the ones that put in parallel the operational amplifiers for detection of currents flowing in the word lines WL in order to determine whether the cell current flowing in an intermediate cell vertically interposed between upper and lower cells is one-cell component or two-cell components. In contrast to this approach, the aforesaid current determination for identifying whether a one-cell component or two-cell components may alternatively be done on the bitline BL side. An example is that a configuration of FIG. 44 is used as the sense amp circuit 100 relative to a unit cell array, in place of that of FIG. 31. Let two operational amplifiers OP00, OP01 be provided in parallel on the bitline side; then, input to the inverting input terminals of them two intermediate tap outputs b01, b02 of a resistor R0. The intermediate tap outputs b01, b02 are set up in a way which follows: outputs of the opamps OP00, OP01 are OUT00=L and OUT01=L in case any bitline current does not flow; OUT00=H, OUT01=L when a single-cell bitline current flows; and, OUT00=OUT01=H upon flowing of a bitline current equivalent in amount to two cells.

With the use of the sense amplifier circuit 100 thus arranged, it becomes possible to sense and verify multivalue storage data by means of the stacked or multilayered cell arrays which include neighboring cell arrays that share bit lines. Although its detailed explanation is omitted, if in the case of 8-value storage by use of 3-layer cell arrays as an example, data discrimination without the risk of any degeneracy is made possible by replacing the part of the op-amp OP2 on the bitline BL1 side in the sense amp(SA) circuit 100 of FIG. 37 with a parallel combination of two opamps OP00, OP01 which are shown in FIG. 44 and are capable of data determination while distinguishing between a one-cell bitline current and a two-cell bitline current.

Figure 45:
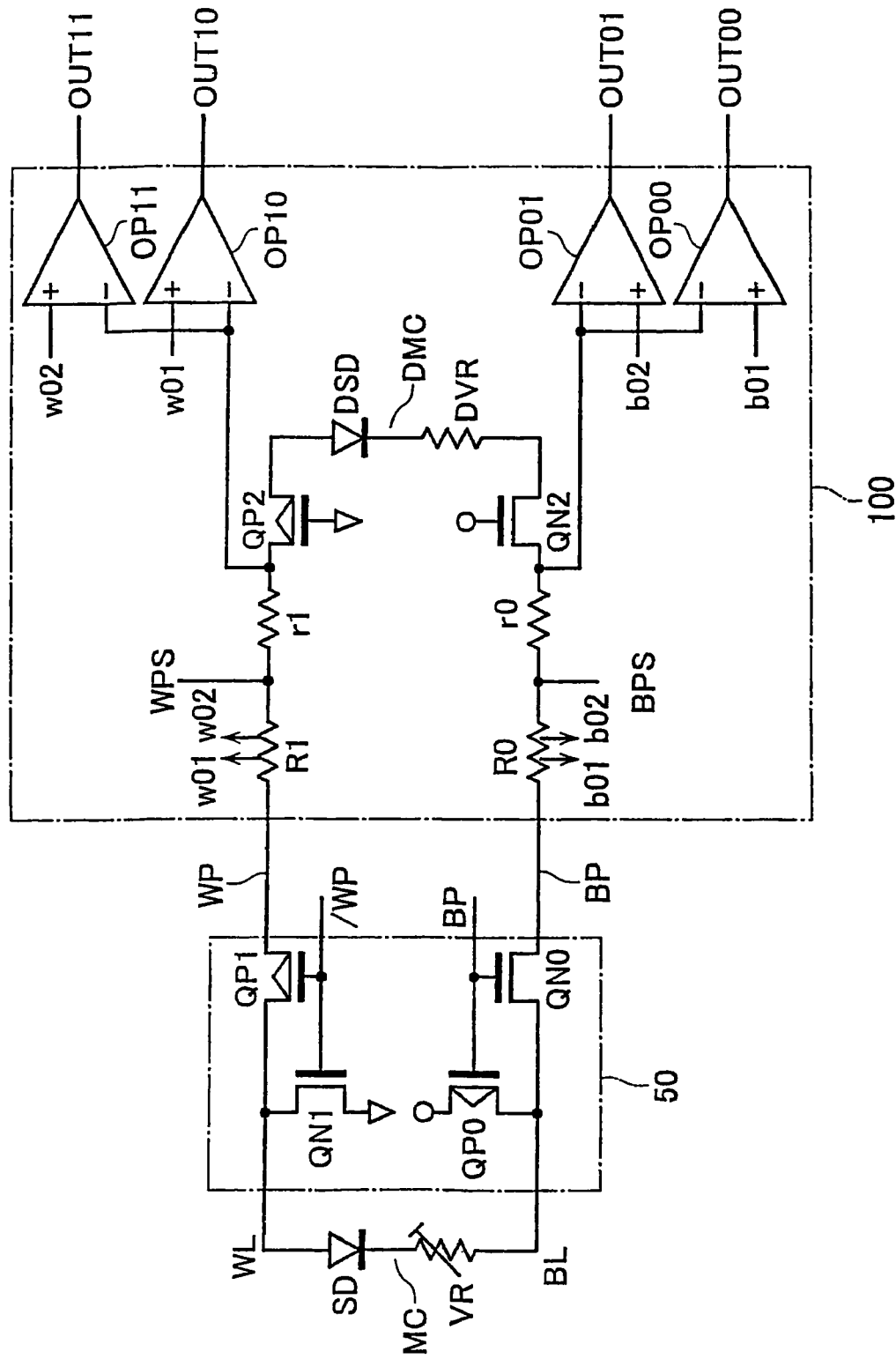
FIG. 45 is a diagram showing a sense amp circuit scheme preferable for degeneracy avoidance.

It is also permissible to modify it to offer the distinguishability between the one-cell current and two-cell current in a similar way in both the bit line BL and the word line WL. A configuration of such a sense amplifier circuit 100 is shown in FIG. 45, with respect to a unit cell array thereof. Using this as a basic or "core" sense amp circuit, the multivalue cells of stacked cell arrays may be designed to provide an arrangement capable of determining multivalue information by adequate combination of outputs in such a way that their truth value table becomes the simplest one.

An explanation will next be given of a data write circuit which writes or "programs" data into multivalue cells. An approach to permitting creation of a phase change between amorphous and polycrystalline states in a chalcogenide-based phase change layer (variable resistive element) is to control the amount of power being given to the cell by adjustment of a voltage pulse width. When a power is rapidly given to the chalcogenide with a short pulse width, and then it is left rapidly cooled off, the chalcogenide partly becomes amorphous state, and its resistance increases so that the cell becomes in the data "0" state. If a power is given to the chalcogenide with a long voltage pulse width for a long time period, and then it is left gradually cooled off, the chalcogenide becomes in its polycrystalline state, which results in a decrease in resistance and thus establishment of the data "1" state.

Figure 46:
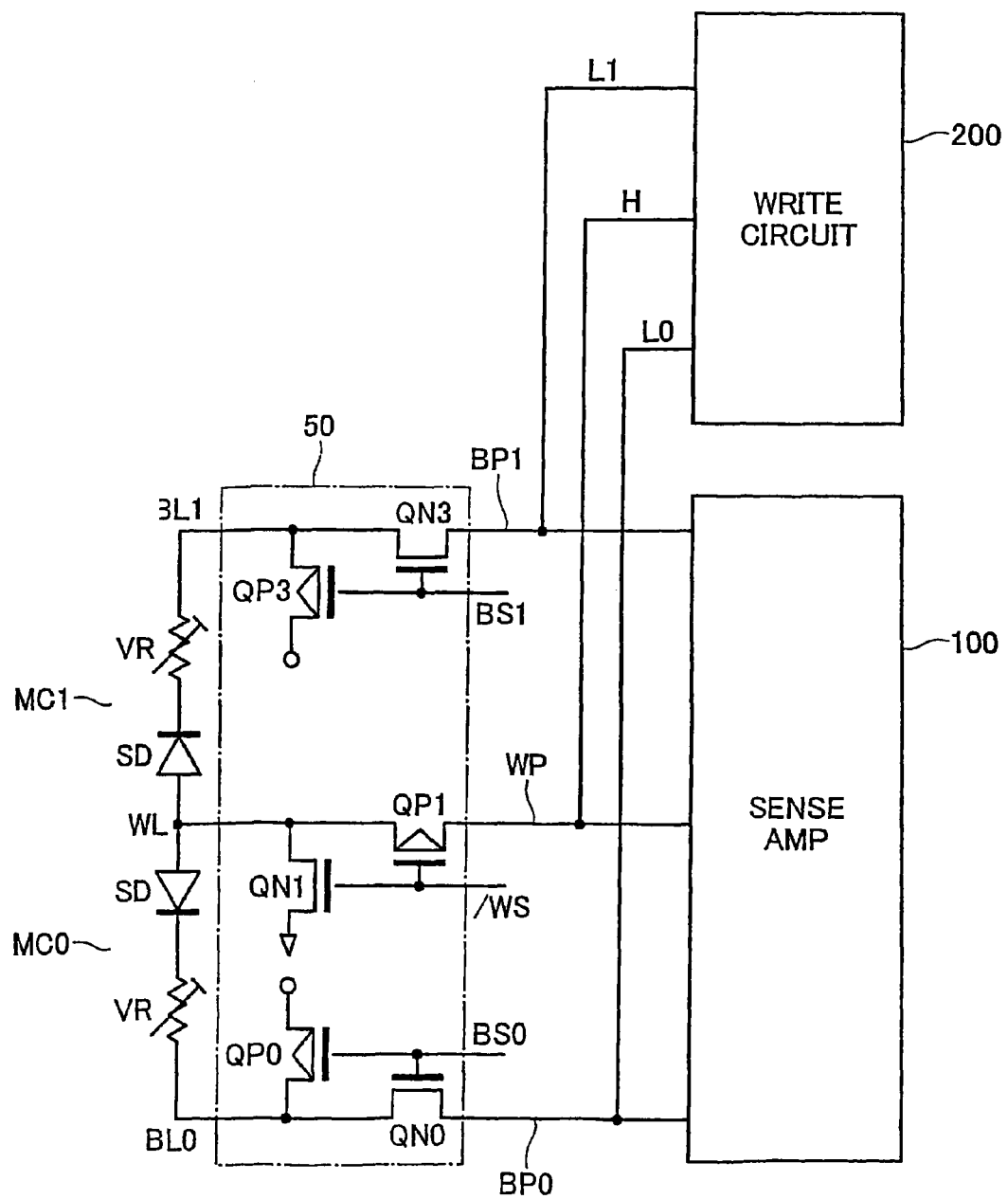
FIG. 46 is a diagram showing a pulse generation circuit in the case of 4-value storage by means of a two-layer stacked cell arrays.

Practically, FIG. 46 shows an arrangement in which a write circuit 200 is provided in parallel to its associative sense amplifier circuit 100, with respect to the case of 4-value storage at the upper and lower cell arrays MA0, MA1 which have been explained in conjunction with FIG. 27 and FIG. 31. During data writing, the sense amp circuit 100 is made inactive, and the write circuit 200 is activated. The write circuit 200 is the one that produces, in a way pursuant to multivalue data to be written, a positive logic write pulse H to be given to a word line WL through a signal line WP and negative logic write pulses L0, L1 being given to bit lines BL0, BL1 via signal lines BP0, BP1, respectively.

Figure 47:
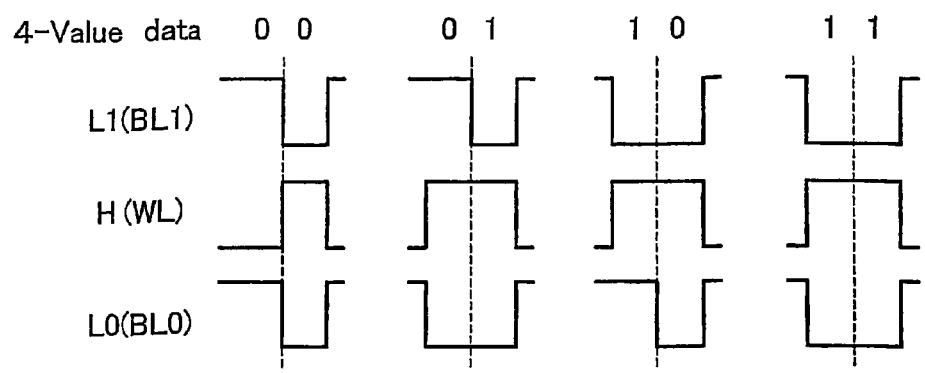
FIG. 47 is a diagram showing write pulses owing to the write pulse generation circuit.

A way of giving the write pulses to 4-value cells produced by this write circuit 200 is as follows: give the positive logic write pulse and the negative logic write pulses simultaneously to thereby ensure that the diode SD becomes forward-biased within a limited time period in which the pulses overlap together, resulting in power being applied to the variable resistive element VR of the chalcogenide. A practically implemented one is as shown in FIG. 47. In summary, let the negative logic write pulses L0, L1 which are given to a presently selected lower bit BL0 and selected upper bit line BL1 and the positive logic write pulse H that is given to a shared word line WL be set in a pulse width relationship such as shown in FIG. 47, in a way corresponding to the states of multivalue data to be written.

A multivalue data state "00" is indicated by a combination of a write value "0" of an upper cell (bitline BL1 side) and a write value "0" of a lower cell (bitline BL0 side). The write data state of each cell is set depending on a power applying time which is defined by an overlap of the positive logic write pulse H supplied to word line WL and the negative logic write pulses L0, L1 supplied to bit lines BL0, BL1. To write a logic "0" into a cell, use a short power application time, thereby setting the cell in its high resistance state; to write "1" into the cell, use a long power application time, thereby setting the cell in its low resistance state.

According to the pulse application of FIG. 47, in the case of writing data "00", the upper and lower cells both exhibit the short power application time so that these become in the high resistance state together. In the case of data state "01", the upper cell is with the short power application time whereas the lower cell is with the long power application time; thus, the upper cell becomes in the high resistance state with the lower cell in the low resistance state. In the case of data state "10", the upper cell is with the long power application time whereas the lower cell is with the short power application time; thus, the upper cell becomes in the low resistance state with the lower cell in the high resistance state. In the case of data state "11" write, both the upper cell and the lower cell become longer in power application time so that both of them become in the low resistance state.

Figure 48:
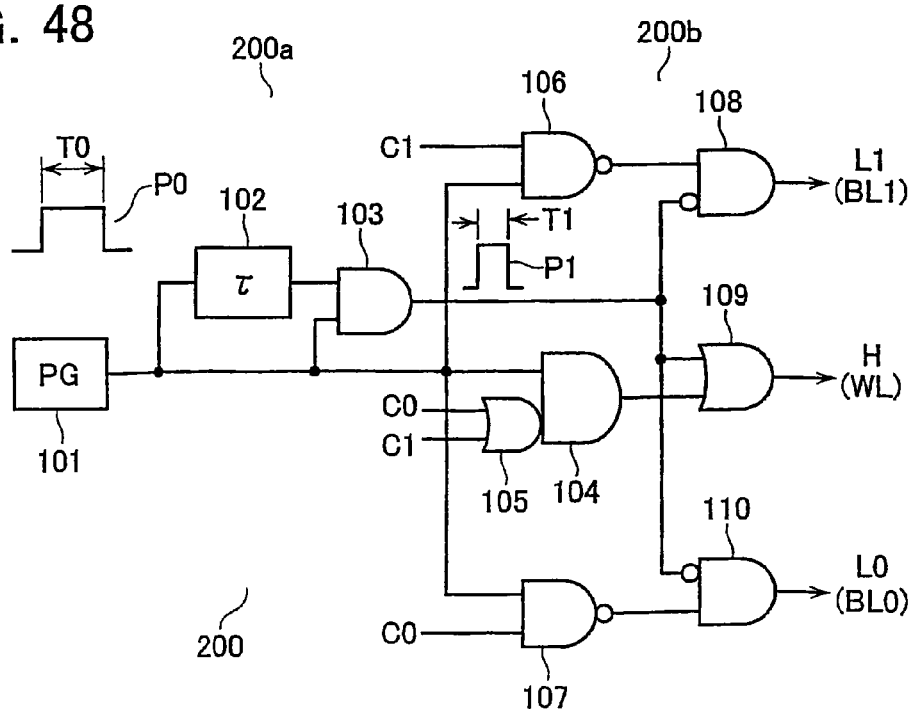
FIG. 48 is a diagram showing a practically implemented configuration of the write pulse generator circuit.

FIG. 48 shows a practically implemented configuration of a multivalue data write circuit 200 based on the combination of the long and short pulses stated above. The write circuit 200 has a pulse generation circuit 200a operable to generate pulses with two types of pulse widths, and a logic gate circuit 200b which generates the positive logic write pulse H and negative logic write pulses L0, L1 by combining the pulses obtainable from this pulse generator circuit 200a. An original pulse generation circuit 101 generates an original pulse (positive logic pulse) P0 with a pulse width T0. By inputting this pulse P0 and a pulse which is delayed by a delay circuit 102 to an AND gate 103, a positive pulse P1 with a pulse width T1 is generated, which is shorter by a degree equivalent to the delay of such delay circuit.

By selecting a proper overlap of these two pulses P0, P1 in accordance with the data to be written, let the negative logic write pulses L0, L1 and the positive logic write pulse H generate with the required pulse widths respectively. Here, C1, C0 are equivalent to the upper level bit and lower level bit of multivalue data described previously. Owing to the use of an OR gate 105 for digitally computing a logical sum of C1, C0 and an AND gate 104 for digital calculation of a logical product of its output and the pulse P0, the pulse P0 becomes the positive logic write pulse H when at least one of C0, C1 is at "1". When both of C1, C0 are "0", the AND gate 104 becomes off; thus, the pulse P1 becomes the pulse H through the OR gate 109. This positive logic write pulse is given to the word line WL.

Additionally, with the use of NAND gates 106, 107 to which C1, C0 and the pulse P0 are input respectively and also AND gates 108, 110 for providing a product of their outputs and an inverted signal of the pulse P1, negative logic write pulses with their pulse widths whose exact lengths are determined in accordance with "1", "0" of C1, C0 are to be given to the bit lines BL1, BL0.

Figure 49:
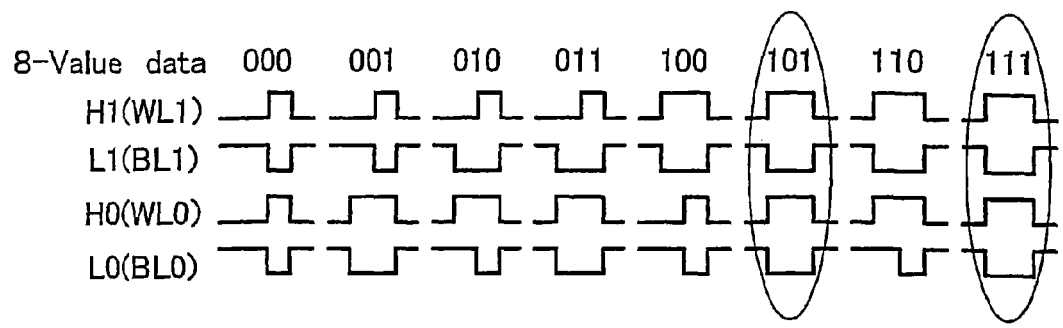
FIG. 49 is a diagram showing write pulses (with degeneracy) of 8-value data by means of three-layer stacked cell arrays.

Next, in regard to the case of 8-value storage using the 3-layer cell arrays MA0-MA1 shown in FIG. 34, the way of write pulse application based on a similar technique to that in the case of 4-value storage is shown in FIG. 49. The 8-value data "xxx" is indicated by possible combinations of the write value of a cell in the upper cell array MA2, the write value of a cell in the intermediate cell array MA1, and the write value of a cell in the lower cell array MA0. The waveforms of write pulses which are given to a word line WL1 at the uppermost part, a bit line BL1 shared by the cell arrays MA2, MA1, a word line WL0 shared by the cell arrays MA1, MA0 and a bit line BL0 of the lowermost layer are as shown in FIG. 49.

The write pulses of FIG. 49 may be created by providing an extended version of the write circuit 200 of FIG. 48 and by logically combining long/short pulses in a way similar to that stated supra. Unfortunately, the data states "101" and "111" are unavoidable to undergo degeneracy with unwanted equalization of the pulse widths as shown in FIG. 49. In order to write all the 8-value data items into a multivalue cell while setting every items in different states, the circuit of FIG. 48 is not simply employable.

Figure 50:
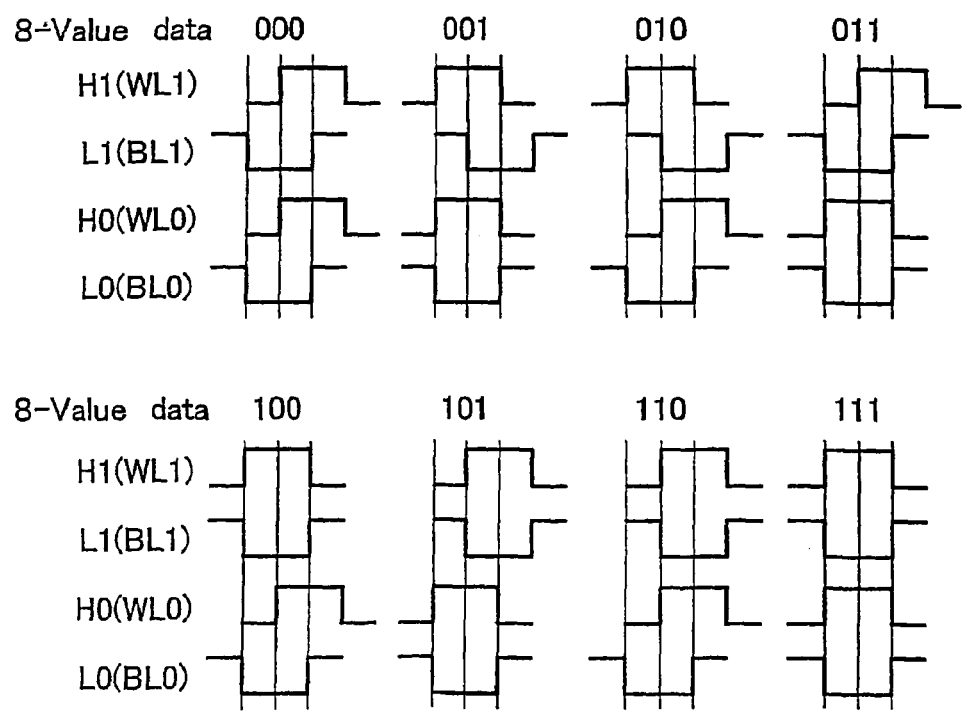
FIG. 50 is a diagram showing 8-value data write pulses (without degeneracy) by means of three-layer stacked cell arrays.

In contrast, FIG. 50 shows a write pulse generation scheme with the above-stated degeneracy avoided. This eliminates any possible degeneracy by a method having the steps of making, as the positive and negative logic pulses, two types of pulses which are the same in pulse width and yet different in time difference from each other, selectively combining them in a way corresponding to the data to be written, and controlling the power pulse that is effectively applied to a respective one of multivalue cells. Practically, make pulses each of which has a delay to the original pulse with a long pulse width, in which the delay has a pulse width almost half of the original pulse width; then, utilize a combination of these pulses. And, as shown in FIG. 50, with the negative logic write pulse L0 to be given to the lowermost layer bit line BL0 as a reference, let this pulse be delayed by the half pulse width or be exactly in phase with the reference pulse to thereby generate the positive and negative logic write pulses H1, H0 and L1 which are given to the word lines WL1, WL0 and bit line BL1, respectively.

Figure 51:
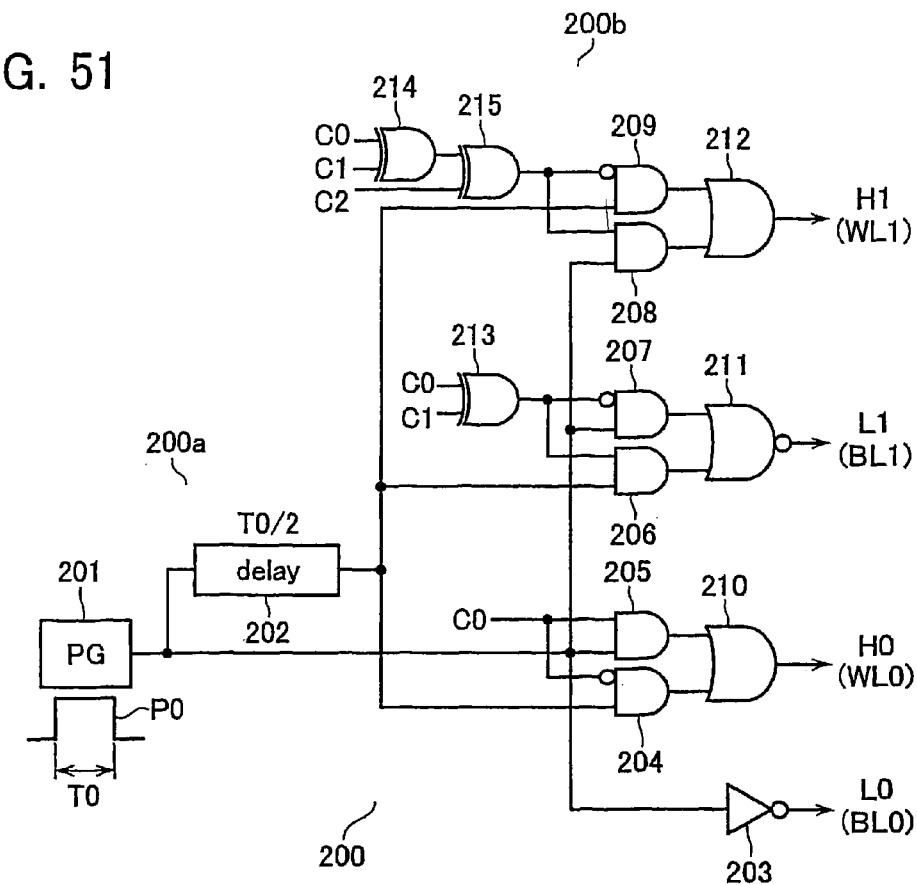
FIG. 51 is a diagram showing a configuration of a write circuit for generation of the write pulses of FIG. 50.

As shown in FIG. 50, all the 8-value data are properly represented as to have different pulse-overlap states from each other. FIG. 51 is a configuration of a write circuit 200 which produces such write pulses. This write circuit 200 is configured from a pulse generator circuit 200a which generates two types of pulses that are the same in pulse width and different in delay amount from each other, and a logic gate circuit 200b which generates any required write pulses by combination of such two types of pulses.

An original pulse generator circuit 201 is the one that generates a pulse P0 with its pulse width. T0, and a delay circuit 202 is a circuit which delays this pulse P0 by about T0/2. Here, time T0 is a time that the chalcogenide is possibly in its polycrystalline state when such time pulse is applied thereto, and T0/2 is chosen at about a specific length which causes it to be in its amorphous state.

A negative logic pulse which is an inverted version of the output pulse P0 of the original pulse generator circuit 201 by an inverter 203 becomes the reference pulse to be given to the bit line BL0. In the following, the relationship of the pulses being given to the word line WL0, bit line BL1 and word line WL1 with respect to the pulse of the bit line BL0 is realized by execution of logical processing with C2, C1, C0 indicative of 8-value write states (C2, C1, C0). A set of AND gates 204, 205 is the one that selects whether an output pulse of the pulse generator circuit 201 or a delayed pulse by the delay circuit 202 in accordance with "1", "0" of C0. Outputs of these AND gates 204, 205 are taken out through an OR gate 210 to become a positive logic write pulse H0 to be supplied to the word line WL0.

Similarly, a set of AND gates 207, 206 is the one that selects whether the output pulse of the pulse generator circuit 201 or the delayed pulse by the delay circuit 202 in accordance with the logic of C0, C1 by means of an EXOR gate 213. Whereby, the negative logic write pulse L1 which is to be given to the bit line BL1 is obtained via a NOR gate 211. A set of AND gates 208, 209 is the one that selects whether the output pulse of pulse generator circuit 201 or the delayed pulse by delay circuit 202 in accordance with the logic of C0, C1, C2 by means of EXOR gates 214, 215, wherein outputs of them are passed through an OR gate 212 to thereby obtain a positive logic write pulse H1 being given to the word line WL1.

Figure 52:
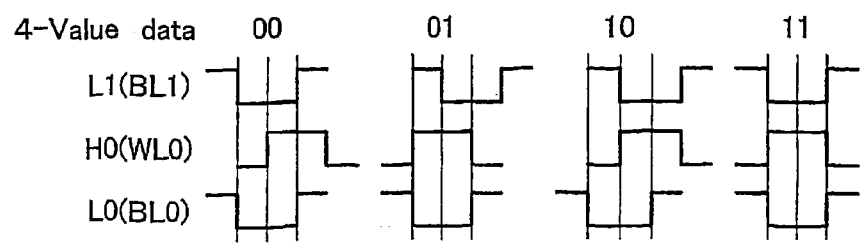
FIG. 52 is a diagram showing write pulses in the case of applying the write pulse scheme of FIG. 50 to 4-value data writing.

As apparent from the foregoing, the method for delaying the write pulses depending upon the write data states is also applicable to the case of 4-value storage stated previously. In other words, the pulse waveforms of FIG. 52 are usable in lieu of the pulse waveforms of FIG. 47. It can be seen that while the negative logic write pulses L0, L1 to be supplied to the bit lines BL and the positive logic write pulse H being supplied to the word line are the same in pulse width, adjusting their overlaps in accordance with 4-value data results in application of write pulses to cells, which pulses have a similar pulse width relationship to that of FIG. 47.

Figure 53:
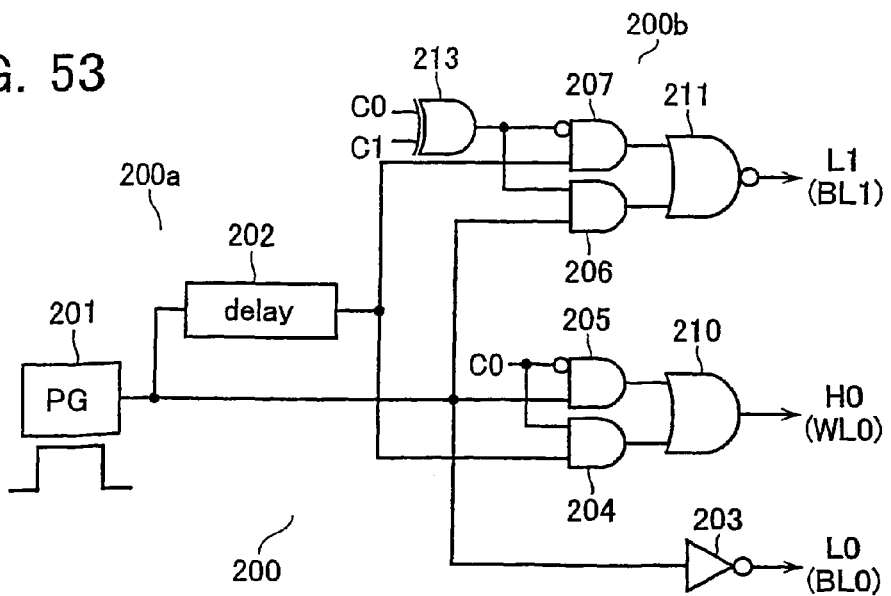
FIG. 53 is a diagram showing a configuration of a write circuit for generation of the write pulses of FIG. 52.

FIG. 53 shows a write circuit 200 which realizes the write pulses of FIG. 52. This is the same in configuration as the write pulse generator unit which is used in the write circuit 200 in FIG. 51 and is operatively associated with the bit line BL0, word line WL0 and bit line BL1.

Figure 54:
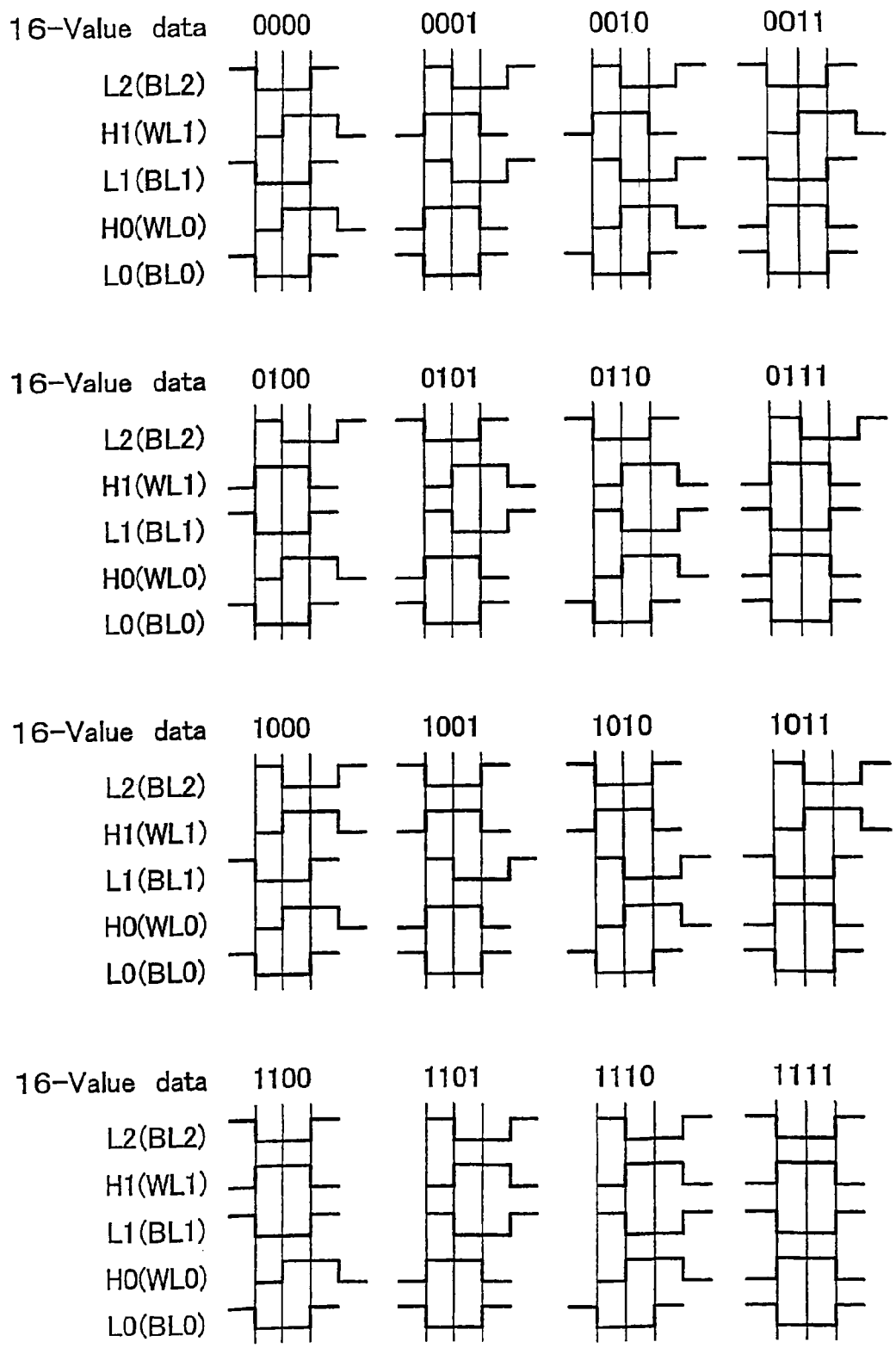
FIG. 54 is a diagram showing 16-value data write pulses by means of four-layer stacked cell arrays.

Further, based on the similar principles, FIG. 54 shows write pulse waveforms in the case of 16-value storage by use of the 4-layer cell arrays shown in FIG. 40. The write data states of 16 values are indicated by the write value of a cell in the fourth cell array MA3, the write value of a cell in the third cell array MA2, the write value of a cell in the second cell array MA1, and the write value of a cell in the first cell array MA0. In this case also, the negative pulse with respect to the lowermost layer bit line BL0 becomes a reference. The pulses of word lines WL0, WL1 and bit lines BL1, BL2 are capable of representing all the 16 values by generating in combination of the original pulse and its delayed pulse.

Figure 55:
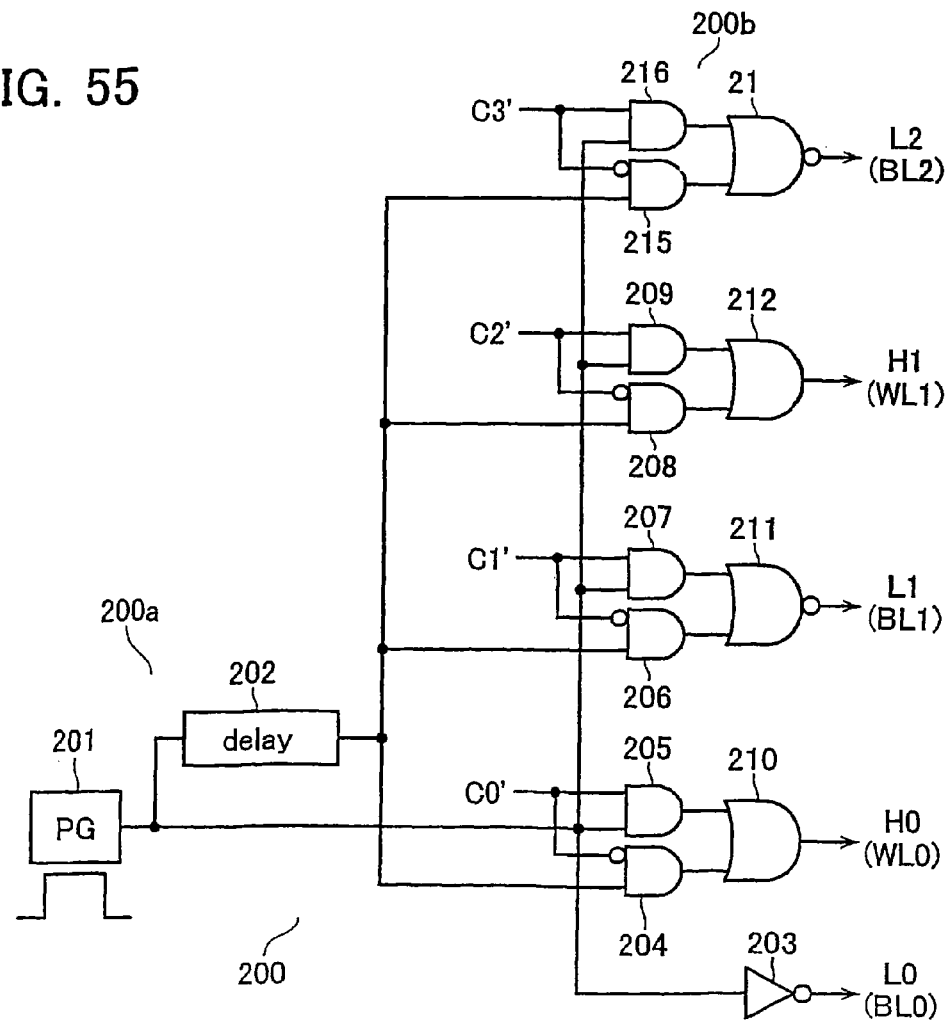
FIG. 55 is a diagram showing a configuration of a write circuit for generation of the write pulses of FIG. 54.

FIG. 55 shows a write circuit 200 for generation of write pulses such as those of FIG. 54. Its main part configuration is similar to that of FIG. 51; in addition thereto, AND gates 215, 216 and a NOR gate 217 are provided as a pulse generation unit relative to a bit line BL2. In accordance with the bit data C0, C1, C2, C3 of 16-value data to be written, that are input to each AND gate set (204, 205), (206, 207), (208, 209) and (215, 216), make adequate logic output signals C0', C1', C2', C3'; thus, it is possible to obtain the write pulses of FIG. 54.

As described above, in the memory cells for storing therein the chalcogenide's crystalline state and amorphous state as data, it is possible to perform data read and write operations based on the level of a current flowing between a word line and a bit line, and also possible to perform any intended read and/or write by controlling the level of a voltage between word and bit lines. In the embodiments stated supra, the current detection scheme was used for data reading. In addition, for data writing in the case of performing multivalue storage by use of a plurality of cell arrays, such the technique was employed that performs "0", "1" write based on the write pulse application time of each cell which stores multivalue data therein. By setting a cell in its molten state by pulse application of a short time and thereafter cooling it off, the cell becomes data "0" of the high resistance state. In other words, if the pulse application time is short, then the cool-off after melting is fast resulting in establishment of an amorphous high-resistance state. When performing pulse application for a longer time, the cell becomes data "1" in a polycrystalline low-resistance state.

Figure 56:
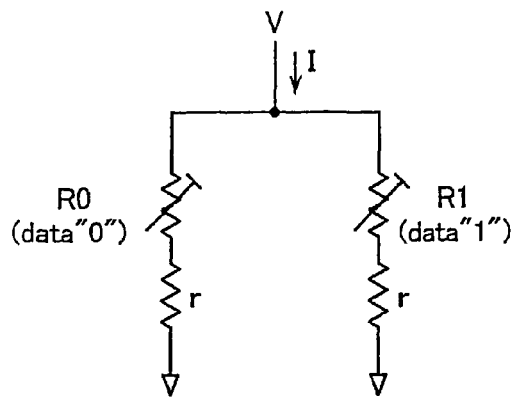
FIG. 56 is a diagram for explanation of a relationship of a write/read scheme of phase-change memory cells versus power consumption due to data.

However, with the above-described write principles, the resistance values that are different in order of magnitude or "digit" from one another are used; for this reason, a significant difference can take place in voltage—or current, thus energy—being applied to a cell during writing in a way depending on whether the data of the cell prior to writing is "0" or "1" This will be explained by use of FIG. 56. As shown in FIG. 56, assume that a voltage V is given in parallel to a cell of data "0" (denoted by resistor R0) and a cell of data "1" (resistor R1) through load resistors r, respectively. The resistance R0 is sufficiently larger in resistance than the resistance R1. Letting a resistance ratio of them be m=R0/R1, suppose that the load resistance is r=b·R1.

At this time, an all-cell current I is represented by Equation (1) which follows:

$$I = \{1/(b+m) + 1/(b+1)\}V/R1 \quad (1)$$

Power consumptions P0, P1 of the resistors R0, R1 are given by the following Equations (2), (3), respectively:

$$P0 = \{m/(b+m)^2\}V^2/R1 \quad (2)$$

$$P1 = \{1/(b+1)^2\}V^2/R1 \quad (3)$$

By taking account of the above points, a careful consideration is required to write pulse designs in order to realize the so-called overwrite, which writes any desired data without depending upon the initial state of a cell. More specifically, in order to set the cell in its high resistance state, heat at least part of the chalcogenide of such cell up to its molten state or thereabound, irrespective of whether the cell's original data is "0" or "1"; thereafter, rapidly cool it down. To do this, it is preferable to give a large power at a heat at the beginning of a short pulse application time period. In the case of setting the cell in its low resistance state, a relatively long pulse application time is used, and maintain it in a high temperature state without bring the cell in the molten state. With such procedure, it is possible to permit polycrystallization of the cell which has been in its amorphous state.

Figure 57:
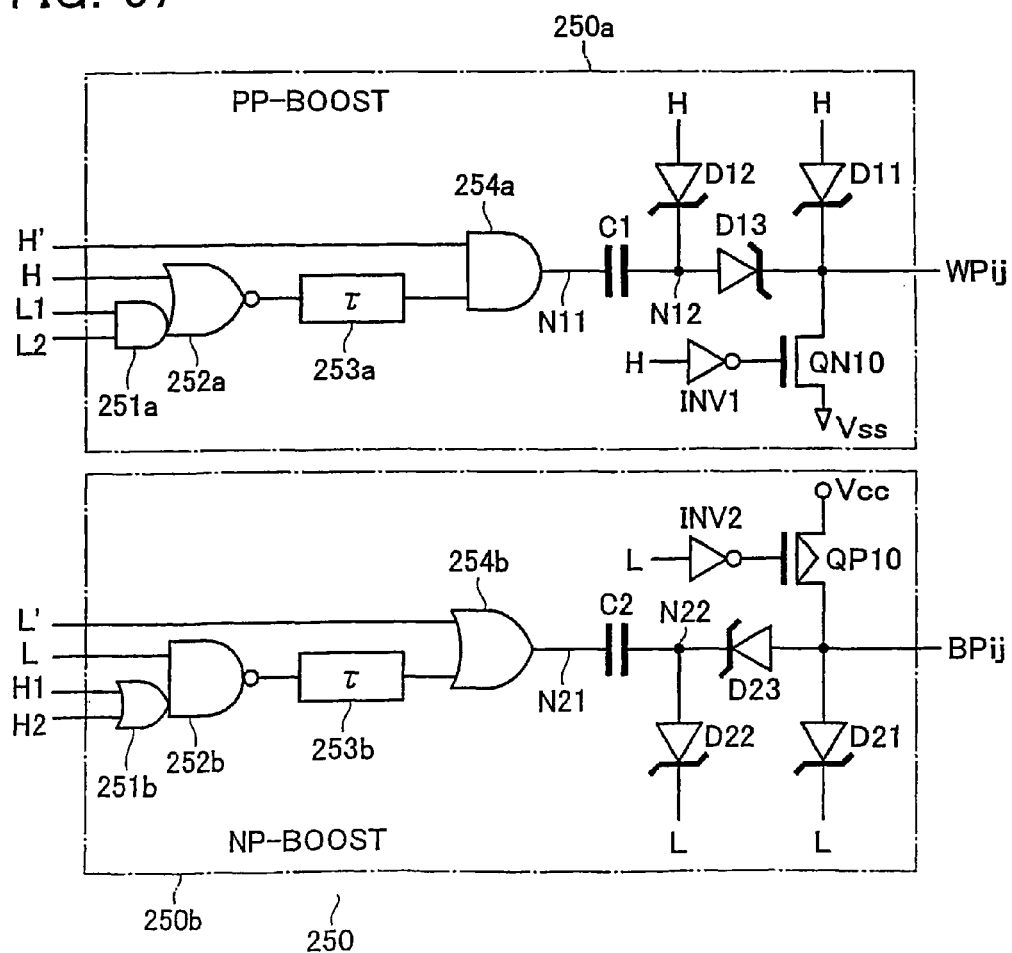
FIG. 57 is a diagram showing a configuration of a pulse voltage booster circuit for selectively voltage-raising or "boosting" write pulses.

FIG. 57 shows a write pulse voltage raising or "boosting" circuit 250 which is preferable for realization of the above-described data writing. Here, there is shown a pair of positive pulse booster (PP-BOOST) circuit 250a and negative pulse booster (NP-BOOST) circuit 250b, which circuits are selectively boost the positive and negative write pulses H, L which are output from the write circuit 200 for multivalue storage as has been explained in the previous embodiment(s) under certain conditions, respectively. The positive logic write pulse H and negative logic write pulse L are selectively increased in potential by these booster circuits 250a, 250b and then supplied through signal lines WPij, BPij to presently selected word line WL and bit line BL, respectively.

Negative logic pulses L1, L2 which are input to the positive pulse booster circuit 250a together with the positive logic pulse H are shown as those which are supplied to bit lines of the upper and lower cell arrays which share a word line to which the positive logic pulse H is supplied. Similarly, positive logic pulses H1, H2 which are input to the negative pulse booster circuit 250b along with the negative logic pulse L are shown as the ones that are supplied to word lines of the upper and lower cell arrays sharing the bit line to which the negative pulse L is given.

The positive and negative pulse booster circuits 250a, 250b each have capacitors C1, C2 which are used for potentially boosting the signal lines WPij, BPij through a charge-pump operation. Reset-use NMOS transistors QN10 and PMOS transistor QP10 are provided at the respective nodes N12, N22 of the capacitors C1, C2 on the signal line WPij, BPij sides thereof, which transistors are for holding them at Vss and Vcc respectively in the non-select state. These reset transistors QN10, QP10 are such that upon generation of the positive logic write pulse H and negative logic write pulse L, they are driven by these pulses respectively to thereby turn off. Diodes D12, D22 are connected to the nodes N12, N22, for charging the capacitors C1, C2 up to a level of the positive logic pulse H (for example Vcc), a level of the negative logic pulse L (for example Vss), respectively. The nodes N12, N22 are connected to the select lines WPij, BPij through diodes D13, D23 for use as transfer elements, respectively. Connected to these select lines WPij, BPij are diodes D11, D21 which are used to give thereto the positive logic write pulse H and the negative logic write pulse L when selected. In the nonselect state, the nodes N11, N21 of the other of the capacitors C1, C2 are arranged to stay at Vss and Vcc in response to receipt of outputs of an AND gate 254a and an OR gate 254b, respectively.

In the positive pulse booster circuit 250a, a pulse H' that is delayed with a certain time from the positive logic pulse H enters one input terminal of the AND gate 254a; regarding the other input terminal, an overlap state of the positive logic pulse H and negative logic pulses L1, L2 is detected by an AND gate 251a and a NOR gate 252a; then, its result is input via a delay circuit 253a. In the negative pulse booster circuit 250b, a pulse L' that is delayed with a certain time from the negative logic pulse L enters one input terminal of the OR gate 254b; as for the other input terminal, an overlap state of the negative logic pulse L and positive logic pulses H1, H2 is detected by an OR gate 251b and a NAND gate 252b; then, its result is input via a delay circuit 253b. Let the delay time of the delay circuit 253a, 253b be almost the same as the width T of each write pulse.

An operation of the pulse booster circuit 250 thus arranged will be explained using FIG. 58. In the nonselect state in which none of the positive and negative write pulses are generated, in the positive pulse booster circuit 250a, the output of the AND gate 254a is at Vss. When the positive logic pulse H is generated, the node N12 of the capacitor C1 is charged by the diode D12 up to Vcc. Similarly in the nonselect state, in the negative pulse booster circuit 250b, the output of the OR gate 254b is at Vcc. When the negative logic pulse L is generated, the node N22 of the capacitor C2 is charged by the diode D22 at Vss.

Figure 58:
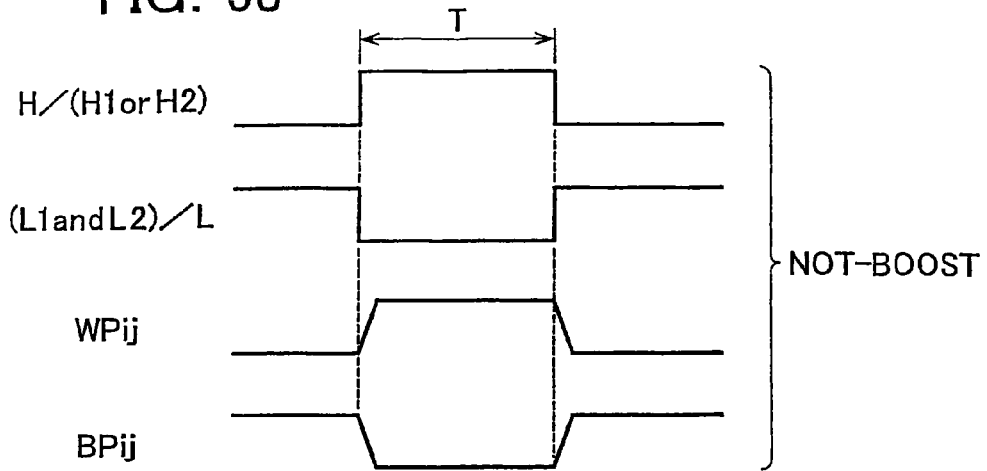
FIG. 58 is a waveform diagram for explanation of a boost operation of the pulse booster circuit.
Figure 58:
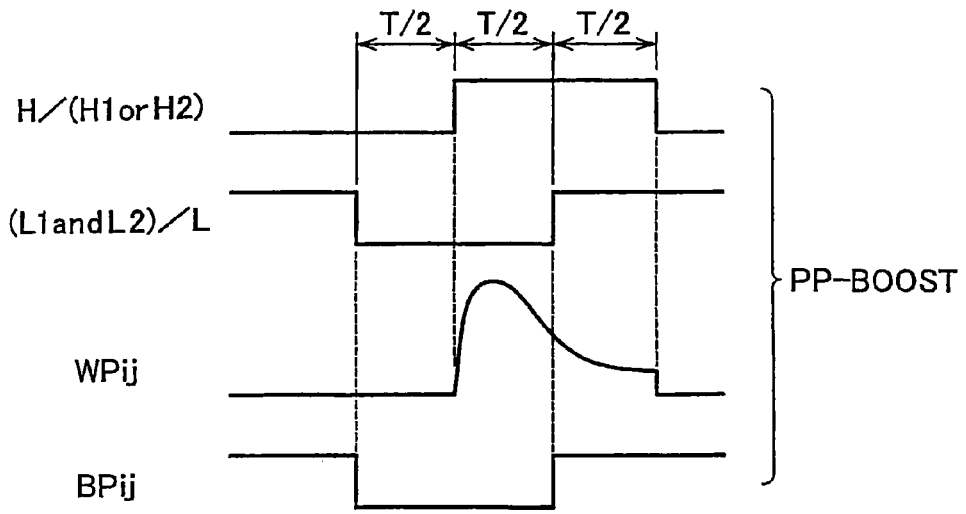
Figure 58:
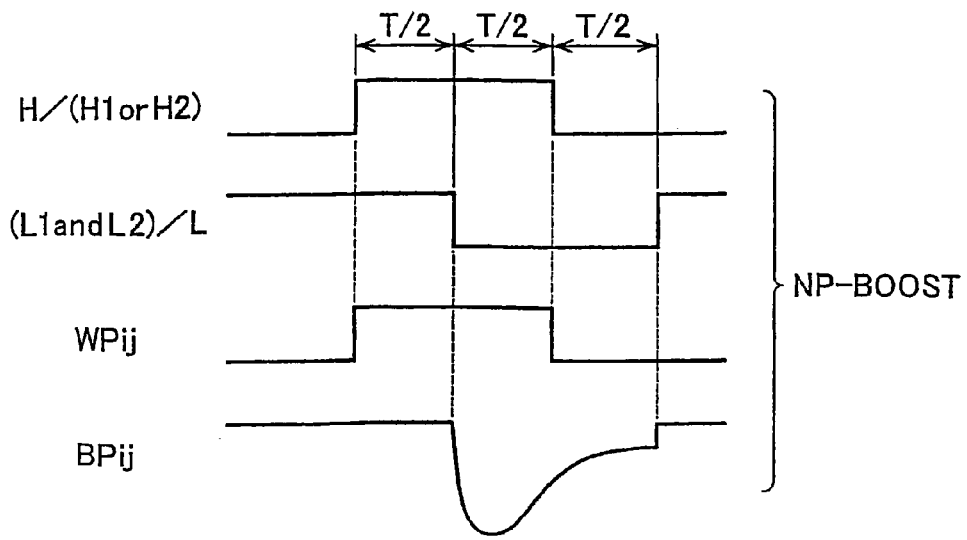

As shown in FIG. 58, in such a case that the positive logic write pulse H with its pulse width T and the negative logic write pulses L1, L2 with the same pulse width T are generated simultaneously, in the positive pulse booster circuit 250a, the output of AND gate 254a holds the low level Vss so that the charge of capacitor C1 is not discharged in any way. And, the positive logic write pulse H is simply given directly to the signal line WPij through the diode D11. In such a case that the negative logic write pulse L with the pulse width T and either one of the positive logic write pulses H1, H2 with the same pulse width T are generated simultaneously, in the negative pulse booster circuit 250b, the output of OR gate 254b holds the high level Vcc so that any charge is hardly discharged, resulting in the negative logic write pulse L being supplied directly to the signal line BPij via the diode D21. In brief, in these cases, the charge pump portion of any one of the pulse booster circuits 250a, 250b is made inactive, and thus no pulse boost operations are available.

Next, in such a case that the positive logic write pulse H is generated so that it is delayed relative to the negative logic write pulses L1 and L2 by the half T/2 of the pulse width thereof, a positive-direction boost operation of the positive logic write pulse H at the positive pulse booster circuit 250a is performed. More specifically, in the positive pulse booster circuit 250a at this time, two inputs of the AND gate 254a become at the high level Vcc simultaneously for a time period as determined by the delay circuit 253a after the positive logic pulse H has become at its high level. Upon receipt of this, the output of AND gate 254a becomes "H"—that is, the potential level of the node N11 of capacitor C1 becomes Vcc; therefore, the node N12 is potentially boosted to greater than Vcc, causing this to be transferred through the diode D13 to the signal line WPij. In summary, the positive logic write pulse H to be given via the diode D11 is potentially raised by the pumping action of the capacitor C1 and is then given to the signal line WPij. If the relationship between the positive logic write pulse H1 or H2 and the negative logic write pulse L is similar, then there is no such boost operation in the negative pulse booster circuit 250b.

Next, in such a case that the negative logic write pulse L is generated so that this pulse is delayed to the positive logic write pulses H1, H2 by the half T/2 of the pulse width thereof, a negative-direction boost operation of the negative logic write pulse L at the negative pulse booster circuit 250b is performed. More specifically at this time, in the negative pulse booster circuit 250b, two inputs of the OR gate 254b become at the low level Vss simultaneously for a time period as determined by the delay circuit 253b after the negative logic pulse L becomes at its low level. Whereby, the node N22 of the capacitor C2 potentially drops down to less than Vss, causing this to be sent toward the signal line BPij via the diode D23. In short, the negative logic write pulse L that is given via the diode D21 is boosted in the negative direction by the capacitor C2's pumping action and is then given to the signal line BPij. If the relationship between the positive logic write pulse H and the negative logic write pulses L1 and L2 is similar, then such boost operation is unavailable in the positive pulse booster circuit 250a.

The pulse width T of the positive and negative logic write pulses H, L shown in FIG. 58 is the pulse application time required for "1" data writing. As described above, a boosted positive or negative pulse with its pulse width almost equal to T/2, which is obtained by control of an overlap state of the pulses H or L, is given to a word line or a bit line required for "0" data write. Therefore, using the pulse booster circuit 250 of FIG. 57 makes it possible to boost, through pumping operations, either the high level or the low level of the short pulse application time required for "0" data write. Thus, assembling such the pulse boost circuit 250 into the write circuit makes it possible to reliably perform "0" data write without depending upon the original data state.

Although practical examples of the write circuit equipped with the pulse booster circuit stated above will be explained in such a manner that an example which is applied to multivalue storage utilizing three-dimensional (3D) multilayer cell arrays comes first, it would be readily appreciated that the pulse boost circuit should not be limited in application to such multivalue storage and may also be applied to the case of performing two-value or binary data storage by means of a two-dimensional (2D) cell array.

While the 3D multilayer cell arrays as has been explained in the previous embodiments enable achievement of a large capacity of memory, it is preferable that certain consideration is taken to the data processing architecture in connection with 3D cell accessing techniques. As an example thereof, an embodiment which makes up 3D cell blocks preferable for data searches will next be explained below.

Figure 59:
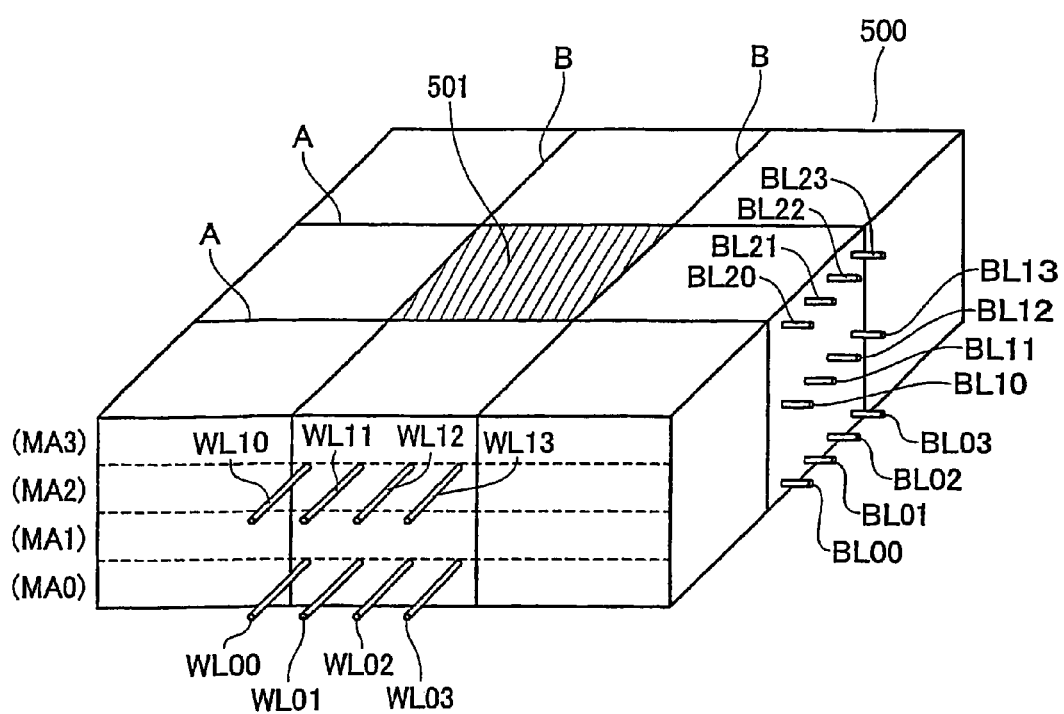
FIG. 59 is a diagram showing a cell block structure for data search facilitation of four-layered cell arrays.

FIG. 59 shows a configuration scheme of cell blocks each for use as a unit of data access, with respect to a three-dimensional (3D) cell array 500 which consists essentially of the four layers of MA0-MA3 shown in FIG. 40. In FIG. 59, the 3D cell array 500 is shown as a rectangular solid body, wherein this cell array block 500 is such that a plurality of cell blocks 501 are partitioned by virtual boundary lines A, B which extend vertically to the upper surface of it and cross or intersect each other at right angles. Here, an example is shown in which a single cell block 501 is defined as a rectangular structure which includes sixteen bit lines within a range as interposed by equally spaced virtual boundaries A extending in parallel to bit lines BL and also includes eight word lines in a range interposed by equal-spaced virtual boundaries B parallel to the word lines. Accordingly, the cell block 501 becomes a 3D assembly of 4×4×4=64 cells.

In FIG. 59, the bit lines BL and word lines WL are shown merely relative to one cell block 501 which is indicated by oblique lines. BL00 to BL03 are the bit lines of a first layer cell array MA0; BL10-BL13 are shared bit lines of a second layer cell array MA1 and a third layer cell array MA2; and, BL20-BL23 are the bit lines of a fourth layer cell array MA3. In addition, WL00 to WL03 are shared word lines of the first layer cell array MA0 and the second layer cell array MA1; WL10-WL13 are shared word lines of the third layer cell array MA2 and the fourth layer cell array MA3.

Figure 60:
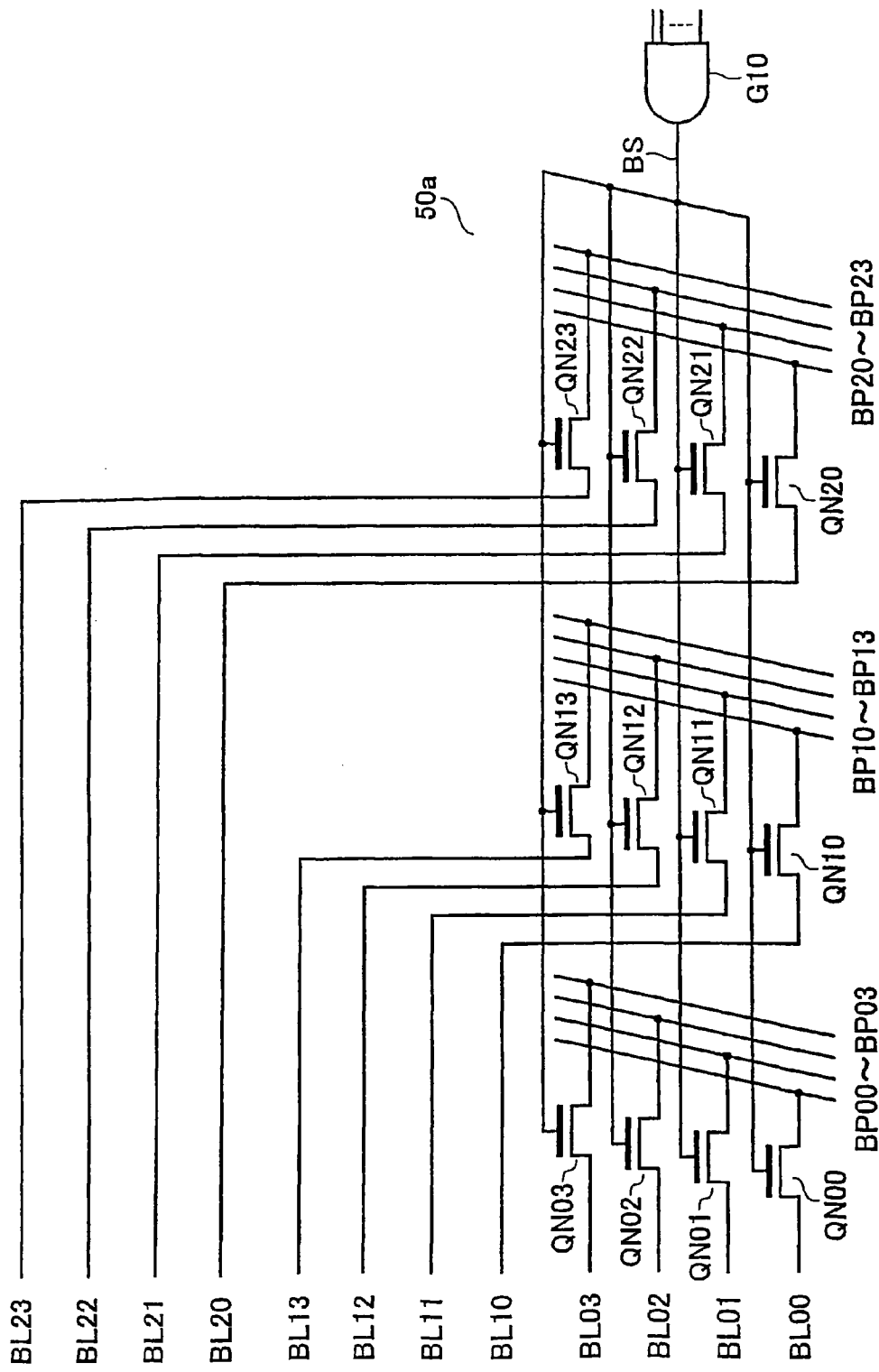
FIG. 60 is a diagram showing a configuration of a bit line selector circuit of a cell block.
Figure 61:
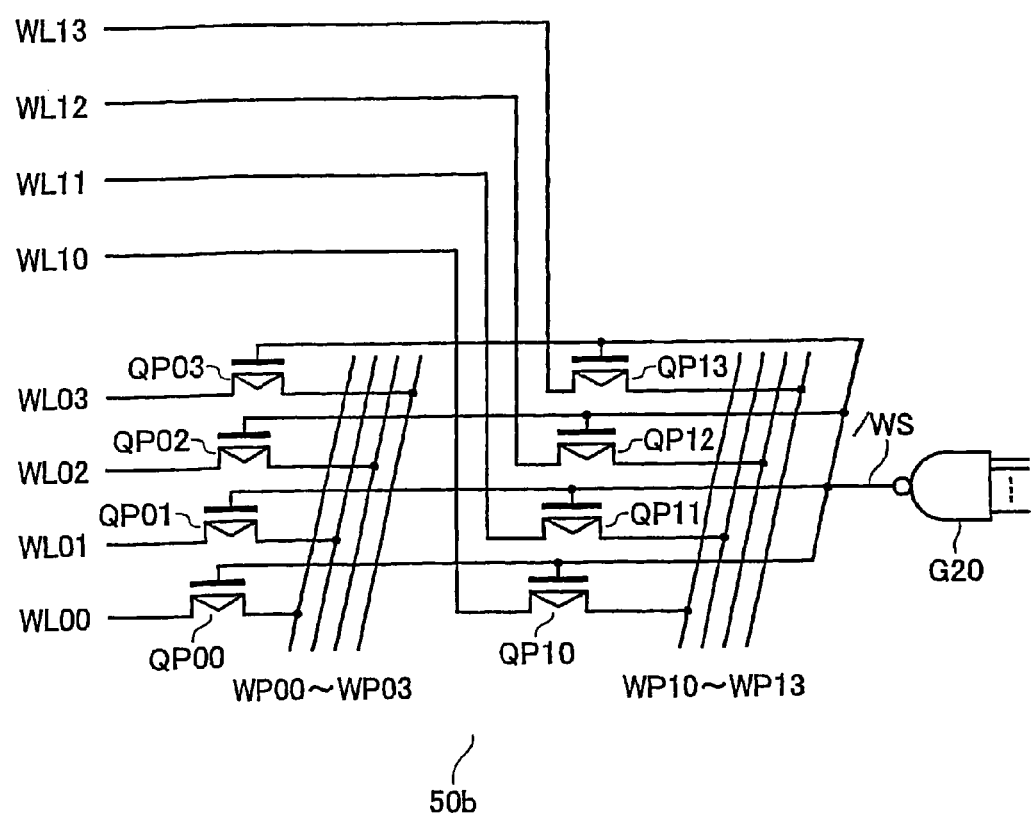
FIG. 61 is a diagram showing a configuration of a word line selector circuit of the cell block.

FIGS. 60 and 61 show configurations of a bit line selecting circuit 50a and a word line selecting circuit 50b of the cell block 501 thus defined in this way, respectively. The bitline selector circuit 50a has NMOS transistors QN00-QN03 for connecting the bit lines BL00-BL03 to select lines BP00-BP03 respectively, NMOS transistors QN10-QN13 for connecting the bit lines BL10-BL13 to select lines BP10-BP13 respectively, and NMOS transistors QN20-QN23 for connecting the bit lines BL20-BL23 to select lines BP20-BP23 respectively. The gates of these NMOS transistors are commonly driven together by a select signal BS. The select signal BS is activated by an AND gate G10 to become "H". Whereby, it is possible to supply the required negative logic write pulse to each bit line BLij through a select line BPij and via its associative on-state NMOS transistor QNij in its own way.

The word-line selector circuit 50b has PMOS transistors QP00-QP03 for connecting the word lines WL00-WL03 to select lines WP00-WP03 respectively and PMOS transistors QP10-QP13 for connecting the word lines WL10-WL13 to select lines WP10-WP13 respectively. The gates of these PMOS transistors are commonly driven together by a select signal /WS. The select signal /WS is activated by a NAND gate G20 to become "L". Thus it is possible to supply the necessary positive logic write pulse to each word line WLij through a select line WPij and via its associative turned-on PMOS transistor QPij in its own way.

The select line BPij of FIG. 60 is provided and disposed in common for a plurality of cell blocks in a direction perpendicular to the bit lines. The select line WPij of FIG. 61 is provided in common for a plurality of cell blocks in an orthogonal direction to the word lines. Accordingly, it is possible to perform scanning of the bit lines and/or word lines within the cell block, by selecting any desired cell block with the AND gate G10 of FIG. 60 and the NAND gate of FIG. 61 as a block decode circuit and by using the negative logic write pulse and positive logic write pulse which are given to the select lines BPij, WPij, respectively.

Although omitted in the selector circuits 50a, 50b of FIGS. 60 and 61, reset transistors are provided for holding each bit line and word line at the high level Vcc and low level Vss in the nonselect state, respectively, as shown in FIG. 29 as an example.

Figure 62:
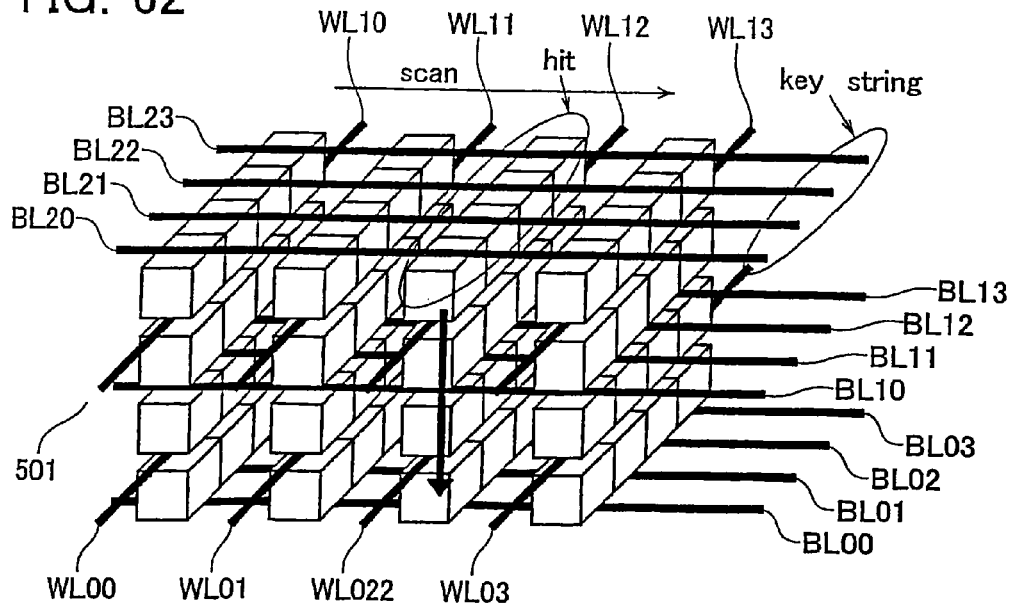
FIG. 62 is a diagram for explanation of a first data search mode of a cell block.
Figure 63:
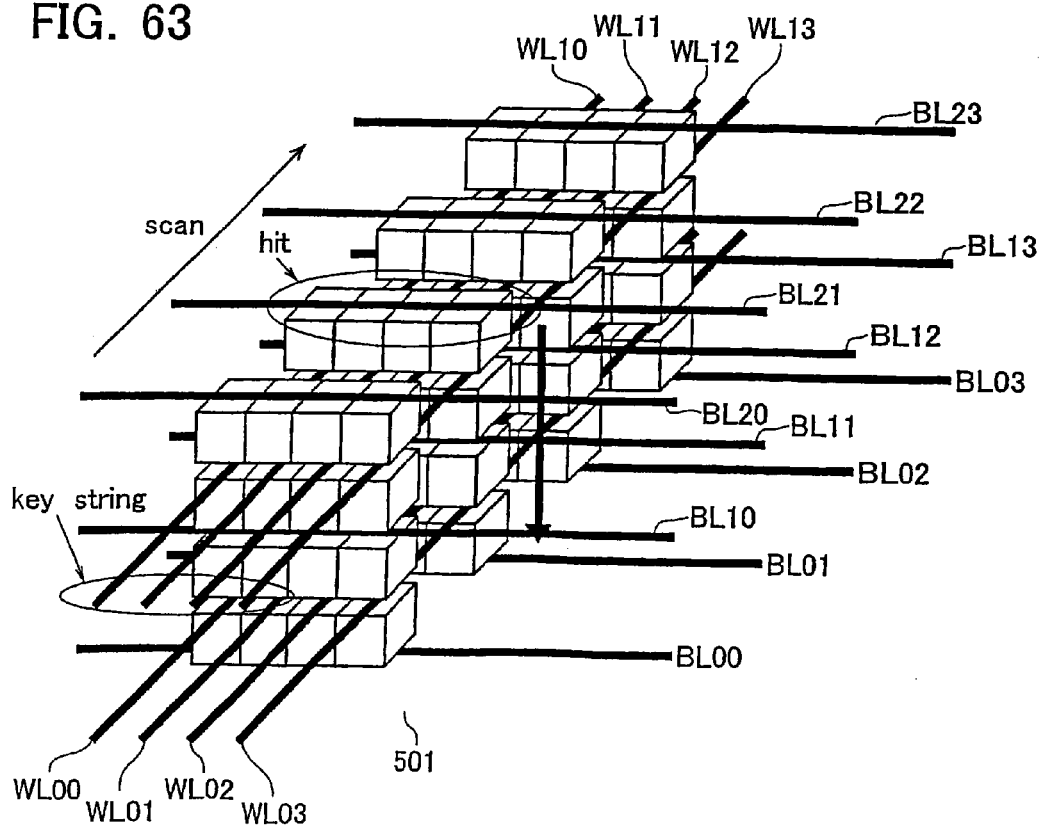
FIG. 63 is a diagram for explanation of a second data search mode of the cell block.
Figure 64:
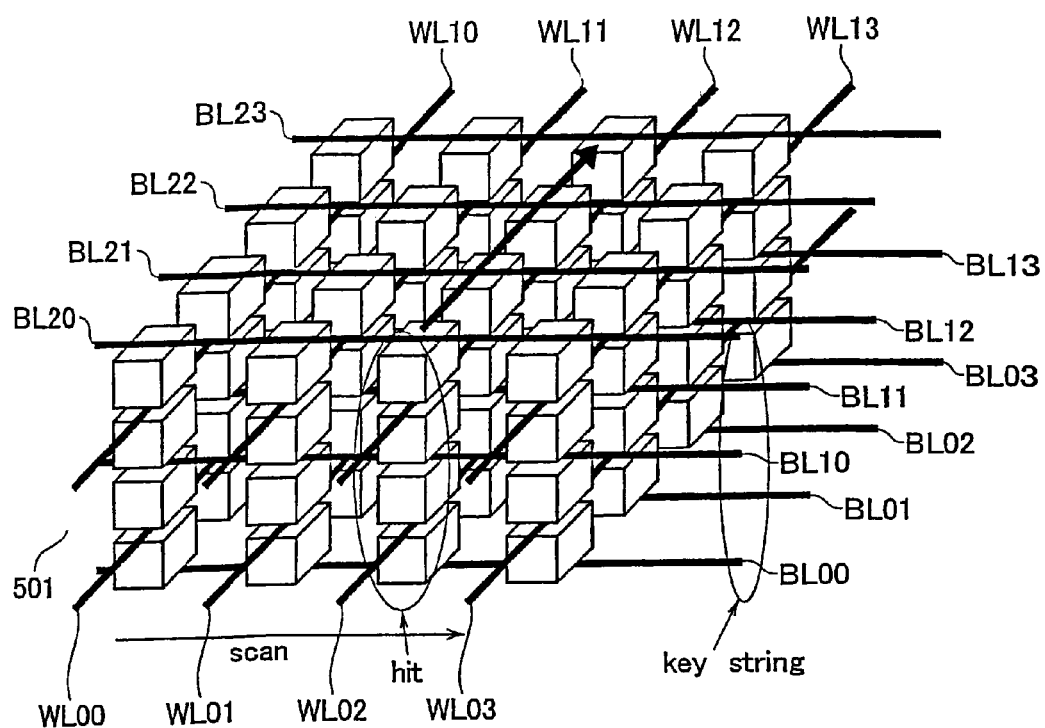
FIG. 64 is a diagram for explanation of a third data search mode of the cell block.

Practically, as the form of data processing utilizing this cell block configuration, three modes for performing a cell block data search are shown in FIGS. 62-64.

FIG. 62 shows a first data search mode. In this mode, 4 bits of multivalue information which are obtainable by simultaneous selection of one of the word lines WL10-WL13 of the uppermost layer of a cell block along with four bit lines BL20-BL23 of the uppermost layer is handled as key string information, that is, identifier information as preset for a content search. While holding these four bit lines BL20-BL23 in the select state, sequentially set the uppermost layer word lines WL10-WL13 in the select state, whereby it is possible to conduct a search of content reference data by scanning the key string. Once the key string information is coincided (hit) with the preset data, data may be read out in accordance with the data structure within the cell block.

In FIG. 62, it is assumed that the required data is present in the cells immediately beneath the hit position; and, a process for sequentially accessing these cells is shown herein. The way of setting the key string at the uppermost layer is a mere example: the string may be set in any one of the layers involved. Also, regarding the way of accessing for readout the data within the cell block in the hit event, a variety of ones are selectable in relation to a sense amplifier configuration used. In brief, the within-the-cell-block data access method is determinable depending upon how sense amp circuitry is connected to each-cell-block-common select lines BPij, WPij connected to the word and bit lines within the cell block.

FIG. 63 shows a second data search mode. In this mode, conduct a data search by selecting one from among the bit lines BL20-BL23 of the uppermost layer of the cell block, simultaneously selecting four word lines WL10-WL13 of the uppermost layer, and then simultaneously read 4 bits of multivalue information as the key string information. While holding the four word lines WL10-WL13 in the select state, sequentially set the bit lines BL20-BL23 of the uppermost layer in the select state and then scan the key string, thus making it possible to search the content reference data. When the key coincides, then read data in accordance with the data structure within the cell block.

FIG. 63 assumes that requisite data is present in the cells immediately underlying the hit position to show a procedure for accessing these cells sequentially. Setting the key string at the uppermost layer is a mere example, and this may be set in any one of the layers. Additionally, regarding the technique for accessing for readout the data within the cell block in the hit event, a variety of ones may be selected in relation to the sense amp configuration used. This is the same as the case of FIG. 62.

FIG. 64 shows a third data search mode. In this mode, conduct a data search by simultaneously reading as the key string information that are 4 bits of multivalue information selected by three bit lines in the cell block stack direction (thickness direction) and two word lines in the same stack direction. For example, while retaining three bit lines BL00, BL10, BL20 in the select state, sequentially set pairs of multilayer-direction word lines (WL00, WL10), (WL01, WL11), (WL02, WL12), (WL03, WL13) in the select state and then scan the key string to thereby enable execution of a search for the content reference data. Whenever the key exhibits a coincidence, read data in accordance with the data structure within the cell block.

FIG. 64 assumes that requisite data is present at cells which are aligned in the word-line direction at the hit position and shows a procedure for sequentially accessing these cells. The way of setting the key string at which cross-sectional position of the cell block is mere optional matter. Also regarding how to access for readout the data within the cell block in the hit event, a variety of methods may be selected in relation to the sense amp configuration used. This is the same as the cases of FIGS. 62 and 63.

As apparent from the foregoing, in the example above, each cell block is structured from 64 cells and is capable of simultaneously scanning and reading data in units of 4 bits at a time. With the use of such cell block arrangement, it is possible to achieve the content reference memory that performs data storage in the form of 4-bit 16-value data while offering enhanced data searchability with reduced complexities. Data writing is such that free write is enabled by appropriately designing the way of giving write pulses to the select lines BPij, WPij. For example, it is possible to make up an image memory which is easy in mask write for partial modification of image data or the like.

When such the cell block is arranged in this way, sense amplifier circuits are provided between the respective select lines BLij and WLij which are provided in common for a plurality of cell blocks in FIGS. 60 and 61. Practically, the sense amplifier circuit shown in FIG. 30 or FIG. 42 is used with no specific changes added thereto. In the case of performing simultaneous 4-bit reading within the same layer, the sense amp circuit of FIG. 30 may be provided on a per-cell basis. In the case of simultaneously reading 4 cells which belong to different layers, the sense amp circuit of FIG. 42 is employable in view of the fact that the word lines and bit lines are shared among such four cells.

Figure 65:
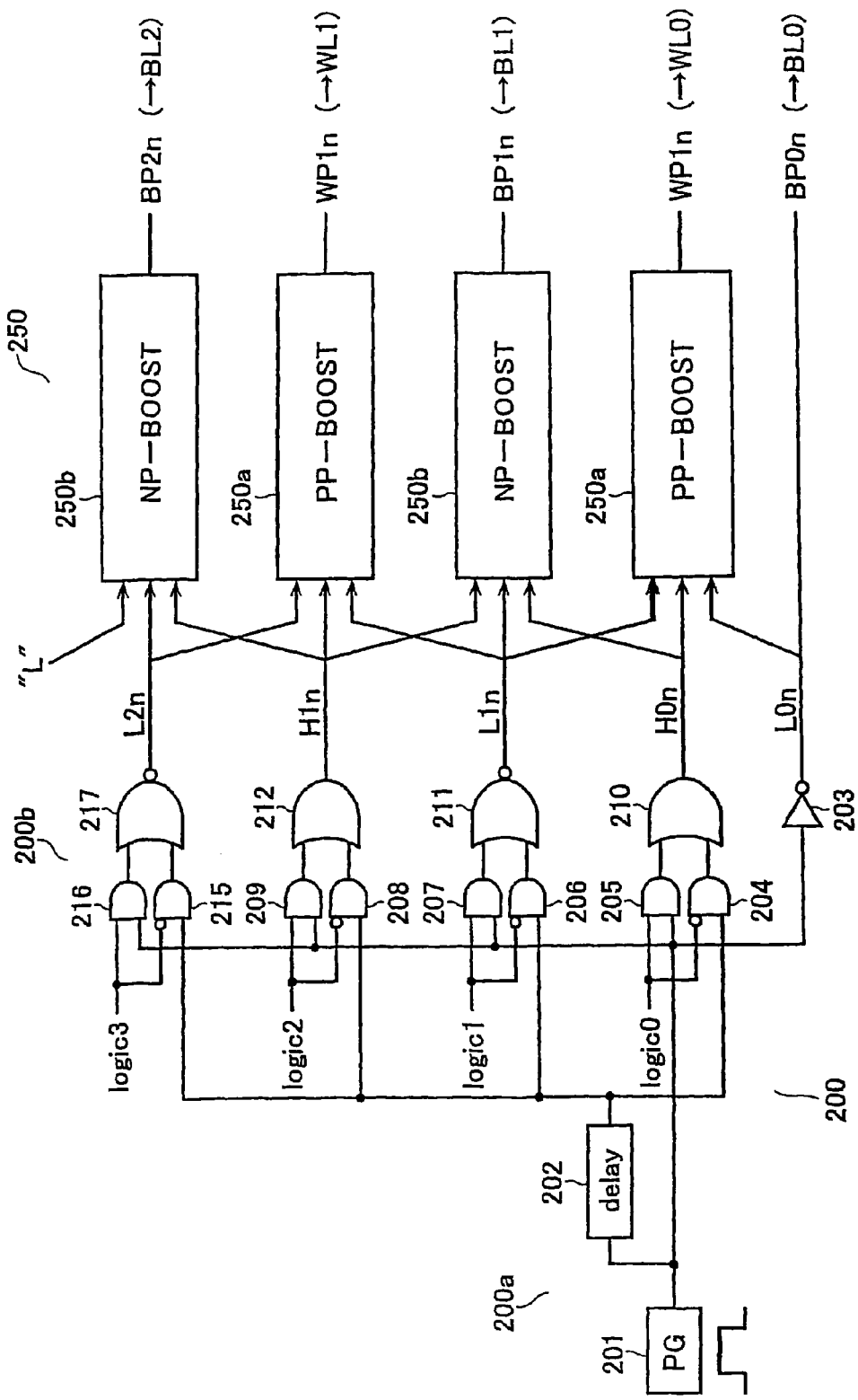
FIG. 65 is a diagram showing a configuration of a preferable write circuit of the cell block.

FIG. 65 shows a configuration of a write circuit 200 which is applied in the case of using the search mode of FIG. 64 in the above-stated cell block 501. A principal or core part of this write circuit 200 is the same as that of FIG. 55 used in the case of performing 16-value storage by means of the three-layer cell arrays stated previously. Positive logic write pulses H0$n$ and H1$n$ are the ones that are supplied to word lines through select lines WPij; Negative logic write pulses L0$n$, L1$n$ and L2$n$ are supplied to bit lines via select lines BPij. Here, suffix "n" is indicative of the position of four bit lines aligned in the wordline direction within the cell block 501 of FIG. 64, where n=0 to 3.

The positive logic write pulses H0$n$, H1$n$ and the negative logic write pulses L0$n$, L1$n$, L2$n$ correspond to the positive logic write pulses H0, H1 and the negative logic write pulses L0, L1, L2 shown in FIG. 54, respectively. All of these pulses are with a constant pulse width, and selecting an overlap state thereof results in a substantially short pulse width at the portions of "0" data, thereby enabling achievement of 16-value data writing.

And in FIG. 65, the pulse booster circuit 250 which has been explained in FIG. 57 is added in order to selectively boost each write pulse in accordance with the data state. More specifically, positive pulse booster circuits 250$a$ are added with respect to the positive logic write pulses H0$n$, H1$n$ respectively; negative pulse booster circuits 250$b$ are added relative to the negative logic write pulses L1$n$, L2$n$ respectively. The negative logic write pulse L0$n$ for use as a reference is directly transferred to a signal line BP0$n$ without via any voltage booster circuit.

Figure 66:
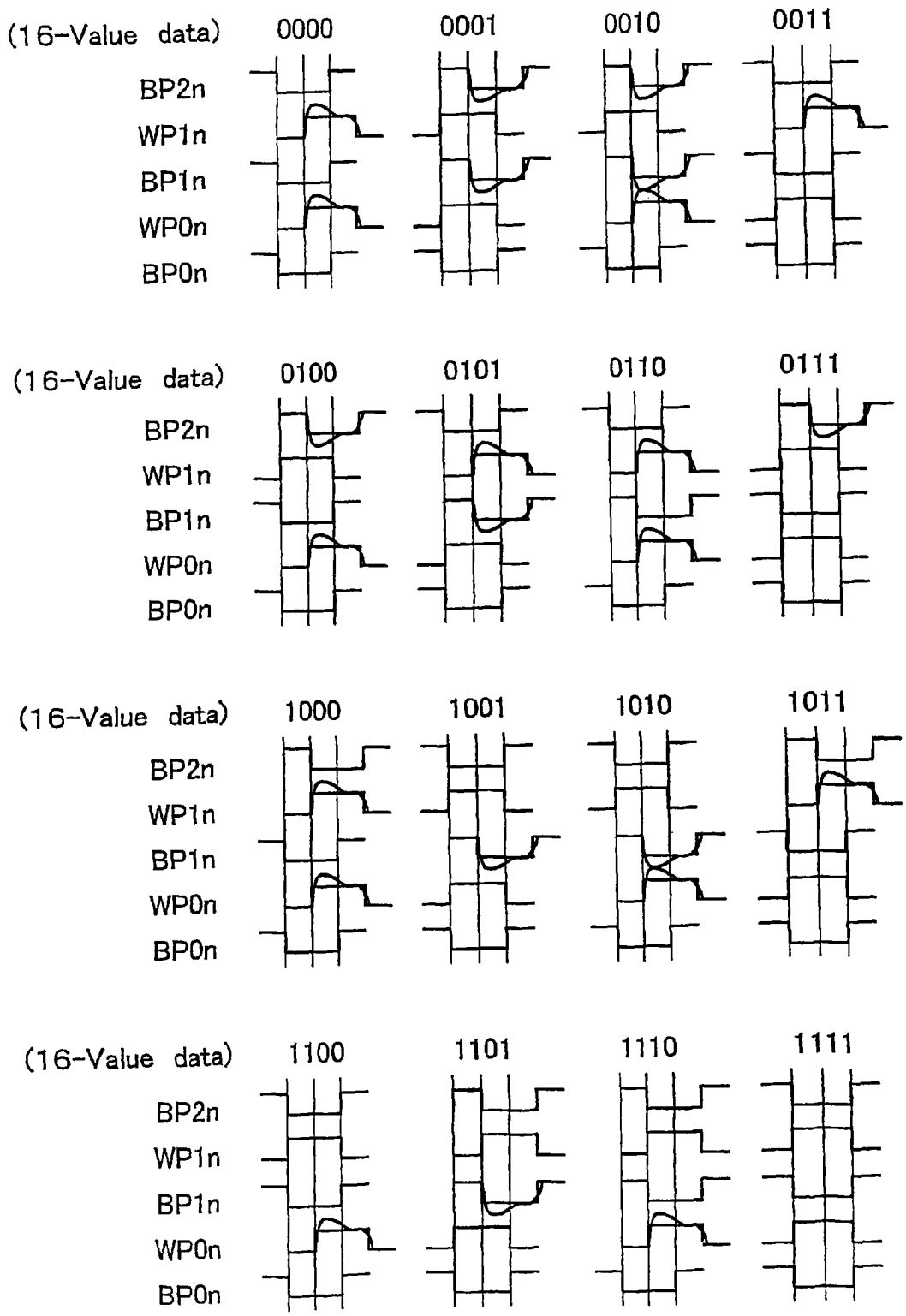
FIG. 66 is a diagram showing write pulse waveforms by means of the same write circuit.

An "L" input indicated at the negative pulse booster circuit 250$b$ with respect to the negative logic write pulse L2$n$ is for giving either one of the two negative logic write pulses L1, L2 shown in FIG. 57 as "L"-fixed data because of the absence of any further overlying layer's cell array. The result of addition of such pulse booster circuit 250 is that the pulse waveforms of the select lines WP0$n$, WP1$n$ and BP0$n$, BP1$n$, BP2$n$, to which the positive logic write pulses H0$n$, H1$n$ and negative logic write pulses L0$n$, L1$n$, L2$n$ are transferred respectively, are as shown in FIG. 66. As apparent from comparison with FIG. 54, the initial portions within the width of the positive logic write pulses and negative logic write pulses are selectively boosted in connection with the relationship relative to the widths of upper and lower pulses. More specifically, the positive logic write pulses H0$n$, H1$n$, which are given to the select lines WP0, WP1$n$ coupled to the word lines WL0, WL1, are such that when a delay of half pulse width occurs with respect to two negative logic write pulses being sent to bit lines putting these word lines therebetween, their first half rise-up portions are boosted in the positive direction. The negative logic write pulses L1$n$, L2$n$ that are given to the select lines BP1$n$, BP2$n$ coupled to the bit lines BL1, BL2 are such that when a delay of half pulse width occurs with respect to the positive logic write pulse being given to either one of these upper and lower bit lines, their first half fall-down portions are boosted in the negative direction.

With such an arrangement, significant energy is given to a "0" data-written cell in the case of multivalue storage within a short pulse application time period; thus, it is possible to perform "0" write reliably without any failures. During "1" write based on a long pulse width, at least second half part of such pulse width stays less in current amount so that the cell is no longer cooled off rapidly. Thus, annealing is done to obtain the crystalline state.

In the embodiments discussed above, there have been explained the multilayer cell array structures of phase-change memory which facilitate achievement of stacked cells and higher densities by use of diodes—in particular, Schottky diodes—as selector elements, and further the multivalue phase-change memory using stacked cell arrays. However, a multivalue memory is also useful for achievement of a substantially large capacity of memory without the use of stacked cell arrays. Exemplary configurations of such multivalue phase-change memory will be explained below.

Figure 67:
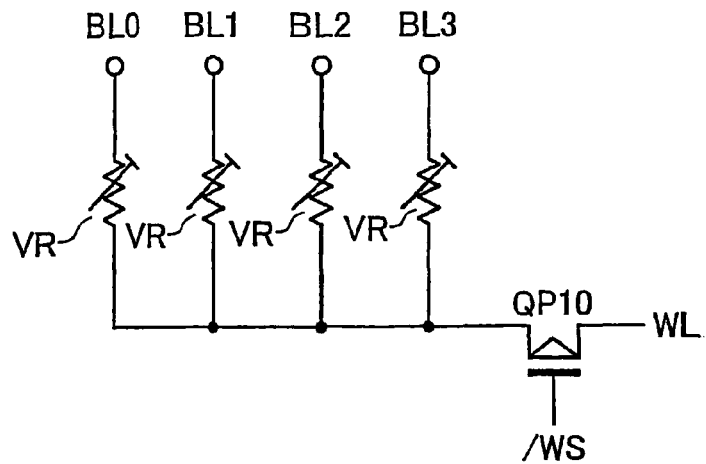
FIG. 67 is an equivalent circuit showing a memory cell arrangement of another multiple-value phase-change or "ovonic" memory.

FIG. 67 shows a configuration example of a 16-value memory with four phase-change layer-made variable resistive elements VR being commonly connected together to a word line WL through a select transistor QP10. The variable resistive elements VR are connected at one-end terminals to bit lines BL0-BL3, respectively. Here, the select transistor QP10 is a PMOS transistor as driven by a select signal /WS, which stays at "H" at the time of non-selection.

With the use of this configuration, data read is performed by turning the select transistor QP on, letting a current flow between the word line WL and each bit line BL0-BL3, and then detecting the respective currents of the bit lines. By combining the high resistance state (data "0") and low resistance state (data "1") of the variable resistive elements VR, sixteen different values are representable.

Figure 68:
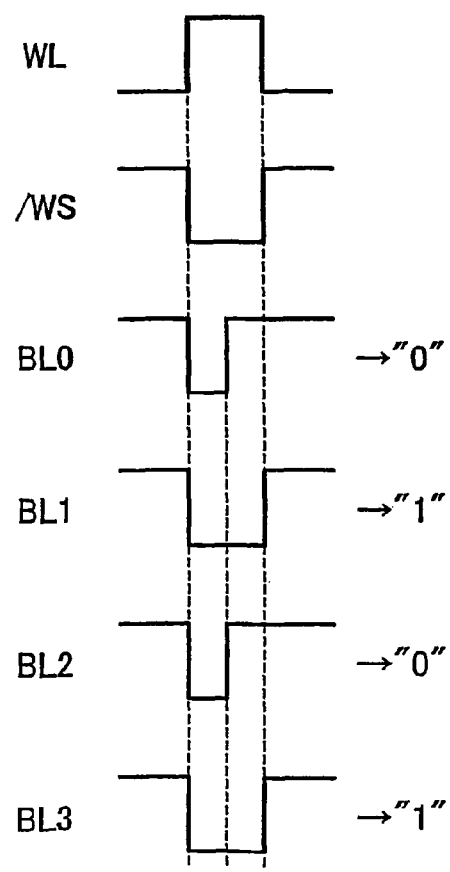
FIG. 68 is a diagram showing write pulses of the memory cell.

Data write is performed, as shown in FIG. 68, in such a manner that during on-state of the select transistor QP10, data bits "1", "0" are written depending on the overlap width of a positive logic pulse being given to the word line WL and a negative logic pulse being given to each bit line BL0-BL3. The example of FIG. 68 shows the case of writing "0", "1", "0", "1" into the cells of bit lines BL0, BL1, BL2, BL3 respectively by giving negative logic pulses with a pulse width almost half of that of the positive logic pulse to the bit lines BL0, BL2 while giving negative logic pulses with the same pulse width as the positive logic pulse to the bit lines BL1, BL3.

Figure 69:
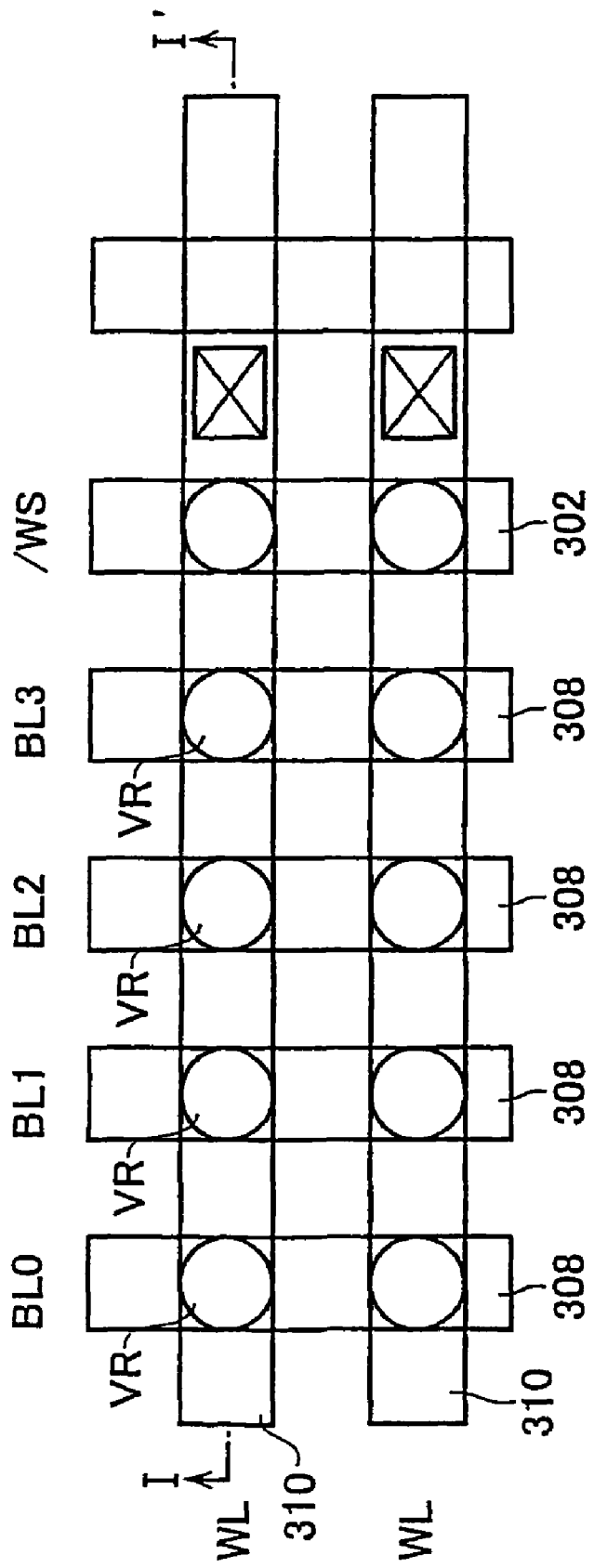
FIG. 69 is a plan view of the memory cell array.
Figure 70:
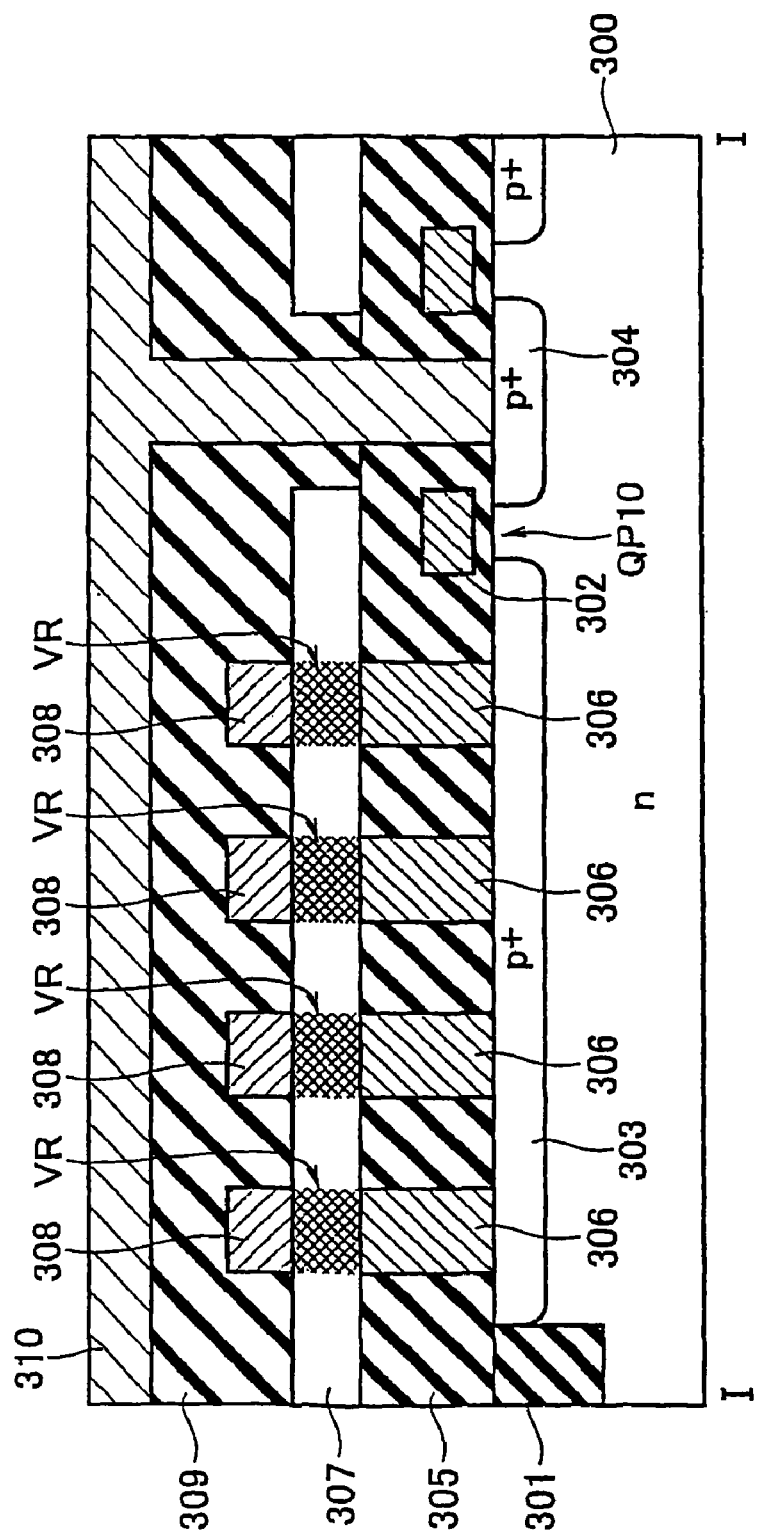
FIG. 70 is a sectional diagram along I-I' of FIG. 69.

FIG. 69 shows a layout of the multivalue cells shown in FIG. 67. FIG. 70 shows its cross-sectional view taken along line I-I'. Using an n-type silicon substrate 300, a PMOS transistor QP10 is formed which has a gate electrode 302 and source/drain diffusion layers 303, 304. The gate electrode 302 becomes a select signal line. The surface in which the transistor QP10 is formed is covered with an interlayer dielectric film 305, in which contact holes are defined for burying therein four metal plugs 306 which are connected to the source diffusion layer 303. Further, a chalcogenide layer 307 is formed on this interlayer dielectric film 305, on which layer bit lines 308 are formed. The bit lines 308 are covered with an interlayer dielectric film 309, on which word lines are formed including a word line 310 connected to the drain diffusion layer 304.

Figure 71:
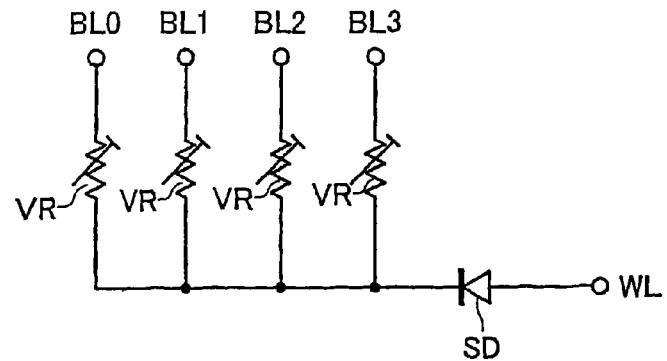
FIG. 71 is an equivalent circuit showing a memory cell configuration of another multi-value ovonic memory.

The multivalue memory of FIG. 67 may alternatively be arranged by use of a diode SD in place of the select transistor QP as shown in FIG. 71. In particular, when letting the diode SD be a Schottky diode to be formed by using a semiconductor film, it is also possible to readily form a structure with this multivalue cell array stacked over others while using an electrically insulative dielectric substrate in the way as explained previously.

Figure 72:
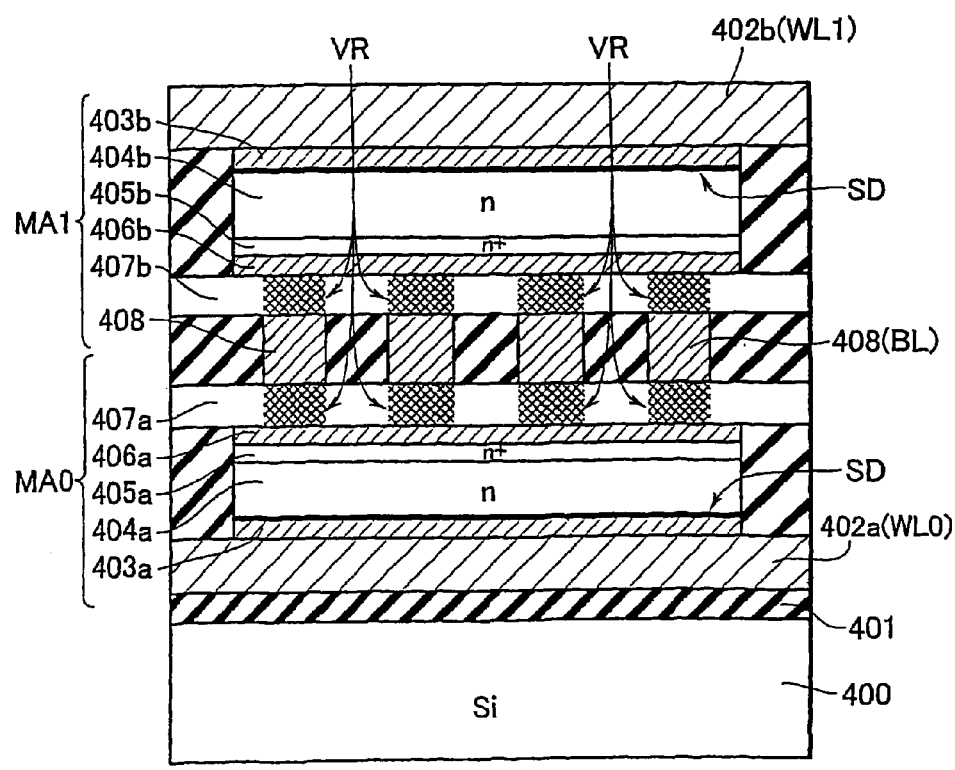
FIG. 72 is a sectional diagram showing a structure with multi-value storage cell of FIG. 71 stacked.
Figure 73:
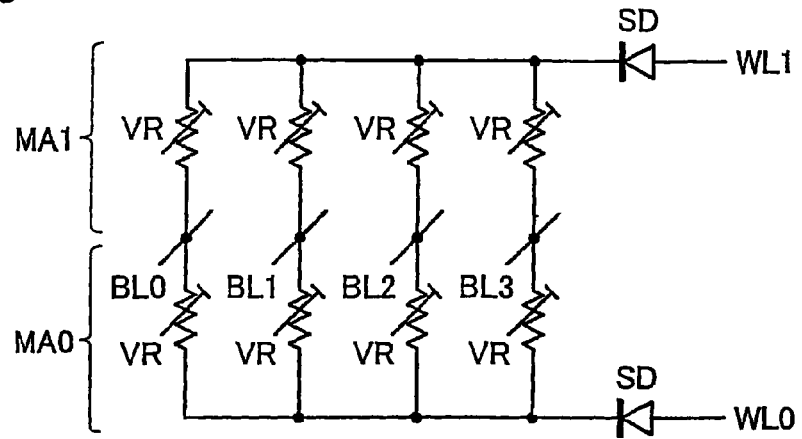
FIG. 73 is an equivalent circuit of the stacked structure.

FIG. 72 shows an exemplary structure with the multivalue cell array of FIG. 71 stacked over others, and FIG. 73 shows an equivalent circuit of such stacked structure. Cell arrays MA0, MA1 are stacked above a silicon substrate 400 covered with a dielectric film 401 while sharing bit lines (BL) 408. The lower cell array MA0 has word lines (WL0) 402a formed on the dielectric film 401, more than one diode SD formed thereabove by a semiconductor film, and bit lines 408 formed thereover. Four bit lines 408 share the diode SD.

The diode SD is formed of an n-type silicon layer 404a and a metal electrode 403a for forming a Schottky barrier. An n'-type layer 405a is formed at the surface of n-type silicon layer 404a; and further, an ohmic electrode 406a is formed. On this diode SD, a chalcogenide layer 407a is formed, and a plurality of bit lines (BL) 408 are formed on this chalcogenide layer 407a. The numerals of corresponding parts of the upper and lower cell arrays MA0, MA1 are added "a", "b" for distinguishing over each other; thus, while a detailed explanation is eliminated herein, the upper cell array MA1 is formed which is opposite in layer stacking order to the lower cell array MA0 and which shares the bit lines.

With the employment of the stacked structure above, it is possible to achieve an extra-large capacity of memory. It is also possible by developing the stacked structure of FIG. 72 to stack or multilayer a third cell array which shares the word lines 402b; furthermore, it is possible by repeated use of similar stacked layers to obtain multilayer cell array stacked structures.

Figure 74:
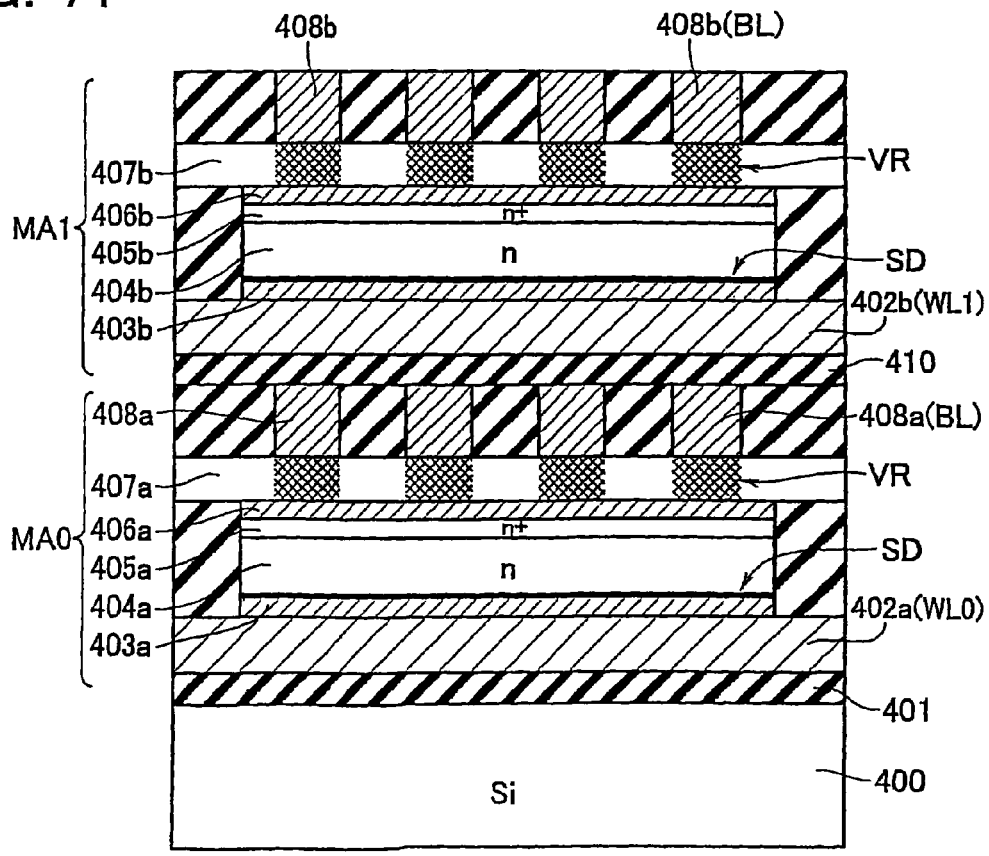
FIG. 74 is a sectional diagram showing another structure with the multi-value storage cell of FIG. 71 stacked.

FIG. 74 is an example which simply further stacks the multivalue cell array of FIG. 71 without causing the bit lines or word lines to be shared between layers. Although the numerals at corresponding portions of the upper and lower cell arrays MA0, MA1 are added "a", "b" for distinguishing from each other, the both are isolated from each other by an interlayer dielectric film 410 and stacked in the same film stack order. With this multilayer structure also, it is possible to realize a large capacity of memory.

INDUSTRIAL APPLICABILITY

It has been stated that according to this invention, the phase-change memory capable of achieving high performances and high densities is obtained.

The invention claimed is:

1. A memory device comprising:
   a substrate;
   a memory cell array formed above the substrate to include first wiring lines and second wiring lines crossing each other, and memory cells disposed between the first wiring lines and the second wiring lines at crossing points thereof, each said memory cell having a stacked structure of a variable resistance element and a diode; and
   a sense amplifier formed on the substrate, wherein
   the sense amplifier comprises:
   a first current detecting circuit for comparing a current flowing in a selected first wiring line with a reference current when a positive logic pulse and a negative logic pulse are applied to the selected first wiring line and a selected second wiring line, respectively, to forward-bias the diode in a selected memory cell; and
   a second current detecting circuit for comparing a current flowing in a selected second wiring line with a reference current when a positive logic pulse and a negative logic pulse are applied to a selected first wiring line and the selected second wiring line, respectively, to forward-bias the diode in a selected memory cell.

2. The memory device according to claim 1, wherein
   the sense amplifier comprises:
   a dummy cell having a resistance value set midway between a high resistance state and a low resistance state of the memory cell;
   a first resistor interposed between a first wiring line and a first power supply line, to which the positive logic pulse is given;

a second resistor interposed between a second wiring line and a second power supply line, to which the negative logic pulse is given;

a third resistor interposed between one end of the dummy cell and the first power supply line;

a fourth resistor interposed between the other end of the dummy cell and the second power supply line;

a first operational amplifier for comparing an output voltage at an intermediate tap of the first resistor with a voltage at a connection node of the third resistor and the dummy cell; and a second operational amplifier for comparing an output voltage at an intermediate tap of the second resistor with a voltage at a connection node of the fourth resistor and the dummy cell.

3. A memory device comprising:

a substrate;

a plurality of memory cell arrays stacked above the substrate, each said memory cell array including first wiring lines and second wiring lines crossing each other, and memory cells disposed between the first wiring lines and the second wiring lines at crossing points thereof, the memory cells having a stacked structure of a variable resistance element and a diode; and a sense amplifier configured to sense memory cell data, wherein multi-value data is storable in the memory cells selected one by one from the respective memory cell arrays, the multi-value data being defined by a combination of resistance states in the respective memory cells, and wherein the sense amplifier comprises:

a plurality of current detecting circuits for comparing a current flowing in a selected first wiring line and a selected second wiring line with a reference current when a positive logic pulse and a negative logic pulse are applied to the selected first wiring line and the selected second wiring line, respectively, to forward-bias the diode in a selected memory cell.

4. The memory device according to claim 3, wherein the multi-value data is a four-value data defined by two bits storable in first and second memory cell arrays stacked.

5. The memory device according to claim 4, wherein each of the first and second memory cell arrays includes first wiring lines and second wiring lines crossing each other, and the memory cells disposed between the first and second wiring lines at the crossing points thereof, the first and second memory cell arrays having stack orders reverse to each other and sharing the first wiring lines, and wherein the sense amplifier comprises:

a first current detection circuit for comparing a current flowing in a second wiring line selected in the first memory cell array with a reference current;

a second current detection circuit for comparing a current flowing in a selected first wiring line shared by the first and second memory cell arrays with a reference current; and a third current detection circuit for comparing a current flowing in a second wiring line selected in the second memory cell array with a reference current.

6. The memory device according to claim 3, wherein the multi-value data is an eight-value data defined by three bits storable in first, second, and third memory cell arrays stacked.

7. The memory device according to claim 6, wherein each of the first, second, and third memory cell arrays includes first wiring lines and second wiring lines crossing each other and the memory cells buried between the first and second wiring lines at the crossing points thereof, the first and second memory cell arrays having stack orders reverse to each other and sharing the first wiring lines, the second and third memory cell arrays having stack orders reverse to each other and sharing the second wiring lines, and wherein the sense amplifier comprises:

a first current detection circuit for comparing a current flowing in a second wiring line selected in the first memory cell array with a reference current;

a second current detection circuit for comparing a current flowing in a selected first wiring line shared by the first and second memory cell arrays with a reference current;

a third current detection circuit for comparing a current flowing in a selected second wiring line shared by the second and third memory cell arrays with a reference current; and a fourth current detection circuit for comparing a current flowing in a first wiring line selected in the third memory cell array with a reference current.

8. The memory device according to claim 7, wherein at least one of the second and third current detection circuits includes two operational amplifier systems with different reference values set for dissolving shrunk data.

9. The memory device according to claim 3, wherein the multi-value data is a sixteen-value data defined by four bits stored in first, second, third, and fourth memory cell arrays stacked.

10. The memory device according to claim 9, wherein each of the first, second, third and fourth memory cell arrays includes first wiring lines and second wiring lines crossing each other, and the memory cells buried between the first and second wiring lines at the crossing points thereof, the first and second memory cell arrays having stack orders reverse to each other and sharing the first wiring lines, the second and third memory cell arrays having stack orders reverse to each other and sharing the second wiring lines, the third and fourth memory cell arrays having stack orders reverse to each other and sharing the first wiring lines, and wherein the sense amplifier comprises:

a first current detection circuit for comparing a current flowing in a second wiring line selected in the first memory cell array with a reference current;

a second current detection circuit for comparing a current flowing in a selected first wiring line shared by the first and second memory cell arrays with a reference current, the second current detection circuit includes two operational amplifier systems with different reference values set for dissolving shrunk data;

a third current detection circuit for comparing a current flowing in a selected second wiring line shared by the second and third memory cell arrays with a reference current; and a fourth current detection circuit for comparing a current flowing in a selected first wiring line shared by the third and fourth memory cell arrays with a reference current, the fourth current detection circuit including two operational amplifier systems with different reference values set for dissolving shrunk data; and a fifth current detection circuit for comparing a current flowing in a second wiring line selected in the fourth memory cell arrays with a reference current.

11. A memory device comprising:
a substrate;
a plurality of memory cells stacked above the substrate, each said memory cell including a stacked structure of a variable resistance element and a diode; and
a sense amplifier configured to sense memory cell data, wherein
multi-value data is storable in the memory cells, the multi-value data being defined by a combination of resistance states in the respective memory cells, and wherein
the sense amplifier comprises:
a plurality of current detecting circuits for comparing a current flowing in both ends of a selected memory cell with a reference current when a positive logic pulse and a negative logic pulse are applied to both ends of the selected memory cell, respectively, to forward-bias the diode in the selected memory cell.

12. The memory device according to claim 11, wherein the multi-value data is a four-value data defined by two bits storable in first and second memory cells stacked.

13. The memory device according to claim 12, further comprising:
first wiring lines connecting to one end of the first and second memory cells respectively; and
second wiring lines crossing the first wiring lines and connecting to other end of the first and second memory cells respectively, wherein
the first and second memory cells having stack orders reverse to each other and sharing the first wiring lines, and wherein
the sense amplifier comprises:
a first current detection circuit for comparing a current flowing in a selected second wiring line connected to the first memory cell with a reference current;
a second current detection circuit for comparing a current flowing in a selected first wiring line shared by the first and second memory cells with a reference current; and
a third current detection circuit for comparing a current flowing in a selected second wiring line connected to the second memory cell with a reference current.

14. The memory device according to claim 11, wherein the multi-value data is an eight-value data defined by three bits storable in first, second and third memory cells stacked.

15. The memory device according to claim 14, further comprising:
first wiring lines connecting to one end of the first, second and third memory cells respectively; and
second wiring lines crossing the first wiring lines and connecting to other end of the first, second, and third memory cells respectively, wherein
the first and second memory cells having stack orders reverse to each other and sharing the first wiring lines, the second and third memory cells having stack orders reverse to each other and sharing the second wiring lines, and wherein the sense amplifier comprises:
a first current detection circuit for comparing a current flowing in a selected second wiring line connected to the first memory cell with a reference current;
a second current detection circuit for comparing a current flowing in a selected first wiring line shared by the first and second memory cells with a reference current;
a third current detection circuit for comparing a current flowing in a selected second wiring line shared by the second and third memory cell arrays with a reference current; and,
a fourth current detection circuit for comparing a current flowing in a selected first wiring line connected to the third memory cell array with a reference current.

16. The memory device according to claim 15, wherein at least one of the second and third current detection circuits includes two operational amplifier systems with different reference values set for dissolving shrunk data.

17. The memory device according to claim 11, wherein the multi-value data is a sixteen-value data defined by four bits stored in first, second, third, and fourth memory cells stacked.

18. The memory device according to claim 17, further comprising:
first wiring lines connecting to one end of the first, second, third, and fourth memory cells respectively; and
second wiring lines crossing the first wiring lines and connecting to other end of the first, second, third, and fourth memory cells respectively, wherein
the first and second memory cells having stack orders reverse to each other and sharing the first wiring lines, the second and third memory cells having stack orders reverse to each other and sharing the second wiring lines, the third and fourth memory cells having stack orders reverse to each other and sharing the first wiring lines, and wherein
the sense amplifier comprises:
a first current detection circuit for comparing a current flowing in a selected second wiring line connected to the first memory cell with a reference current;
a second current detection circuit for comparing a current flowing in a selected first wiring line shared by the first and second memory cells with a reference current;
a third current detection circuit fox comparing a current flowing in a selected second wiring line shared by the second and third memory cells with a reference current;
a fourth current detection circuit for comparing a current flowing in a selected first wiring line shared by the third and fourth memory cells with a reference current; and
a fifth current detection circuit for comparing a current flowing in a selected second wiring line connected to the fourth memory cells with a reference current.

19. The memory device according to claim 18, wherein the second current detection circuit has two operational amplifier systems with different reference values set for dissolving shrunk data.

20. The memory device according to claim 18, wherein the fourth current detection circuit has two operational amplifier systems with different reference values set for dissolving shrunk data.

* * * * *